(12) United States Patent
Youk et al.

(10) Patent No.: US 11,917,875 B2
(45) Date of Patent: Feb. 27, 2024

(54) DISPLAY DEVICE

(71) Applicant: SAMSUNG DISPLAY CO., LTD., Yongin-si (KR)

(72) Inventors: Ki Kyung Youk, Bucheon-si (KR); Chan Jae Park, Suwon-si (KR); Min Soo Kim, Seoul (KR); Yoon A Kim, Hwaseong-si (KR); Sang Duk Lee, Yongin-si (KR); Chel Gou Lim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 104 days.

(21) Appl. No.: 17/564,355

(22) Filed: Dec. 29, 2021

(65) Prior Publication Data

US 2022/0208940 A1 Jun. 30, 2022

(30) Foreign Application Priority Data

Dec. 30, 2020 (KR) .................. 10-2020-0188552

(51) Int. Cl.
*H10K 59/131* (2023.01)
*H01L 23/00* (2006.01)
(Continued)

(52) U.S. Cl.
CPC ......... *H10K 59/131* (2023.02); *G06F 3/0412* (2013.01); *H01L 24/05* (2013.01); (Continued)

(58) Field of Classification Search
CPC .... H10K 59/131; H10K 59/40; G06F 3/0412; G06F 3/0443; G06F 3/0446; G06F 2203/04111; G06F 2203/04112; G06F 3/0445; G06F 2203/04103; H01L 24/05; H01L 24/16; H01L 24/81; H01L 25/18; H01L 2224/05013; H01L 2224/05018;
(Continued)

(56) References Cited

U.S. PATENT DOCUMENTS

2019/0348485 A1* 11/2019 Jo .................. H10K 77/111

FOREIGN PATENT DOCUMENTS

| KR | 10-2019-0098878 | 8/2019 |
| KR | 10-2019-0130091 | 11/2019 |
| KR | 10-2020-0091060 | 7/2020 |

* cited by examiner

*Primary Examiner* — Douglas W Owens
(74) *Attorney, Agent, or Firm* — F. Chau & Associates, LLC

(57) ABSTRACT

A display device includes a substrate including an active area having pixels and a non-active area including a pad region. A pad electrode is disposed in the pad region and includes a first pad electrode and a second pad electrode disposed on the first pad electrode. A first insulating pattern is interposed between the first and second pad electrodes. In a plan view, the first insulating pattern is positioned inside the first pad electrode, and a portion of the second pad electrode overlapping the first insulating pattern protrudes further from the substrate in a thickness direction than a portion of the second pad electrode not overlapping the first insulating pattern. The second pad electrode directly contacts a portion of the upper surface of the first pad electrode. In a plan view, an area of the second pad electrode is greater than an area of the first pad electrode.

27 Claims, 43 Drawing Sheets

(51) Int. Cl.
*G06F 3/041* (2006.01)
*H10K 59/40* (2023.01)
*G06F 3/044* (2006.01)
*H01L 25/18* (2023.01)

(52) U.S. Cl.
CPC .......... *H10K 59/40* (2023.02); *G06F 3/0443* (2019.05); *G06F 3/0446* (2019.05); *G06F 2203/04111* (2013.01); *G06F 2203/04112* (2013.01); *H01L 24/16* (2013.01); *H01L 24/81* (2013.01); *H01L 25/18* (2013.01); *H01L 2224/05013* (2013.01); *H01L 2224/05018* (2013.01); *H01L 2224/0518* (2013.01); *H01L 2224/05082* (2013.01); *H01L 2224/05086* (2013.01); *H01L 2224/05088* (2013.01); *H01L 2224/05124* (2013.01); *H01L 2224/05147* (2013.01); *H01L 2224/05166* (2013.01); *H01L 2224/05553* (2013.01); *H01L 2224/05564* (2013.01); *H01L 2224/05573* (2013.01); *H01L 2224/05624* (2013.01); *H01L 2224/05639* (2013.01); *H01L 2224/05655* (2013.01); *H01L 2224/05671* (2013.01); *H01L 2224/05693* (2013.01); *H01L 2224/16145* (2013.01); *H01L 2224/16501* (2013.01); *H01L 2224/81205* (2013.01); *H01L 2224/81365* (2013.01); *H01L 2924/01006* (2013.01)

(58) Field of Classification Search
CPC . H01L 2224/05082; H01L 2224/05086; H01L 2224/05088; H01L 2224/05553; H01L 2224/16145; H01L 2224/16501; H01L 2224/81365

See application file for complete search history.

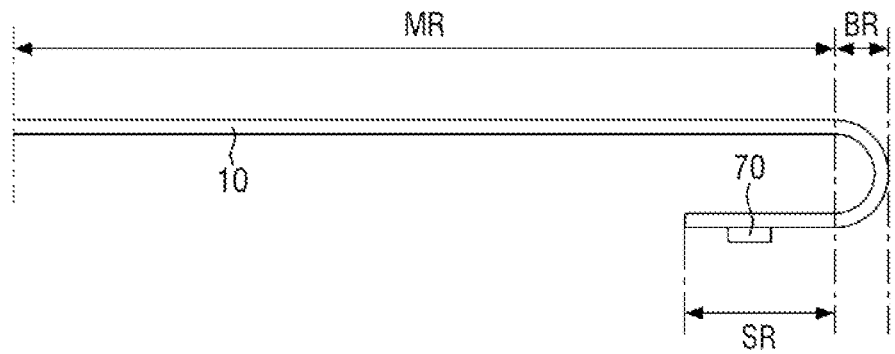
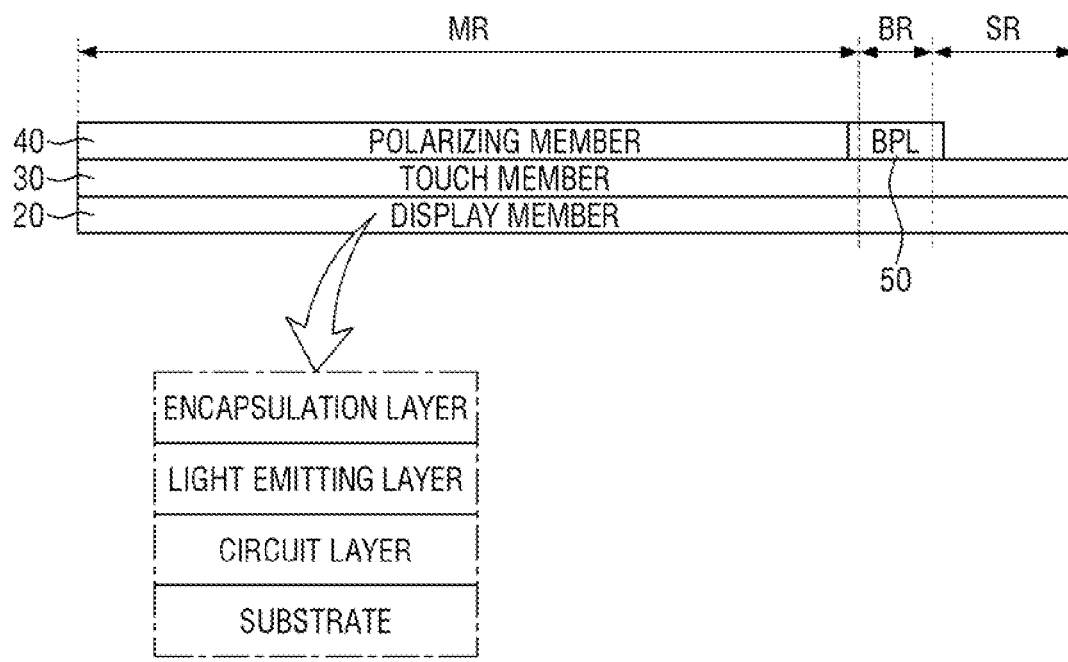

FIG. 10
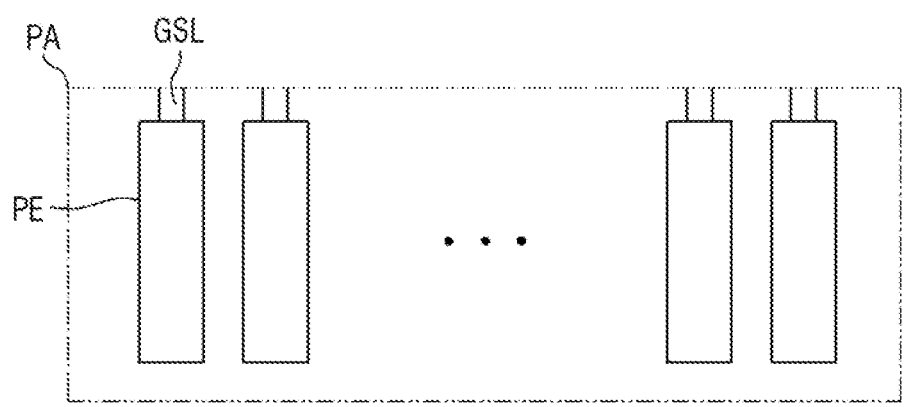
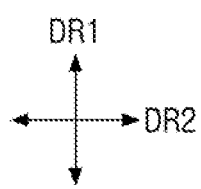

PE_8: PE1, PE2, PE4_4

DISPLAY DEVICE

This application claims priority under 35 U.S.C. § 119 to Korean Patent Application No. 10-2020-0188552, filed on Dec. 30, 2020 in the Korean Intellectual Property Office, the disclosure of which is incorporated by reference in its entirety herein.

TECHNICAL FIELD

The present inventive concepts relate to a display device.

DISCUSSION OF RELATED ART

Various types of electronic devices include display devices for displaying images to the user, such as smart phones, tablet personal computers (PCs), digital cameras, notebook computers, navigation systems, and smart televisions. The display device includes a display panel for generating and displaying an image and various input devices.

An external device which applies a data voltage and/or a scan signal is mounted on the display panel. The external device may be mounted on the display panel by various methods, such as a chip on film (COF) method, a chip on plastic (COP) method or a chip on glass (COG) method. The external device may be electrically connected to a pad electrode of the display panel. Conventionally, the pad electrode and the external device are coupled through an anisotropic conductive film including an adhesive resin and conductive balls dispersed in the adhesive resin. However, the electrical resistance may be significantly increased.

SUMMARY

Aspects of the present inventive concepts provide a display device in which a pad electrode is directly bonded to a bump of an external device through an ultrasonic bonding method and, simultaneously, an area of a protruding portion of the pad electrode is reduced so that required ultrasonic bonding energy is reduced to minimize physical damage which may occur during ultrasonic bonding between an external device and a display panel.

It should be noted that objects of the present inventive concepts are not limited to the above-described objects, and other objects of the present inventive concepts will be apparent to those skilled in the art from the following descriptions.

According to an embodiment of the present inventive concepts, a display device includes a substrate including an active area having a plurality of pixels and a non-active area disposed on a periphery of the active area and including a pad region. A pad electrode is disposed in the pad region and includes a first pad electrode and a second pad electrode disposed on the first pad electrode. A first insulating pattern is interposed between an upper surface of the first pad electrode and the second pad electrode. When viewed in a plan view, the first insulating pattern is positioned inside the first pad electrode, and a portion of the second pad electrode overlapping the first insulating pattern protrudes further from the substrate in a thickness direction than a portion of the second pad electrode not overlapping the first insulating pattern protrudes from the substrate in the thickness direction. The second pad electrode directly contacts a portion of the upper surface of the first pad electrode that the first insulating pattern is not disposed on. When viewed in a plan view, an area of the second pad electrode is greater than an area of the first pad electrode.

According to an embodiment of the present inventive concepts, a display device includes a substrate including an active area having a plurality of pixels and a non-active area disposed on a periphery of the active area and including a pad region. A pad electrode is disposed in the pad region and includes a first pad electrode, a second pad electrode disposed on the first pad electrode, and a third pad electrode disposed on the second pad electrode. A first insulating pattern is interposed between an upper surface of the first pad electrode and the second pad electrode. The first insulating pattern includes a contact hole passing through the first insulating pattern in a thickness direction. When viewed in a plan view, the third pad electrode does not overlap the contact hole and is positioned on one side of the contact hole in a first direction. The second pad electrode is electrically connected to the first pad electrode through the contact hole.

According to an embodiment of the present inventive concepts, a display device includes a substrate including an active area having a plurality of pixels and a non-active area disposed on a periphery of the active area and including a pad region. A pad electrode is disposed in the pad region and includes a first pad electrode and a second pad electrode disposed on the first pad electrode. A first insulating pattern is interposed between an upper surface of the first pad electrode and the second pad electrode. The first insulating pattern includes a contact hole passing through the first insulating pattern in a thickness direction. The second pad electrode is electrically connected to the first pad electrode through the contact hole. The first pad electrode includes a first sub-pad electrode overlapping the contact hole and a second sub-pad electrode positioned on one side of the first sub-pad electrode in a first direction. A width of the first sub-pad electrode in a second direction intersecting the first direction is greater than a width of the second sub-pad electrode in the second direction.

According to an embodiment of the present inventive concepts, a display device includes a substrate including an active area having a plurality of pixels and a non-active area disposed on a periphery of the active area and including a pad region. A pad electrode includes a first pad electrode having a plurality of first sub-pad electrodes disposed on the substrate and spaced apart from each other in the pad region, a connection pad electrode connecting adjacent first sub-pad electrodes of the plurality of first sub-pad electrodes, and a second pad electrode having second sub-pad electrodes disposed to overlap the first sub-pad electrodes and spaced apart from each other. A first insulating pattern includes sub-insulating patterns which are disposed between and overlap the first sub-pad electrodes and the second sub-pad electrodes and are spaced apart from each other. Each of the sub-insulating patterns includes a contact hole passing through the first insulating pattern in a thickness direction. The second sub-pad electrode is electrically connected to the first sub-pad electrode through the contact hole. A thickness of the first sub-pad electrode is greater than a thickness of the connection pad electrode.

The details of other embodiments are included in the detailed description and the accompanying drawings.

BRIEF DESCRIPTION OF THE DRAWINGS

The above and other aspects and features of the present disclosure will become more apparent by describing exemplary embodiments thereof in detail with reference to the attached drawings, in which:

FIG. 2 is a cross-sectional view illustrating the display device which is bent according to an embodiment of the present inventive concepts;

FIG. 3 is a schematic cross-sectional view illustrating the display device according to an embodiment of the present inventive concepts;

FIG. 10 is an enlarged plan view illustrating the pad region of FIG. 1 according to an embodiment of the present inventive concepts;

DETAILED DESCRIPTION OF EMBODIMENTS

Figure 1:
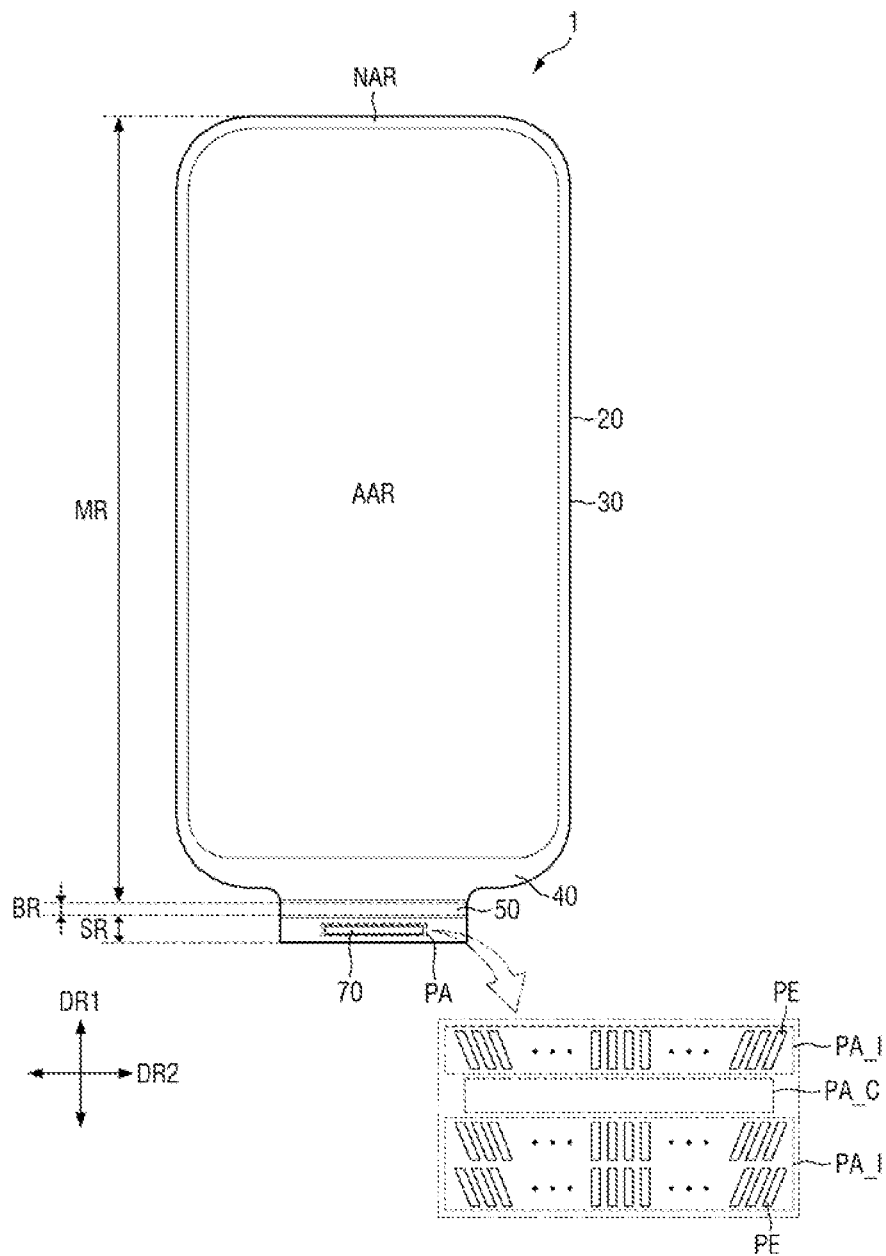
FIG. 1 is a plan layout diagram and a partial enlarged view illustrating a display device according to an embodiment of the present inventive concepts.

Specific structural and functional descriptions of embodiments of the present inventive concepts disclosed herein are only for illustrative purposes of embodiments of the present inventive concepts. The invention may be embodied in many different forms without departing from the spirit and significant characteristics of the present inventive concepts. Therefore, embodiments of the present inventive concepts described herein are only for illustrative purposes and should not be construed as limiting the present inventive concepts.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the present inventive concepts.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe the relationship of one element to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. For example, the term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. For example, the terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and the present inventive concepts, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present inventive concepts.

Hereinafter, embodiments of the present inventive concepts will be described with reference to the attached drawings.

FIG. 1 is a plan layout diagram illustrating a display device according to an embodiment. FIG. 2 is a schematic partial cross-sectional view illustrating the display device according to an embodiment, and FIG. 3 is a schematic cross-sectional view illustrating the display device according to an embodiment.

In an embodiment, a first direction DR1 and a second direction DR2 are different directions that intersect each other. In the plan view of FIG. 1, for convenience of description, the first direction DR1 is defined as a vertical direction and the second direction DR2 is defined as a horizontal direction. However, embodiments of the present inventive concepts are not limited thereto. Furthermore, while the first direction DR1 and the second direction DR2 are perpendicular to each other in the embodiment of FIG. 1, the first direction DR1 and the second direction DR2 may cross each other at various different angles. In the following embodiments, it is noted that one side of the first direction DR1 refers to an upward direction in the plan view, the other side thereof refers to a downward direction in the plan view, one side of the second direction DR2 refers to a right direction in the plan view, and the other side thereof refers to a left direction in the plan view. However, it should be understood that the directions mentioned in the embodiments refer to relative directions and the embodiments are not limited to the mentioned directions.

Referring to the embodiments of FIGS. 1 to 3, a display device 1 may refer to various different electronic devices which provide display screens. For example, the display device 1 may include portable electronic devices providing display screens, such as mobile phones, smart phones, tablet personal computers (PCs), electronic watches, smart watches, watch phones, mobile communication terminals, electronic notebooks, e-book readers, portable multimedia players (PMPs), navigation systems, game machines, and digital cameras, as well as televisions, laptops, monitors, advertising boards, and Internet of Things. However, embodiments of the present inventive concepts are not limited thereto.

The display device 1 includes an active area AAR and a non-active area NAR. In the display device 1, when a portion displaying a screen is defined as a display area, a portion not displaying the screen is defined as a non-display area, and an area detecting a touch input is defined as a touch area. In an embodiment, the display area and the touch area may be included in the active area AAR. The display area and the touch area may overlap. For example, the active area AAR may be an area in which a screen is displayed and a touch input is also detected. In an embodiment, a shape of the active area AAR may be a rectangular shape or a rectangular shape with round corners. As shown in the embodiment of FIG. 1, the shape of the active area AAR may be a rectangular shape which has round corners and which has relatively longer sides in the first direction DR1 and relatively shorter sides in the second direction DR2. However, embodiments of the present inventive concepts are not limited thereto, and the active area AAR may have various shapes such as a rectangular shape which has relatively longer sides in the second direction DR2 and relatively shorter sides in the first direction DR1, a square, other polygonal shapes, or a circular or elliptical shape.

The non-active area NAR is disposed in a periphery of the active area AAR. The non-active area NAR may be a bezel area. In an embodiment, the non-active area NAR may surround all sides of the active area AAR (e.g., in the first and second directions DR1, DR2), such as all four sides of the active area AAR. However, embodiments of the present inventive concepts are not limited thereto. For example, in an embodiment, the non-active area NAR may not be disposed in the vicinity of an upper side or left and right sides of the active area AAR.

Signal lines or driving circuits for applying signals to the active area AAR (e.g., a display area or a touch area) may be disposed in the non-active area NAR. The non-active area NAR may not include a display area. In addition, the non-active area NAR may not include a touch area. However, embodiments of the present inventive concepts are not limited thereto. For example, in an embodiment, the non-active area NAR may include a portion of the touch area, and a sensor member such as a pressure sensor may be disposed in the corresponding area. In an embodiment, the active area AAR may be completely the same as the display area in which a screen is displayed, and the non-active area NAR may be completely the same as the non-display area in which the screen is not displayed.

The display device 1 includes a display panel 10 which provides a display screen. Examples of the display panel 10 may include organic light emitting display panels, micro light emitting diode (LED) display panels, nano LED display panels, quantum dot light emitting display panels, liquid crystal display panels, plasma display panels, field emission display panels, electrophoretic display panels, electrowetting display panels, and the like. Hereinafter, an embodiment in which the organic light emitting display panel is applied as an example of the display panel 10 is illustrated for convenience of explanation. However, embodiments of the present inventive concepts are not limited thereto and other display panels may be applied.

The display device 1 may further include a touch member sensing a touch input. The touch member may be provided as a separate panel or film from the display panel 10 and bonded on the display panel 10 or may be provided in the form of a touch layer in the display panel 10. In the following embodiments, a case in which the touch member is provided and included in the display panel 10 will be described. However, embodiments of the present inventive concepts are not limited thereto.

The display panel 10 may include a flexible substrate including a flexible polymer material such as polyimide. Thus, the display panel 10 may be curved, bent, folded, or rolled.

The display panel 10 may include a bending region BR which is a region in which a panel is bent. The display panel 10 may be divided into a main region MR located on a first side of the bending region BR and a sub region SR located on a second side of the bending region BR that is opposite to the first side of the bending region BR. The non-active area NAR of the display device 1 may include the bending region BR. In an embodiment, the non-active area NAR may be divided into an upper region (e.g., in the first direction DR1) and a lower region (e.g., in the first direction DR1) based on the bending region BR. The upper region of the non-active area NAR may be located in the main region MR which will be described below, and the lower region of the non-active area NAR may be located in the sub region SR which will be described below.

The display area of the display panel 10 is disposed in the main region MR. The display area includes a plurality of pixels. In an embodiment, a peripheral edge portion of the display area in the main region MR, an entirety of the bending region BR, and an entirety of the sub region SR may be in the non-display area. However, embodiments of the present inventive concepts are not limited thereto. For example, the bending region BR and/or the sub region SR may include a display area in some embodiments.

The main region MR may have a shape that is substantially similar to an outer shape of the display device 1 when viewed in a plan view. The main region MR may be a flat region located in one plane. However, embodiments of the present inventive concepts are not limited thereto, and at least one among remaining edges in the main region MR except for an edge (side) connected to the bending region BR may be curved to form a curved surface or may be bent vertically.

When at least one among the remaining edges in the main region MR except for the edge (side) connected to the bending region BR forms a curved surface or is bent, a display area may be disposed on the corresponding edge. However, embodiments of the present inventive concepts are not limited thereto, and the curved or bent edge may be a non-display area which does not display a screen, or a display area and a non-display area may be mixed on the corresponding edge.

The bending region BR is connected to one side of the main region MR in the first direction DR1. For example, the bending region BR may be connected to a lower relatively shorter side of the main region MR. In an embodiment, a width of the bending region BR (e.g., length in the second direction DR2) may be smaller than a width of the main region MR (e.g., a width of a relatively shorter side in the second direction DR2). A connector between the main region MR and the bending region BR may have an L-shaped cut shape. However, embodiments of the present inventive concepts are not limited thereto.

In the bending region BR, the display panel 10 may be bent downward with a curvature in a thickness direction, that is, in a direction opposite to a display surface. In an embodiment, the bending region BR may have a constant radius curvature. However, embodiments of the present inventive concepts are not limited thereto, and the bending region BR may have a different radius curvature for each section. The display panel 10 is bent in the bending region BR, and thus a surface of the display panel 10 may be reversed. For example, one surface of the display panel 10 facing an upper side may be changed to face outward through the bending region BR and then to face a lower side again.

The sub region SR extends from the bending region BR. The sub region SR may start to extend in a direction parallel to the main region MR after the bending is completed. The sub region SR may overlap the main region MR in a thickness direction of the display panel 10. In an embodiment, a width of the sub region SR (e.g., a length in the second direction DR2) may be the same as a width of the bending region BR (e.g., a length in the second direction DR2). However, embodiments of the present inventive concepts are not limited thereto.

As shown in the embodiment of FIG. 1, the sub region SR may include a pad region PA. A driving chip 70 may be disposed in the pad region PA of the sub region SR. In an embodiment, the driving chip 70 may include an integrated circuit for driving the display panel 10. The integrated circuit may include an integrated circuit for a display and/or an integrated circuit for a touch unit. The integrated circuit for a display and the integrated circuit for a touch unit may be provided as separate chips or may be integrated into one chip.

In an embodiment, the sub region SR of the display panel 10 may further include a second pad region located between the pad region PA and one end portion of the display panel 10 in the first direction DR1, and a driving substrate made of a flexible printed circuit board or a film may be connected to the second pad region.

As shown in an enlarged view of FIG. 1, the pad region PA may include an output pad region PA_O adjacent to the bending region BR, an input pad region PA_I, and a circuit pad region PA_C located between the output pad region PA_O and the input pad region PA_I (e.g., in the first direction DR1). As shown in the enlarged view of FIG. 1, a plurality of pad electrodes PE may be disposed in each of the output pad region PA_O and the input pad region PA_I. In the enlarged view of FIG. 1, the plurality of pad electrodes PE disposed in the output pad region PA_O are illustrated as forming one row in the second direction DR2, and the plurality of pad electrodes PE disposed in the input pad region PA_I are illustrated as forming two rows extending in the second direction DR2. However, embodiments of the present inventive concepts are not limited thereto, and the plurality of pad electrodes PE disposed in the input pad region PA_I may form three or more rows or one row extending in the second direction DR2.

Referring to the embodiment of FIG. 3, the display panel 10 may include a display member 20, a touch member 30, a polarizing member 40, and a bending protection film (BPL) 50. In an embodiment, the display member 20 may be disposed over the main region MR, the bending region BR, and the sub region SR. As shown in an enlarged view of FIG. 3, the display member 20 includes a substrate 101 (see FIG. 4), a circuit layer TR (see FIG. 4) disposed on the substrate 101, a light emitting layer 122 (see FIG. 4) disposed on the circuit layer TR, and an encapsulation layer 116 (see FIG. 4) disposed on the light emitting layer 122. The display panel 10 may further include a first electrode 121 (see FIG. 4) disposed below the light emitting layer 122 and a second electrode 123 (see FIG. 4) disposed above the light emitting layer 122. The first electrode 121, the light emitting layer 122, and the second electrode 123 may constitute a light emitting element. The light emitting element may be disposed in each pixel.

A planar shape (e.g., in a plane defined in the first and second directions DR1, DR2) of the display member 20 may be substantially the same as the above-described planar shape of the display panel 10. For example, the display member 20 may have a planar shape that is substantially the same as planar shapes of the main region MR, the bending region BR, and the sub region SR.

The touch member 30 may be disposed on the display member 20. In an embodiment, the touch member 30 may be disposed over the main region MR, the bending region BR, and the sub region SR. The touch member 30 may be disposed directly above the display member 20. As described below, the touch member 30 may include a first touch insulating layer, a first touch conductive layer disposed on the first touch insulating layer, a second touch insulating layer disposed on the first touch conductive layer, and a second touch conductive layer disposed on the second touch insulating layer.

A planar shape of the touch member 30 (e.g., in a plane defined in the first and second directions DR1, DR2) may be substantially the same as the planar shape of the display member 20. For example, the touch member 30 may have a planar shape that is substantially the same as the planar shapes of the main region MR, the bending region BR, and the sub region SR.

As shown in the embodiment of FIG. 3, the polarizing member 40 may be disposed to substantially overlap the main region MR in the thickness direction and may not be disposed in the bending region BR. The BPL 50 may completely overlap the bending region BR and may extend to be disposed in portions of the main region MR and the sub region SR, which are adjacent to the bending region BR. Side surfaces of the polarizing member 40 and the BPL 50 which face each other may be in direct contact with each other. For example, a separation space may not be disposed between the side surfaces of the polarizing member 40 and the BPL 50 that face each other. A boundary between one side surface of the BPL 50 and one side surface of the polarizing member 40 may be located in the main region MR.

Referring to the embodiment of FIG. 1, a planar shape of the polarizing member 40 (e.g., in a plane defined in the first and second directions DR1, DR2) may be substantially the same as the above-described planar shape of the touch member 30 corresponding to the main region MR. However, embodiments of the present inventive concepts are not limited thereto. For example, in some embodiments, when viewed in a plan view, a size of the polarizing member 40 may be less than a size of the touch member 30, thereby exposing a portion of an edge of the touch member 30 corresponding to the main region MR.

In an embodiment, a planar shape of the BPL 50 may be substantially the same as the above-described planar shape of the touch member 30 corresponding to the bending region BR. For example, the planar shape of the BPL 50 may be substantially a rectangular shape. However, embodiments of the present inventive concepts are not limited thereto. For example, in some embodiments, when viewed in a plan view, a size of the BPL 50 may be less than the size of the touch member 30. For example, a width of the BPL 50 (e.g., length in the second direction DR2) may be smaller than a width of the touch member 30 (e.g., length in the second direction DR2).

Figure 4:
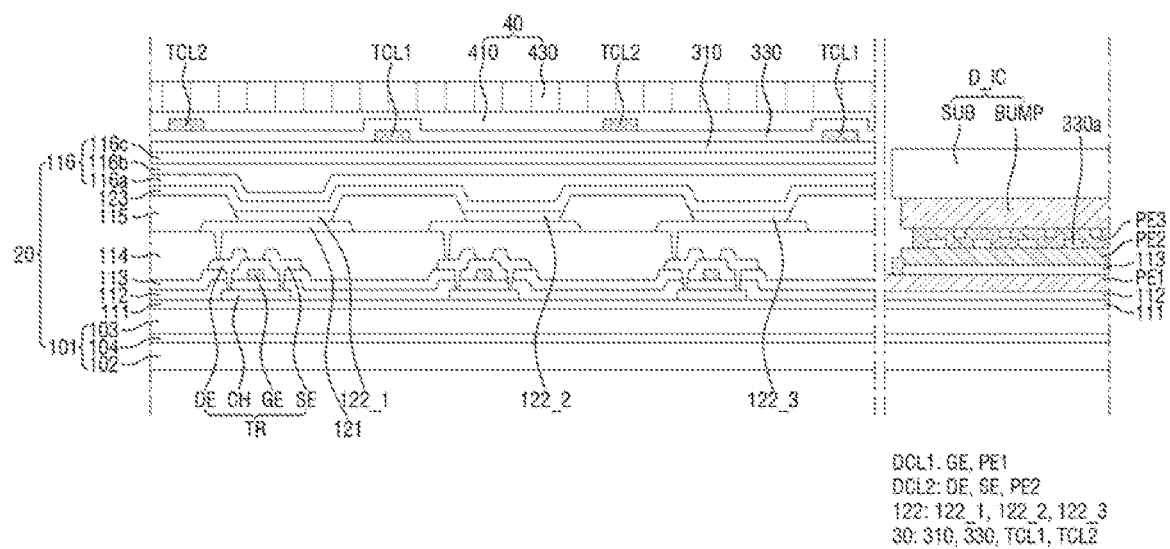
FIG. 4 is a cross-sectional view illustrating a main region and a pad region of the display device according to an embodiment of the present inventive concepts.
Figure 5:
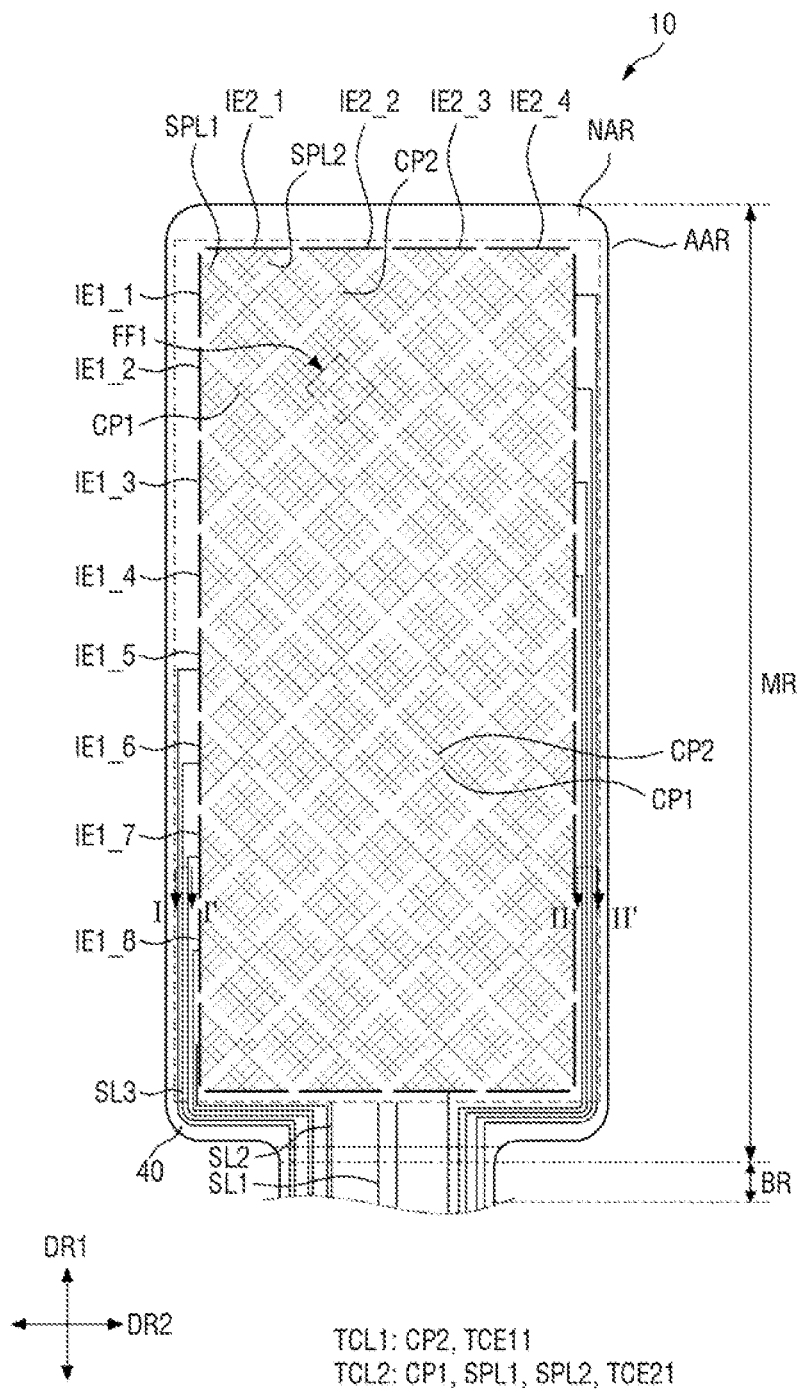
FIG. 5 is a plan layout diagram illustrating a display member and a touch member of the display device according to an embodiment of the present inventive concepts.
Figure 6:
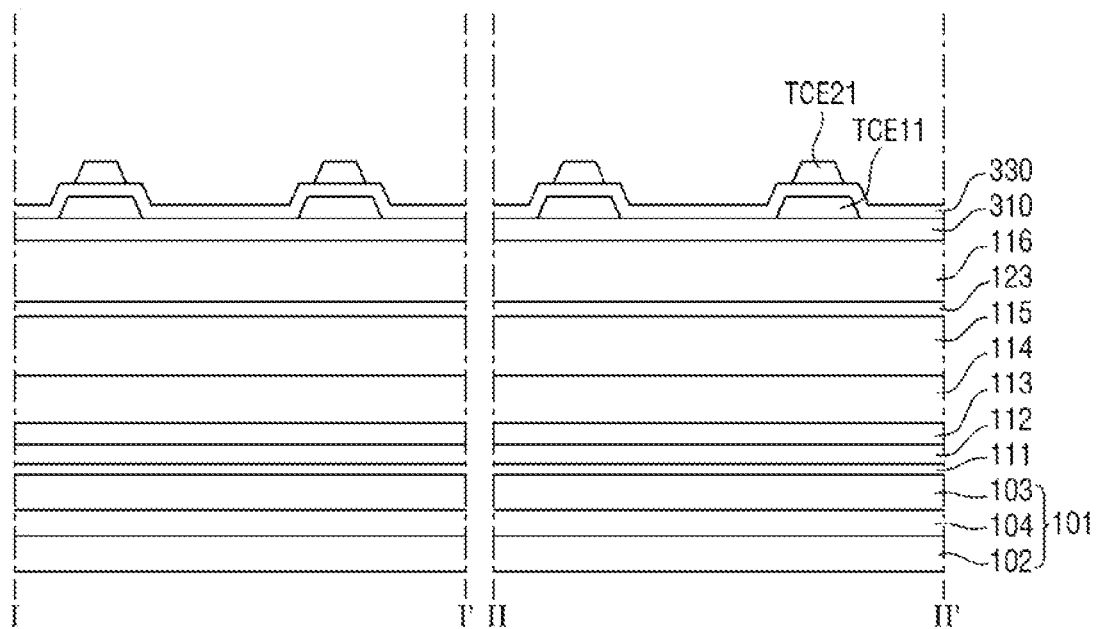
FIG. 6 shows cross-sectional views taken along lines I-I' and II-II' of FIG. 5 according to an embodiment of the present inventive concepts.
Figure 7:
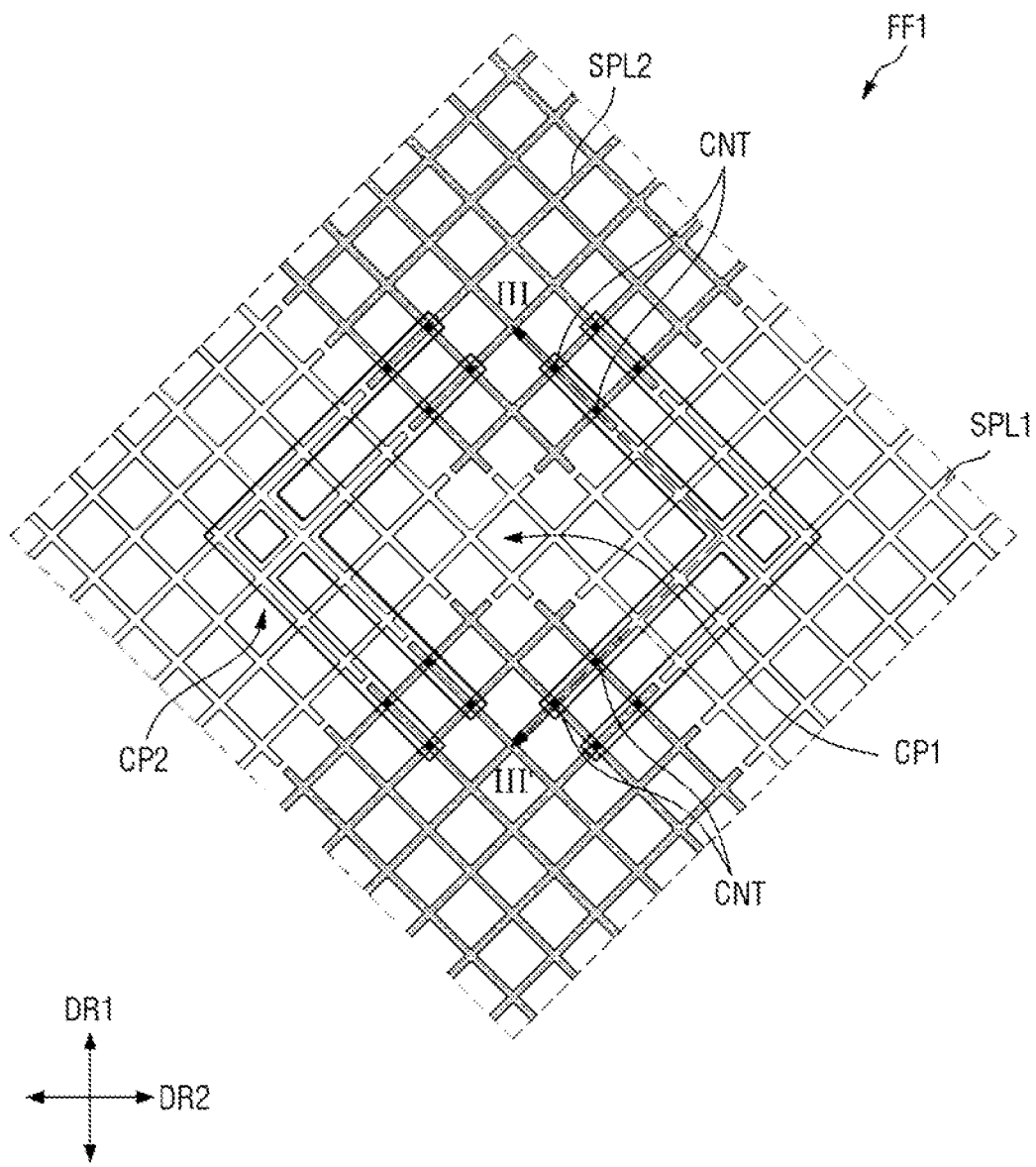
FIG. 7 is an enlarged plan view illustrating region FF1 of FIG. 6 according to an embodiment of the present inventive concepts.
Figure 8:
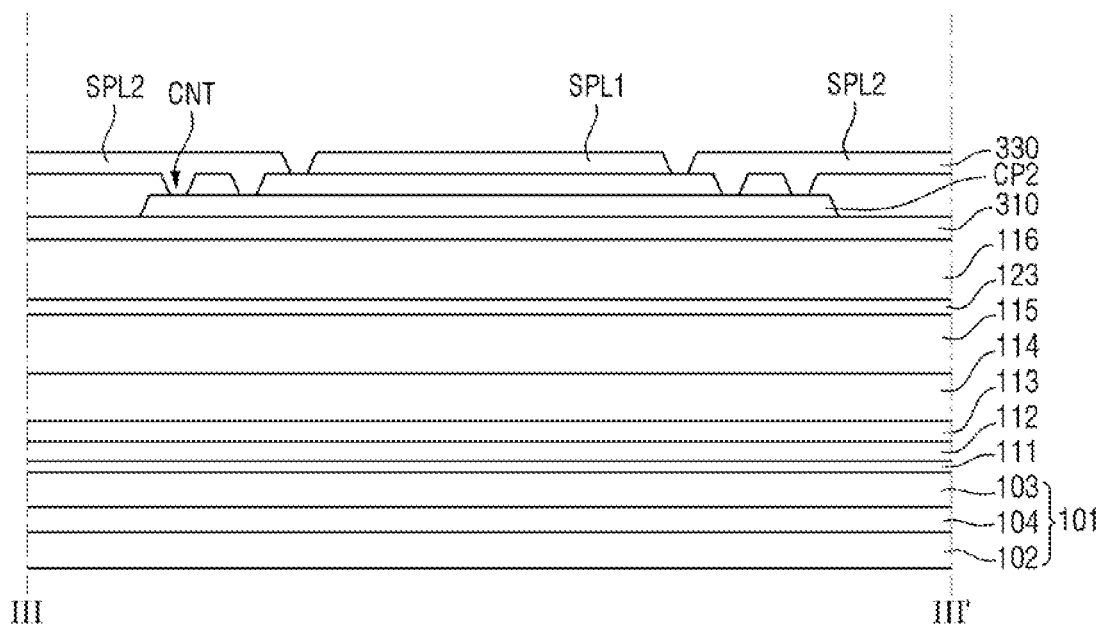
FIG. 8 is a cross-sectional view taken along line III-III' of FIG. 7 according to an embodiment of the present inventive concepts.

FIG. 4 is a cross-sectional view illustrating the main region and the pad region of the display device according to an embodiment. FIG. 5 is a plan layout diagram illustrating the display member and the touch member of the display device according to an embodiment. FIG. 6 shows cross-sectional views taken along lines I-I' and II-II' of FIG. 5. FIG. 7 is an enlarged plan view illustrating region FF1 of FIG. 6. FIG. 8 is a cross-sectional view taken along line III-III' of FIG. 7.

Referring to FIGS. 4 to 7, the substrate 101 may include a first support substrate 102, a second support substrate 103 disposed on the first support substrate 102, and a barrier layer 104 disposed between the first support substrate 102 and the second support substrate 103. As described above, each of the first support substrate 102 and the second support substrate 103 may be a flexible substrate. For example, each of the first support substrate 102 and the second support substrate 103 may be one of a film substrate, which includes a polymer organic material, and a plastic substrate. For example, each of the first support substrate 102 and the second support substrate 103 may include at least one compound selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. In addition, the substrate 101 may include fiber glass reinforced plastic (FRP).

The barrier layer 104 may be disposed between the first support substrate 102 and the second support substrate 103 and may serve to bond the first support substrate 102 to the second support substrate 103 and, simultaneously, serve to planarize the first and second support substrates 102 and 103 including organic materials. The barrier layer 104 may be made of an inorganic material.

A buffer layer 111 is disposed on the substrate 101. The buffer layer 111 may be disposed on the second support substrate 103. The buffer layer 111 serves to smooth a surface of the substrate 101 and prevent moisture or external air from infiltrating. The buffer layer 111 may be an inorganic film. The buffer layer 111 may be a single layer or a multi-layer.

A plurality of thin film transistors TR are disposed on the buffer layer 111. In an embodiment, the plurality of thin film transistors TR may be driving thin film transistors. The thin film transistor TR may be provided as one or more thin film transistors TR in each pixel. The thin film transistor TR may include a semiconductor layer CH, a gate electrode GE, a source electrode SE, and a drain electrode DE.

The semiconductor layer CH is disposed on the buffer layer 111 (e.g., directly thereon in a thickness direction of the substrate 101). In an embodiment, the semiconductor layer CH may include amorphous silicon, poly silicon, or an organic semiconductor. However, embodiments of the present inventive concepts are not limited thereto. For example, in an embodiment, the semiconductor layer CH may be an oxide semiconductor. In an embodiment, the semiconductor layer CH may include a channel region, and a source region and a drain region which are disposed on both sides of the channel region and doped with impurities.

A gate insulating layer 112 is disposed on the semiconductor layer CH (e.g., directly thereon). The gate insulating layer 112 may be an inorganic layer. The gate insulating layer 112 may be a single layer or a multi-layer.

A first conductive layer DCL1 may be disposed on the gate insulating layer 112 (e.g., directly thereon in a thickness direction of the substrate 101). In an embodiment, the first conductive layer DCL1 may include the gate electrode GE, a first pad electrode PE1, and a gate signal line GSL. The first conductive layer DCL1 may further include a plurality of scan lines. The gate electrode GE may be connected to one among the plurality of scan lines. The first pad electrode PE1 and the gate signal line GSL may be physically connected, and the gate signal line GSL may be electrically connected to the thin film transistor TR of the pixel of the active area AAR.

The first conductive layer DCL1 may be formed of a metal material having conductivity. For example, in an embodiment, the first conductive layer DCL1 may include molybdenum (Mo), aluminum (Al), copper (Cu), or titanium (Ti). The first conductive layer DCL1 may be a single layer or a multi-layer.

An interlayer insulating layer 113 is disposed on the first conductive layer DCL1 (e.g., directly thereon in a thickness direction of the substrate 101). In an embodiment, the interlayer insulating layer 113 may be an inorganic layer. The interlayer insulating layer 113 may be a single layer or a multi-layer. The interlayer insulating layer 113 is disposed even in the pad region PA. The interlayer insulating layer 113 disposed on the pad region PA may also be referred to as a first insulating pattern. The first insulating pattern may be directly disposed on an upper surface of the first pad electrode PE1.

A second conductive layer DCL2 may be disposed on the interlayer insulating layer 113 (e.g., directly thereon in a thickness direction of the substrate 101). The second conductive layer DCL2 may include the source electrode SE, the drain electrode DE, a source connection electrode SCE, and a second pad electrode PE2 disposed in the pad region PA. In addition to the above description, the second conductive layer DCL2 may include a high potential voltage line, a low potential voltage line, and a plurality of data lines. However, embodiments of the present inventive concepts are not limited thereto.

The source electrode SE and the drain electrode DE may be electrically connected to the source region and the drain region of the semiconductor layer CH, respectively, through contact holes passing through the interlayer insulating layer 113 and the gate insulating layer 112.

The source connection electrode SCE may be electrically connected to the thin film transistor TR of each pixel. The source connection electrode SCE may be electrically connected to the touch member 30 through a contact hole. The second conductive layer DCL2 may be formed of a metal material having conductivity. For example, in an embodiment, the second conductive layer DCL2 may include Al, Cu, Ti, or Mo.

In an embodiment, the display device 1 may further include a storage capacitor and a switch thin film transistor on the substrate 101.

The second pad electrode PE2 may be disposed on the first insulating pattern (e.g., directly thereon in a thickness direction of the substrate 101). The second pad electrode PE may overlap the first pad electrode PE in the thickness direction.

A protective layer 114 is disposed on the second conductive layer DCL2 and the interlayer insulating layer 113 (e.g., directly thereon in a thickness direction of the substrate 101). For example, the protective layer 114 may be disposed to cover a pixel circuit including the thin film transistor TR. The protective layer 114 may be a planarization layer. The planarization layer may include a material such as acryl or polyimide.

A plurality of first electrodes 121 are disposed on the protective layer 114. The first electrode 121 may be a pixel electrode disposed in each pixel. In addition, the first electrode 121 may be an anode electrode of an organic light emitting diode.

The first electrode 121 may be electrically connected to the drain electrode DE or the source electrode SE disposed on the substrate 101 through a via hole passing through the protective layer 114.

In an embodiment, the first electrode 121 may be made of a material having a high work function. For example, the first electrode 121 may include indium-tin-oxide (ITO), indium-zinc-oxide (IZO), zinc oxide (ZnO), indium oxide ($In_2O_3$), or the like. Each of the exemplified conductive materials may have a relatively high work function and a transparent characteristic. When an organic light emitting display device is a top emission type display device, in addition to the above-described conductive materials, a reflective material such as silver (Ag), magnesium (Mg), Al, platinum (Pt), lead (Pd), gold (Au), nickel (Ni), neodymium (Nd), iridium (Ir), chromium (Cr), lithium (Li), calcium (Ca), or a mixture thereof may be further included. Thus, the first electrode 121 may have a single layer structure made of the above-described conductive materials and the above-described reflective materials or have a multilayer structure in which the above-described conductive materials and the above-described reflective materials are stacked.

A pixel defining layer 115 is disposed on the first electrode 121. The pixel defining layer 115 includes an opening which exposes at least a portion of the first electrode 121. For example, as shown in the embodiment of FIG. 4, the pixel defining layer 115 may cover lateral ends of the first electrode 121 and the opening may expose a central portion of the first electrode 121. However, embodiments of the present inventive concepts are not limited thereto. The pixel defining layer 115 may include an organic material or an inorganic material. For example, the pixel defining layer 115 may include materials such as a photoresist, a polyimide-based resin, an acrylic-based resin, a silicone compound, and a polyacrylic-based resin.

An organic light emitting layer 122 is disposed on the portion of the first electrode 121 exposed by the pixel defining layer 115. The organic light emitting layer 122 may be a color light emitting layer which emits specific colored light. For example, the organic light emitting layer 122 may include a red light-emitting layer 122_1 which emits red colored light, a green light-emitting layer 122_2 which emits green colored light, and a blue light emitting layer 122_3 which emits blue colored light. However, embodiments of the present inventive concepts are not limited thereto and the colors emitted by each light-emitting layer may vary. Each color light emitting layer may be disposed in each pixel.

Unlike that shown in the embodiment of FIG. 4, in some embodiments, the organic light emitting layer 122 may be integrally formed. For example, the organic light emitting layer 122 may be integrally formed without division of pixels. The organic light emitting layer 122 may be formed of a color light emitting layer which emits one colored light. For example, the organic light emitting layer 122 may be a blue light emitting layer which emits blue colored light. In this embodiment, for color conversion of pieces of light emitted from the organic light emitting layer 122, wavelength conversion patterns may be further disposed on the organic light emitting layer 122.

The second electrode 123 is disposed on the organic light emitting layer 122. In an embodiment, the second electrode 123 may be a common electrode disposed throughout the display device without division of pixels. In addition, the second electrode 123 may be a cathode electrode of the organic light emitting diode.

In an embodiment, the second electrode 123 may be made of a material having a low work function. For example, the second electrode 123 may include Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg). The second electrode 123 may further include an auxiliary electrode. The auxiliary electrode is a film formed through deposition of the above-described material, and a transparent metal oxide on the film, for example, ITO, IZO, ZnO, indium-tin-zinc-oxide, or the like.

When the display device 1 is a top emission type display device, a conductive layer having a low work function may be formed as a thin film serving as the second electrode 123, and a transparent conductive layer, for example, an ITO layer, an IZO layer, a ZnO layer, an $In_2O_3$ layer, or the like, may be stacked on the conductive layer.

As described above, the first electrode 121, the organic light emitting layer 122, and the second electrode 123 may constitute a light emitting element.

In an embodiment, a hole injection layer and/or a hole transport layer may be disposed between the first electrode 121 and the organic light emitting layer 122 (e.g., in a thickness direction of the substrate 101), and an electron transport layer and/or an electron injection layer may be disposed between the organic light emitting layer 122 and the second electrode 123 (e.g., in a thickness direction of the substrate 101).

The encapsulation layer 116 is disposed on the second electrode 123 (e.g., directly thereon in a thickness direction of the substrate 101). The encapsulation layer 116 includes at least one inorganic layer and at least one organic layer. The at least one inorganic layer and the at least one organic layer may be alternately stacked. For example, as shown in the embodiment of FIG. 4, the encapsulation layer 116 may be formed of a multi-layer including a first inorganic encapsulation layer 116a, an organic encapsulation layer 116b, and a second inorganic encapsulation layer 116c, which are sequentially stacked. In an embodiment, each of the first inorganic encapsulation layer 116a and the second inorganic encapsulation layer 116c may include one or more compounds selected from the group consisting of silicon oxide (SiOx), silicon nitride (SiNx), and silicon oxynitride (SiONx), and the organic encapsulation layer 116b may include any one compound selected from the group consisting of epoxy, acrylate, and urethane acrylate.

The touch member 30 is disposed on the encapsulation layer 116 (e.g., directly thereon in a thickness direction of the substrate 101). The touch member 30 may be in direct contact with an upper surface of the second inorganic encapsulation layer 116c of the encapsulation layer 116.

The touch member 30 includes a touch sensing area TSA and a touch non-sensing area NSA disposed in a periphery of the touch sensing area TSA. As described below, sensing electrodes and bridge connection electrodes for connecting the sensing electrodes may be disposed in the touch sensing area TSA, and a plurality of signal lines connected to the sensing electrodes may be disposed in the touch non-sensing area NSA.

In an embodiment, the touch member 30 may include a first touch insulating layer 310, a first touch conductive layer TCL1 disposed on the first touch insulating layer 310 (e.g., directly thereon in a thickness direction of the substrate 101), a second touch insulating layer 330 disposed on the first touch conductive layer TCL1 and the first touch insulating layer 310 (e.g., directly thereon), and a second touch conductive layer TCL2 disposed on the second touch insulating layer 330 (e.g., directly thereon in a thickness direction of the substrate 101).

The first touch insulating layer 310 may be disposed on the second inorganic encapsulation layer 116c (e.g., directly thereon in a thickness direction of the substrate 101). The first touch insulating layer 310 may be directly formed on the second inorganic encapsulation layer 116c. The first touch insulating layer 310 may serve to insulate the first touch conductive layer TCL1 from the plurality of conductive layers of the display member 20.

In an embodiment, the first touch insulating layer 310 may include an inorganic insulating material. For example, the inorganic insulating material may include one or more compounds selected from the group consisting of SiOx, SiNx, and $SiON_x$. However, embodiments of the present inventive concepts are not limited thereto. For example, in an embodiment, the first touch insulating layer 310 may include an organic material. The organic material may include at least one material among an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The first touch conductive layer TCL1 may be disposed on the first touch insulating layer 310. In an embodiment, the first touch conductive layer TCL1 may include second touch bridge electrodes CP2 which electrically connect adjacent second sensing electrodes IE2_1 to IE2_4. The second touch bridge electrodes CP2 may be disposed to be spaced apart from each other. The second touch bridge electrodes CP2, which are disposed to be spaced apart from each other, may partially expose an upper surface of the first touch insulating layer 310. In an embodiment, the touch bridge electrodes of the first touch conductive layer TCL1, such as the second touch bridge electrodes CP2, may overlap a black matrix and the pixel defining layer 115. Thus, the touch bridge electrodes may be prevented from being visually recognized by a user. The first touch conductive layer TCL1 may further include a first-first touch connection electrode TCE11 disposed in the main region MR and a first-second touch connection electrode TCE12 disposed in the sub region SR.

The second touch insulating layer 330 may be disposed on the first touch conductive layer TCL1. The second touch insulating layer 330 may be in direct contact with portions of the first touch insulating layer 310 having an upper surface that is exposed. The second touch insulating layer 330 may serve to insulate the first touch conductive layer TCL1 from the second touch conductive layer TCL2. The second touch insulating layer 330 may include an inorganic insulating material. For example, in an embodiment, the second touch insulating layer 330 may be made of at least one among the above exemplified materials of the first touch insulating layer 310. In the pad region PA, the second touch insulating layer 330 may include a second insulating pattern 330a. The second insulating pattern 330a may be disposed on a second pad electrode PE2 (e.g., directly thereon in a thickness direction of the substrate 101). For example, the second insulating pattern 330a may be disposed directly above the second pad electrode PE2.

The second touch conductive layer TCL2 may be disposed on the second touch insulating layer 330. In an embodiment, the second touch conductive layer TCL2 may include a plurality of first sensing electrodes IE1_1 to IE1_8 and the plurality of second sensing electrodes IE2_1 to IE2_4 and may further include first touch bridge electrodes CP1, which electrically connect adjacent first sensing electrodes IE1_1 to IE1_8, and third pad electrodes PE3 disposed in the pad region PA. The third pad electrode PE3 may be disposed directly above the second insulating pattern 330a and may be in direct contact with a portion of an upper surface of the second pad electrode PE2, which is exposed by the second insulating pattern 330a, to be electrically connected to the second pad electrode PE2. The first pad electrode PE1, the second pad electrode PE2, and the third pad electrode PE3 may constitute the pad electrode PE of the pad region PA. The pad electrode PE may be electrically connected to a bump BUMP disposed on a lower surface of the substrate SUB of a driving member D_IC or the driving chip 70 (see FIG. 1). The pad electrode PE may be directly connected to the bump BUMP. A detailed description thereof will be described below.

In addition, the second touch conductive layer TCL2 may further include a second-first touch connection electrode TCE21 disposed in the main region MR, and a second-second touch connection electrode TCE22 disposed in the sub region SR.

As shown in the embodiment of FIG. 5, the plurality of first sensing electrodes IE1_1 to IE1_8 may extend in the second direction DR2 and may be arranged in the first direction DR1. The plurality of second sensing electrodes IE2_1 to IE2_4 may extend in the first direction DR1 and may be disposed in the second direction DR2.

Each of the plurality of first sensing electrodes IE1_1 to IE1_8 may include a plurality of first sensing lines SPL1 disposed to have a mesh shape. Regions divided by the plurality of first sensing lines SPL1 may overlap the organic light emitting layers 122_1 to 122_3 which are disposed in each pixel.

Each of the plurality of second sensing electrodes IE2_1 to IE2_4 may include a plurality of second sensing lines SPL2 disposed to have a mesh shape. Regions divided by the plurality of second sensing lines SPL2 may also overlap the organic light emitting layers 122_1 to 122_3. As an example, the regions divided by the plurality of first sensing lines SPL1 and the regions divided by the plurality of second sensing lines SPL2 may each have a rhombic shape. However, embodiments of the present inventive concepts are not limited thereto. In an embodiment, the rhombic shape includes not only a substantially rhombic shape but also a shape close to a rhombic shape in consideration of a process procedure and an arrangement shape of the sensing lines.

The plurality of first sensing lines SPL1 are electrically insulated from the plurality of second sensing lines SPL2. For example, in an embodiment, the plurality of first sensing lines SPL1 may be disposed in the same layer as the plurality of second sensing lines SPL2. In this embodiment, the plurality of first touch bridge electrodes CP1 and the plurality of second touch bridge electrodes CP2 are disposed on different layers to be electrically insulated from each other.

The touch bridge electrode and the sensing electrodes of the second touch conductive layer TCL2 may overlap the black matrix and the pixel defining layer 115. Thus, the touch bridge electrodes and the sensing electrodes may be prevented from being visually recognized by a user.

In an embodiment, electrodes included in the first touch conductive layer TCL1 may be opposite to electrodes of the second touch conductive layer TCL2.

In an embodiment, the first touch conductive layer TCL1 may include the first sensing electrodes IE1_1 to IE1_8 and the first touch bridge electrode CP1, and the second touch conductive layer TCL2 may include the second sensing electrodes IE2_1 to IE2_4 and the second touch bridge electrode CP2.

In an embodiment, the first touch conductive layer TCL1 may include the second sensing electrodes IE2_1 to IE2_4 and the second touch bridge electrode CP2, and the second touch conductive layer TCL2 may include the first sensing electrodes IE1_1 to IE1_8 and the first touch bridge electrode CP1.

Hereinafter, a description will be mainly made of an embodiment in which the first touch conductive layer TCL1 includes the second touch bridge electrodes CP2 which electrically connect adjacent second sensing electrodes IE2_1 to IE2_4, and the second touch conductive layer TCL2 includes the plurality of first sensing electrodes IE1_1 to IE1_8 and the plurality of second sensing electrodes IE2_1 to IE2_4 and further includes the first touch bridge electrodes CP1 which electrically connect adjacent first sensing electrodes IE1_1 to IE1_8.

Each of the first touch conductive layer TCL1 and the second touch conductive layer TCL2 may include a conductive material. In an embodiment, the conductive material may include, for example, a low-resistance metal such as Ag, Al, Cr, or Ni, or conductive nanomaterials such as silver nanowires or carbon nanotubes.

As shown in the embodiment of FIG. 6, the first-first touch connection electrode TCE11 may be disposed to overlap the second-first touch connection electrode TCE21 in the thickness direction. The second-first touch connection electrode TCE21 may be electrically connected to the source connection electrode SCE of the second conductive layer DCL2 through a second contact hole, and the first-second touch connection electrode TCE12 may be disposed to overlap the second-second touch connection electrode TCE22 in the thickness direction. The second-second touch connection electrode TCE22 may be electrically connected to the source connection electrode SCE of the second conductive layer DCL2 through a third contact hole.

In the above description, the second insulating pattern 330a is illustrated as being disposed in the same layer as the second touch insulating layer 330, and the third pad electrode PE3 is illustrated as being disposed in the same layer as the second touch conductive layer TCL2. However, embodiments of the present inventive concepts are not limited thereto. For example, the second insulating pattern 330a may be disposed in the same layer as the first touch insulating layer 310 and the third pad electrode PE3 may be disposed in the same layer as the first touch conductive layer TCL1.

The polarizing member 40 may be disposed on the second touch conductive layer TCL2 and the second touch insulating layer 330 (e.g., directly thereon in a thickness direction of the substrate 101). In an embodiment, the polarizing member 40 may be a polarizing film. The polarizing member 40 may include a polarizing layer 430 and a polarizing adhesive layer 410 disposed on the polarizing layer 430. In an embodiment, the polarizing adhesive layer 410 may contain polymer materials which are classified into a silicone-based material, a urethane-based material, an SU polymer of a silicone-urethane hybrid structure, an acrylic-based material, an isocyanate-based material, a polyvinyl alcohol-based material, a gelatin-based material, a vinyl-based material, a latex-based material, a polyester-based material, a water-polyester-based material, and the like.

However, embodiments of the present inventive concepts are not limited thereto. For example, in an embodiment, the polarizing member 40 may be omitted, and a color filter and a black matrix may be disposed on the touch member 30. The color filter and the black matrix may be included in the display member 20.

Referring to the embodiment of FIG. 5, the touch member 30 may be connected to the plurality of first sensing electrodes IE1_1 to IE1_8 and the plurality of second sensing electrodes IE2_1 to IE2_4 and may further include second signal lines SL2 and third signal lines SL3, which pass through the pad region PA and a second pad region PA2. The display member 20 may include first signal lines SL1 which are connected to the pixels of the display area and pass through the pad region PA and the second pad region PA2.

In an embodiment of the touch member 30, the first sensing electrodes IE1_1 to IE1_4 may be connected to signal lines through a right side of the drawing to be connected to the above-described second pad region PA2, the first sensing electrodes IE1_5 to IE1_8 may be connected to the third signal lines SL3 through a left side of the drawing to be connected to the second pad region PA2, and the second sensing electrodes IE2_1 to IE2_4 may be connected to the second signal lines SL2 through a lower side of the drawing to be connected to the second pad region PA2.

Referring to the embodiments of FIGS. 5 and 6, the second and third signal lines SL2 and SL3 located on the left and right sides of the active area AAR in FIG. 5 may each have a structure in which the first-first touch connection electrode TCE11 and the second-first touch connection electrode TCE21 are stacked. For example, a plurality of first-first touch connection electrodes TCE11 may be disposed on the first touch insulating layer 310, the second touch insulating layer 330 may be disposed on the plurality of first-first touch connection electrodes TCE11, and a plurality of second-first touch connection electrodes TCE21 may be disposed on the second touch insulating layer 330.

Referring to the embodiment of FIG. 7, as described above, the plurality of second sensing lines SPL2 of the plurality of second sensing electrodes IE2_1 to IE2_4 may be electrically connected by the second touch bridge electrodes CP2, and the plurality of first sensing lines SPL1 of the plurality of first sensing electrodes IE1_1 to IE1_8 may be electrically connected by the first touch bridge electrodes CP1.

Referring to the embodiment of FIG. 8, the second sensing lines SPL2 may be electrically connected to the second touch bridge electrodes CP2 disposed between the second touch insulating layer 330 and the first touch insulating layer 310 through contact holes CNT passing through the second touch insulating layer 330.

Hereinafter, a direct bonding method between the pad electrode PE and the bump BUMP will be described in more detail.

Figure 9:
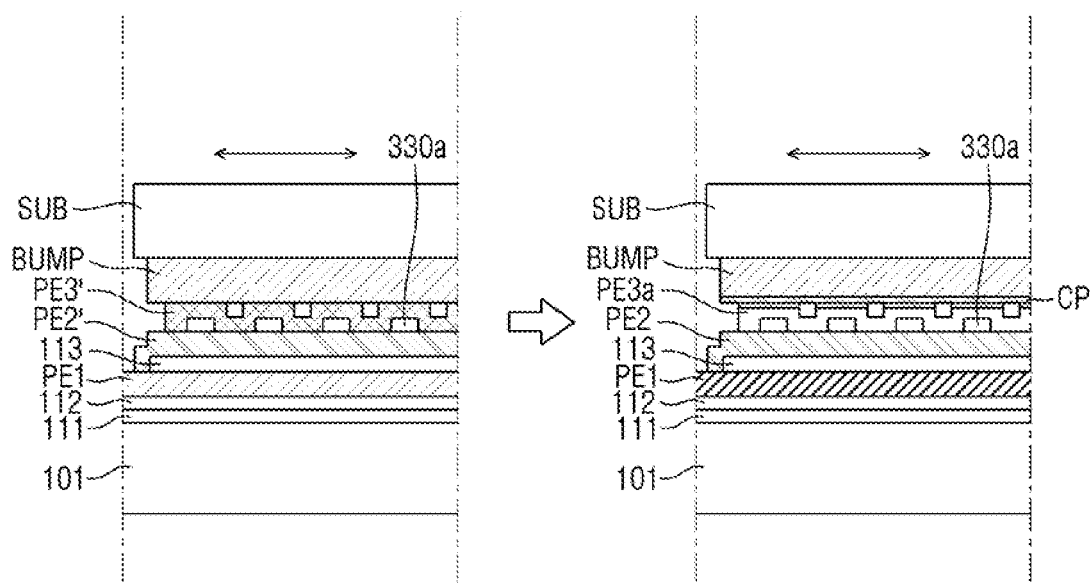
FIG. 9 shows schematic diagrams illustrating an ultrasonic bonding method between a pad electrode and a bump according to an embodiment of the present inventive concepts.

FIG. 9 shows schematic diagrams illustrating an ultrasonic bonding method between the pad electrode and the bump according to an embodiment.

Referring to FIG. 9, when the bump BUMP of the driving member D_IC is positioned on a pad electrode PE' of the display panel 10 and ultrasonic treatment is performed under a constant pressure, a frictional force may be generated in an interface between the pad electrode PE' and the bump BUMP. For example, the frictional force may be generated in the interface between a third pad electrode PE3', which is disposed at the top of the pad electrode PE', and the bump BUMP. The bump BUMP may vibrate according to a direction of ultrasonic vibration. For example, in an embodiment, the direction of the ultrasonic vibration may be the first direction DR1.

Due to the ultrasonic treatment, an interface CP between the bump BUMP and the third pad electrode PE3', such as a region BUMPa made of only a specific material of the bump BUMP and a region PE3a made of a specific material of the third pad electrode PE3', may be partially melted and, simultaneously, components of the bump BUMP and a third pad electrode PE3' are diffused toward each other so that the specific material of the bump BUMP and the specific material of the third pad electrode PE3' are mixed in the interface CP.

For example, since the specific material of the bump BUMP and the specific material of the third pad electrode PE3' are mutually diffused, an alloy of different materials may be formed in the interface CP.

In this way, the pad electrode PE, such as the third pad electrode PE3', may be directly bonded to the bump BUMP.

FIG. 10 is an enlarged plan view illustrating the pad region of FIG. 1.

Referring to the embodiment of FIG. 10, the pad electrode PE may be provided as a plurality of pad electrodes PE in the pad region PA, and the plurality of pad electrodes PE may be arranged in the second direction DR2. However, embodiments of the present inventive concepts are not limited thereto. Each of the plurality of pad electrodes PE may be electrically connected to the gate signal line GSL.

Figure 11:
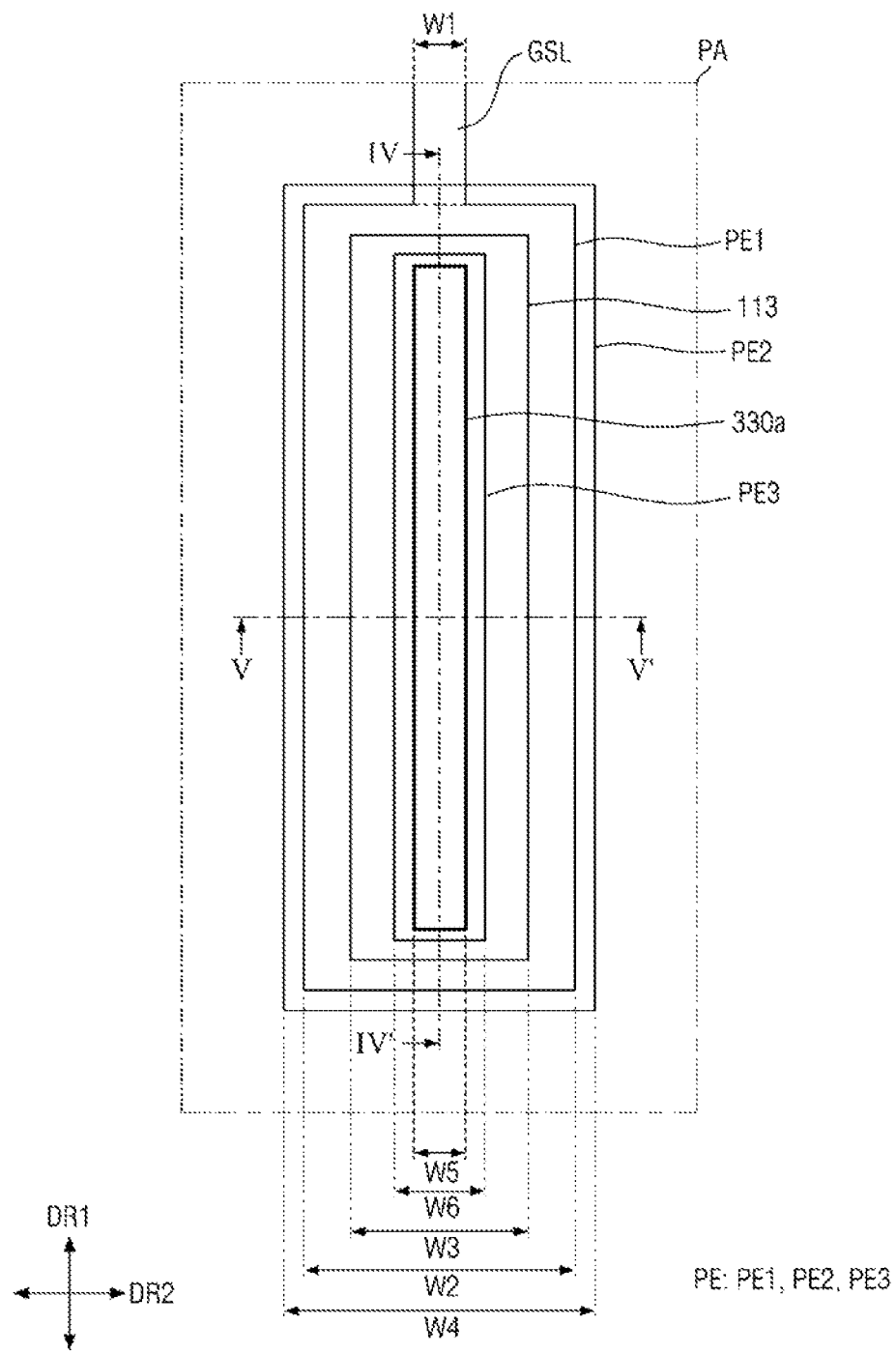
FIG. 11 is a plan view illustrating the pad electrode of FIG. 10 according to an embodiment of the present inventive concepts.
Figure 12:
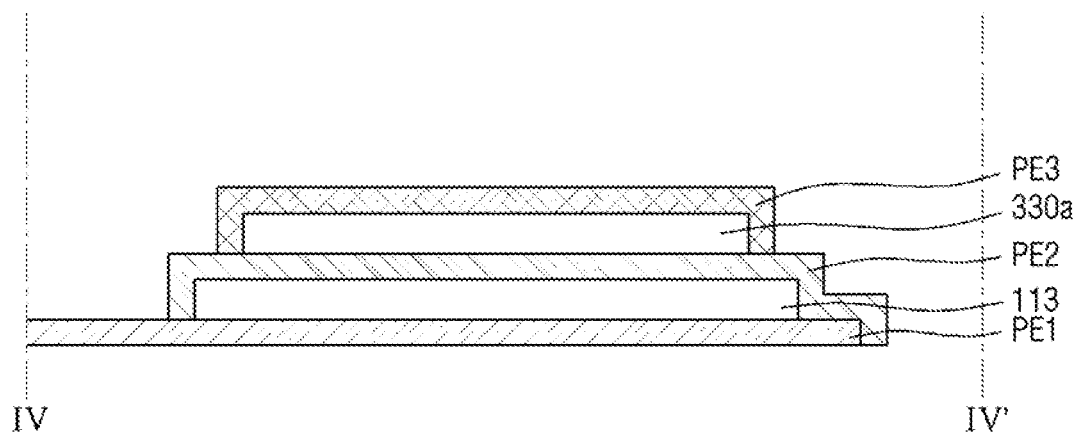
FIG. 12 is a cross-sectional view taken along line IV-IV' of FIG. 11 according to an embodiment of the present inventive concepts.
Figure 13:
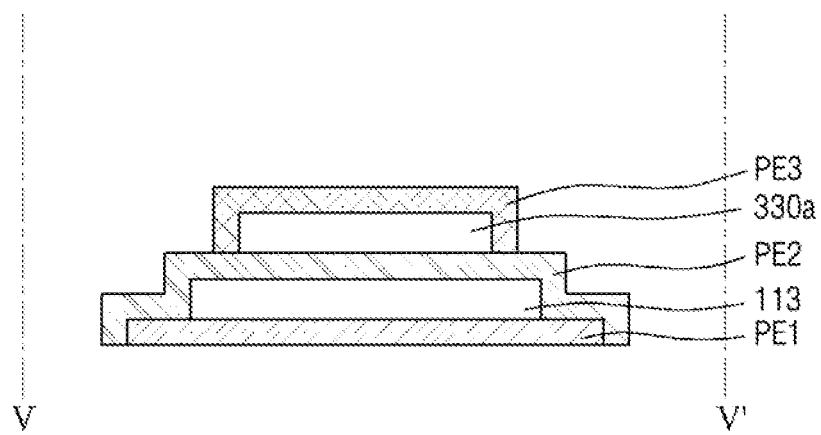
FIG. 13 is a cross-sectional view taken along line V-V' of FIG. 11.

FIG. 11 is a plan view illustrating the pad electrode of FIG. 10. FIG. 12 is a cross-sectional view taken along line IV-IV' of FIG. 11. FIG. 13 is a cross-sectional view taken along line V-V' of FIG. 11.

Referring to FIGS. 11 to 13, the first pad electrode PE1 may be physically connected to the gate signal line GSL, and a width W1 of the gate signal line GSL (e.g., length in the second direction DR2) may be less than a width W2 (e.g., length in the second direction DR2) of the first pad electrode PE1.

When viewed in a plan view, the first insulating pattern 113 may be positioned inside the first pad electrode PE1. A portion of the second pad electrode PE2 overlapping the first insulating pattern 113 may protrude further from the substrate 101 in the thickness direction than a portion of the second pad electrode PE2 not overlapping the first insulating pattern 113. The second pad electrode PE2 may be in direct contact with a portion of an upper surface of the first pad electrode PE1 in which the first insulating pattern 113 is not disposed.

When viewed in a plan view, a size of the second pad electrode PE2 (e.g., area in a plane defined in the first and second directions DR1, DR2) may be greater than a size of first pad electrode PE1 (e.g., area in a plane defined in the first and second directions DR1, DR2).

As shown in the embodiment of FIG. 11, the pad electrode PE may have a relatively longer side extending in the first direction DR1 and a relatively shorter side extending in the second direction DR2. However, embodiments of the present inventive concepts are not limited thereto. In an embodiment, a corner at which the relatively longer and relatively shorter sides of the pad electrode PE meet may have an angular shape. For example, the pad electrode PE may have a rectangular shape having two relatively longer sides and two relatively shorter side.

The first insulating pattern 113 may extend longitudinally in the first direction DR1, and the width W2 of the first pad electrode PE1 (e.g., length in the second direction DR2) may be greater than a width W3 of the first insulating pattern 113 (e.g., length in the second direction DR2).

In addition, a length of the first insulating pattern 113 in the first direction DR1 may be greater than the width W3 of the first insulating pattern 113 (e.g., length in the second direction DR2). For example, in an embodiment, the first insulating pattern 113 may have a line shape extending longitudinally in the first direction DR1.

In addition, a width W4 of the second pad electrode PE2 (e.g., length in the second direction DR2) may be greater than the width W3 of the first pad electrode PE1 (e.g., length in the second direction DR2). When viewed in a plan view, the second pad electrode PE2 may completely cover the first pad electrode PE1 (e.g., in a plane defined in the first and second directions DR1, DR2). In addition, the second pad electrode PE2 may cover side surfaces of the first pad electrode PE1 in the second direction DR2 and the upper surfaces thereof in the first direction DR1 and may be in direct contact with the side surfaces of the first pad electrode PE1 in the second direction DR2 and portions of the upper surfaces of the first pad electrode PE1 exposed by the first insulating pattern 113 in the first direction DR1.

The pad electrode PE may further include the third pad electrode PE3 disposed on the second pad electrode PE2. When viewed in a plan view, the second insulating pattern 330a may be positioned inside the first insulating pattern 113, and the third pad electrode PE3 may be in direct contact with the portion of the upper surface of the second pad electrode PE2, which is exposed by the second insulating pattern 330a. For example, the entire portion of the second insulating pattern 330a may overlap the first insulating pattern 113 in the thickness direction and the area of the second insulating pattern 330a (e.g., in the first and second directions DR1, DR2) may be less than the area of the first insulating pattern 113 (e.g., in the first and second directions DR1, DR2).

As shown in the embodiment of FIG. 11, a length of the second insulating pattern 330a in the first direction DR1 may be greater than the width of the second insulating pattern 330a in the second direction DR2. For example, the second insulating pattern 330A may have a line shape extending longitudinally in the first direction DR1. As shown in the embodiment of FIG. 11, a width W5 of the second insulating pattern 330a (e.g., length in the second direction DR2) may be smaller than a width W6 of the third pad electrode PE3 (e.g., length in the second direction DR2), and a length of the second insulating pattern 330a in the first direction DR1 may also be smaller than a length of the third pad electrode PE3 in the first direction of DR1. When viewed in a plan view, the second insulating pattern 330a may be located completely inside the third pad electrode PE3. For example, the entire portion of the second insulating pattern 330a may overlap the third pad electrode PE3 in the thickness direction and the area of the second insulating pattern 330a (e.g., in the first and second directions DR1, DR2) may be less than the area of the third pad electrode PE3 (e.g., in the first and second directions DR1, DR2).

When viewed in a plan view, a size of the third pad electrode PE3 (e.g., area in a plane defined in the first and second directions DR1, DR2) may be less than the sizes of the first pad electrode PE1 and the second pad electrode PE2

(e.g., areas in a plane defined in the first and second directions DR1, DR2), and a width W6 of the third pad electrode PE3 (e.g., length in the second direction DR2) may be smaller than the width W3 of the first pad electrode PE1 (e.g., length in the second direction DR2) and the width W4 of the second pad electrode PE2 (e.g., length in the second direction DR2).

The third pad electrode PE3 may be in direct contact with an upper surface and a side surface of the second insulating pattern 330a.

In the pad electrode PE according to an embodiment, the widths W2, W4, and W6 of the pad electrodes PE1, PE2, and PE3 and the widths W3 and W5 of the insulating patterns 113 and 330a are configured as described above, and thus as shown in FIGS. 12 and 13, both cross-sectional shapes cut in the first direction DR1 and the second direction DR2 may have a step shape. For example, the pad electrode PE may have a surface protruding from a central portion in the first direction DR1 or the second direction DR2 to the outermost side in the thickness direction. A surface of the pad electrode PE protruding to the corresponding outermost side in the thickness direction may be substantially ultrasonically bonded to the bump BUMP. For example, since the pad electrode PE has the stepped cross-sectional shape and thus a contact area between the bump BUMP and the pad electrode PE is decreased, even when a relatively small load is applied to an upper portion of the driving member D_IC, a bonding energy for reliable bonding between the bump BUMP and the pad electrode PE may be obtained. In addition, when a large load is applied to the upper portion of the driving member D_IC, physical damage may occur in the driving member D_IC and/or the display panel 10. As described above, since a sufficient bonding energy may be obtained even with a relatively small load, due to a small load, a probability of the physical damage occurring in the driving member D_IC and/or the display panel 10 may be minimized.

In addition, in an embodiment, before the bump BUMP is ultrasonically bonded to the pad electrode PE, in a state in which a non-conductive film is disposed on the pad electrode PE, the driving member D_IC may be disposed on the non-conductive film to be ultrasonically bonded to the pad electrode PE. Since the central portion of the pad electrode PE (e.g., in the first and/or second directions DR1, DR2) according to an embodiment has the stepped cross-sectional shape having a surface protruding to the outermost side in the thickness direction, the non-conductive film may have increased flowability.

Hereinafter, other embodiments of the present inventive concepts will be described. In the following embodiment, the same reference numerals will be assigned to components which are the same as the above-described components, and duplicate descriptions thereof will be omitted or simplified herein for convenience of explanation.

Figure 14:
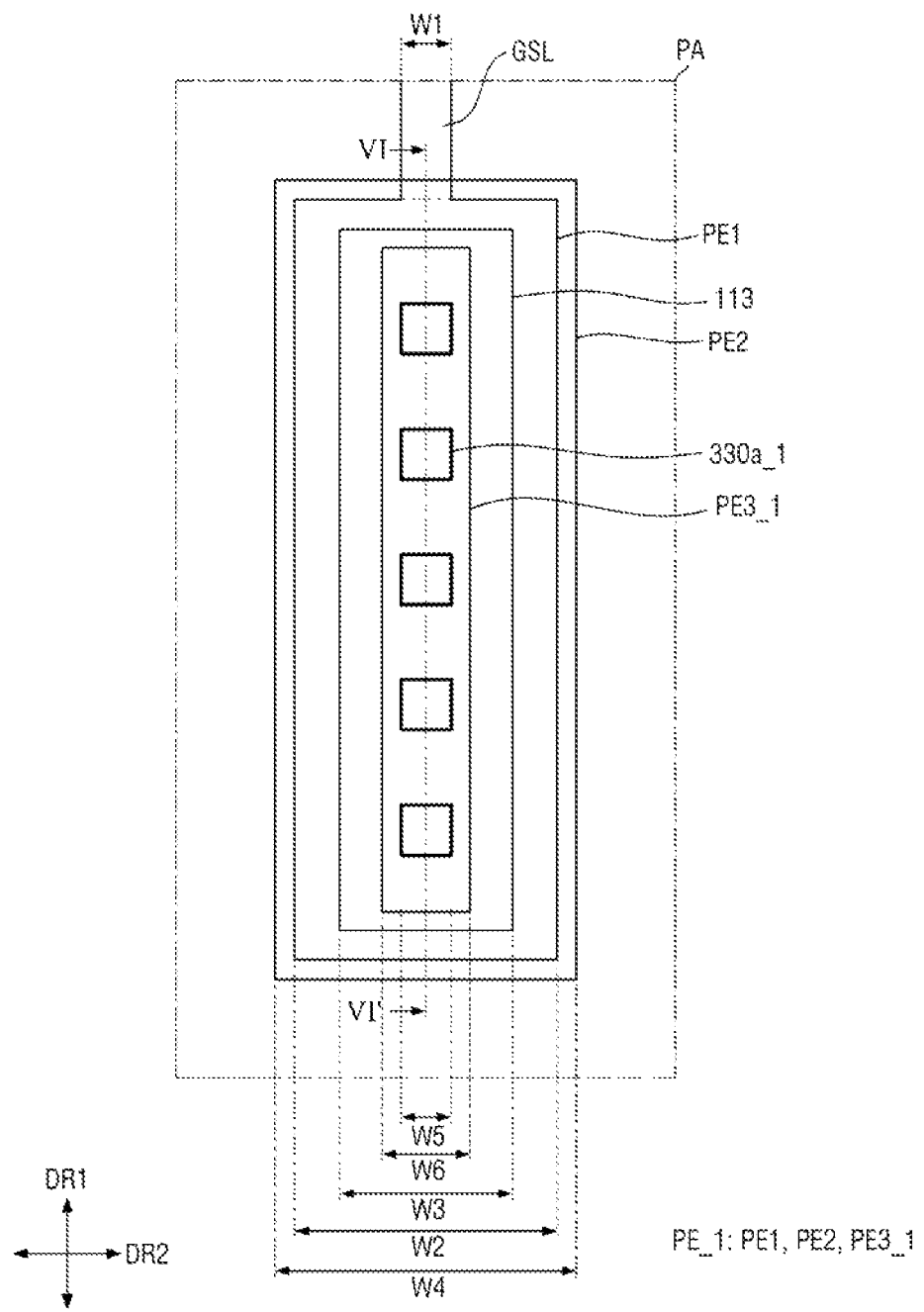
FIG. 14 is a plan view illustrating a pad electrode according to an embodiment of the present inventive concepts.
Figure 15:
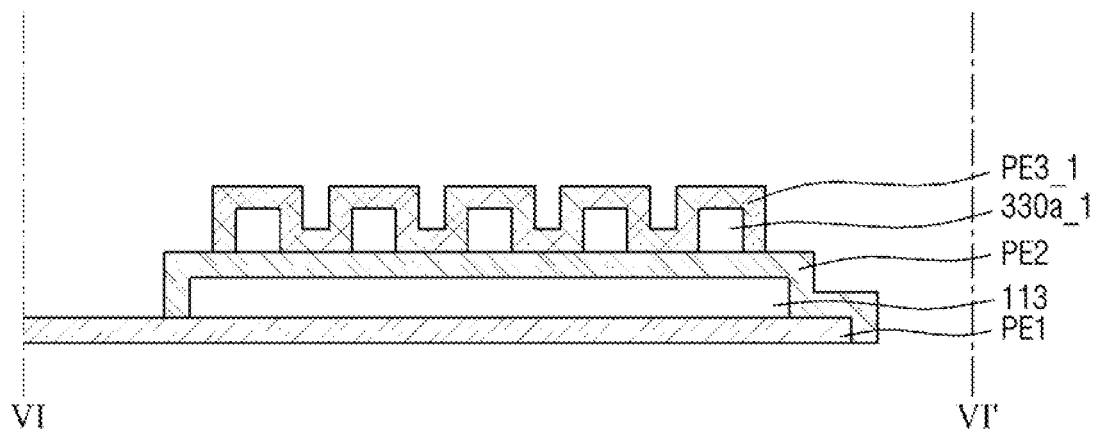
FIG. 15 is a cross-sectional view taken along line VI-VI' of FIG. 14 according to an embodiment of the present inventive concepts.

FIG. 14 is a plan view illustrating a pad electrode according to an embodiment. FIG. 15 is a cross-sectional view taken along line VI-VI' of FIG. 14.

Referring to the embodiments of FIGS. 14 and 15, the display device is different from the display device according to the embodiments of FIGS. 11 to 13 based on a second insulating pattern 330a_1 includes a plurality of first separation patterns disposed to be spaced apart from each other in the first direction DR1. For example, as shown in the embodiment of FIG. 14, each of the first separation patterns of the second insulating pattern 330a_1 may have a substantially square shape in a plan view. However, embodiments of the present inventive concepts are not limited thereto.

As shown in the embodiment of FIG. 15, a third pad electrode PE3_1 of a pad electrode PE_1 may conformally reflect a surface step of the second insulating pattern 330a_1 and may be in direct contact with an upper surface of a second pad electrode PE2 which is exposed between adjacent first separation patterns of the second insulating pattern 330a_1.

Figure 16:
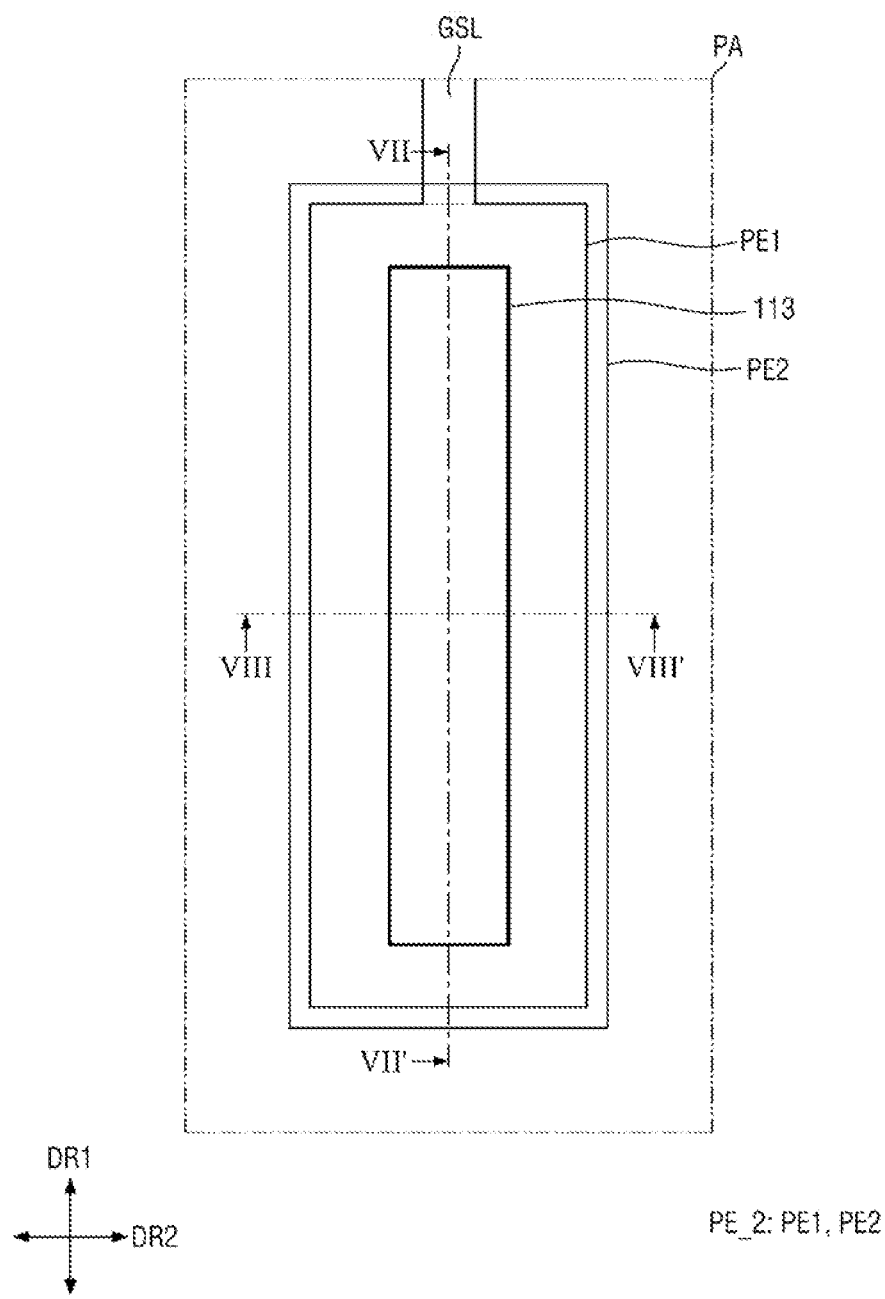
FIG. 16 is a plan view illustrating a pad electrode according to an embodiment of the present inventive concepts.
Figure 17:
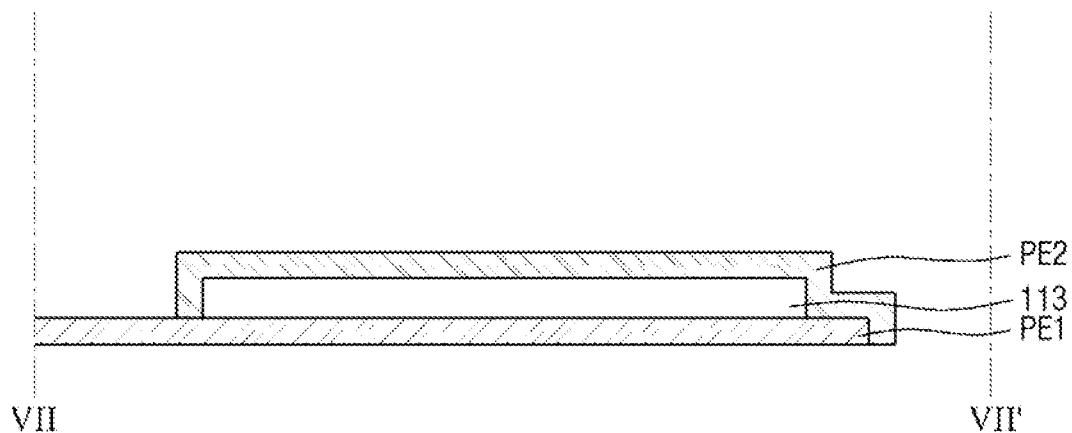
FIG. 17 is a cross-sectional view taken along line VII-VII' of FIG. 16 according to an embodiment of the present inventive concepts.
Figure 18:
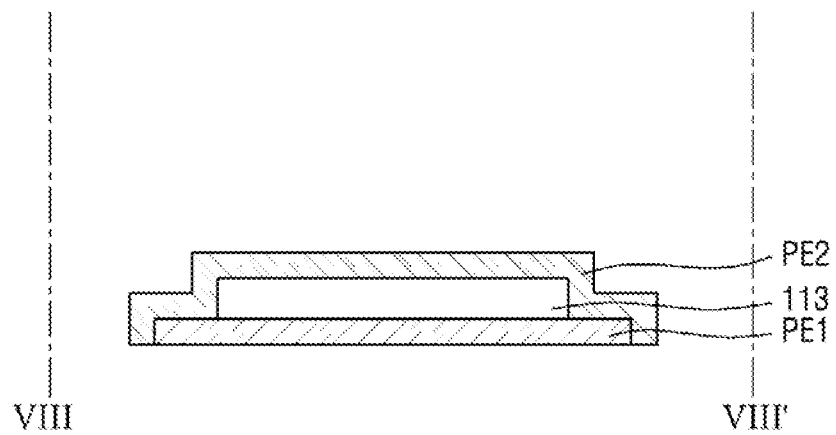
FIG. 18 is a cross-sectional view taken along line VIII-VIII' of FIG. 16 according to an embodiment of the present inventive concepts.

FIG. 16 is a plan view illustrating a pad electrode according to an embodiment. FIG. 17 is a cross-sectional view taken along line of FIG. 16. FIG. 18 is a cross-sectional view taken along line VIII-VIII' of FIG. 16.

Referring to the embodiments of FIGS. 16 to 18, a pad electrode PE_2 of a display device is different from the pad electrode PE according to the embodiments of FIGS. 11 to 13 based on the pad electrode PE_2 including only first and second pad electrodes PE1 and PE2 of a pad electrode PE of FIGS. 11 to 13.

Since planar structures and cross-sectional structures of the first pad electrode PE1, a first insulating pattern 113, and the second pad electrode PE2 are the same as those described with reference to FIGS. 11 to 13, duplicate descriptions thereof are omitted herein for convenience of explanation.

Figure 19:
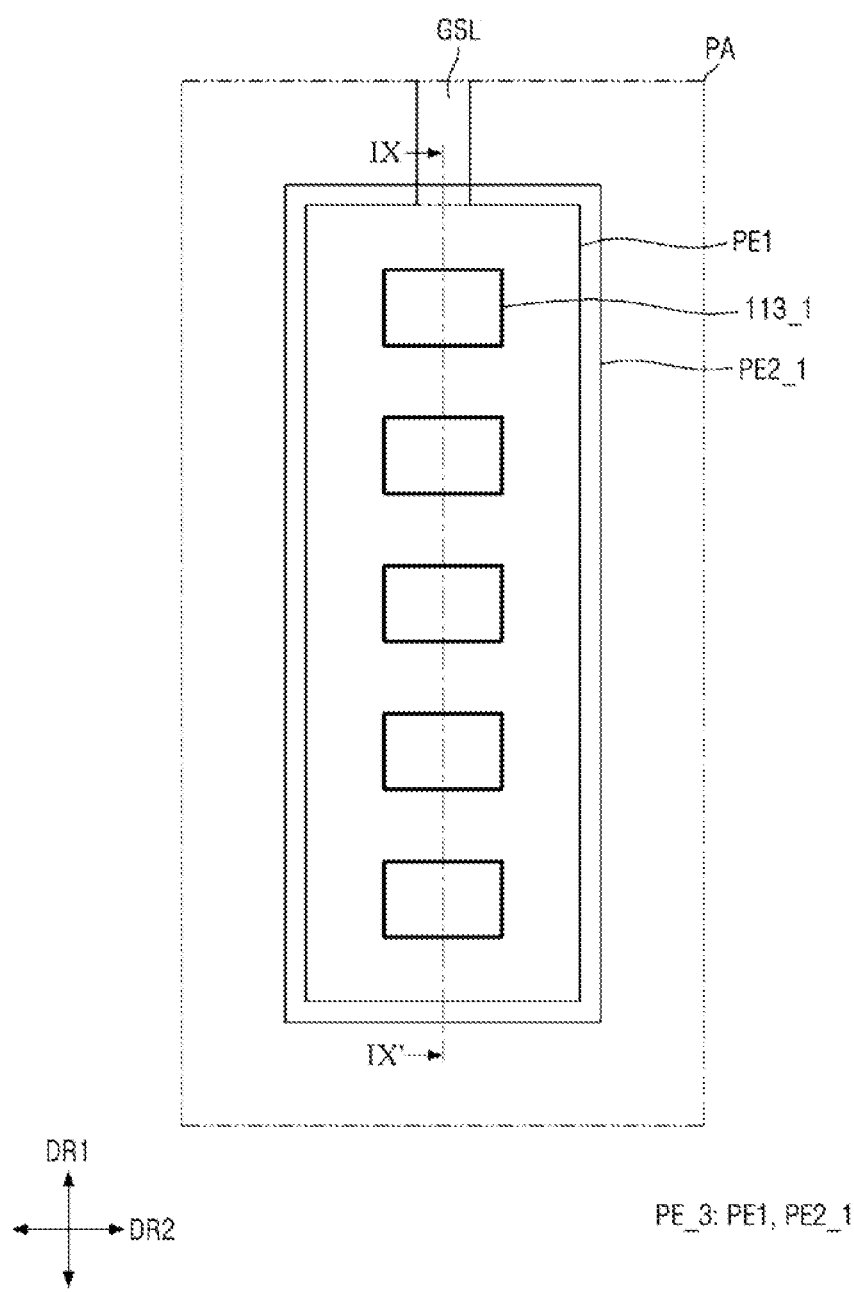
FIG. 19 is a plan view illustrating a pad electrode according to an embodiment of the present inventive concepts.
Figure 20:
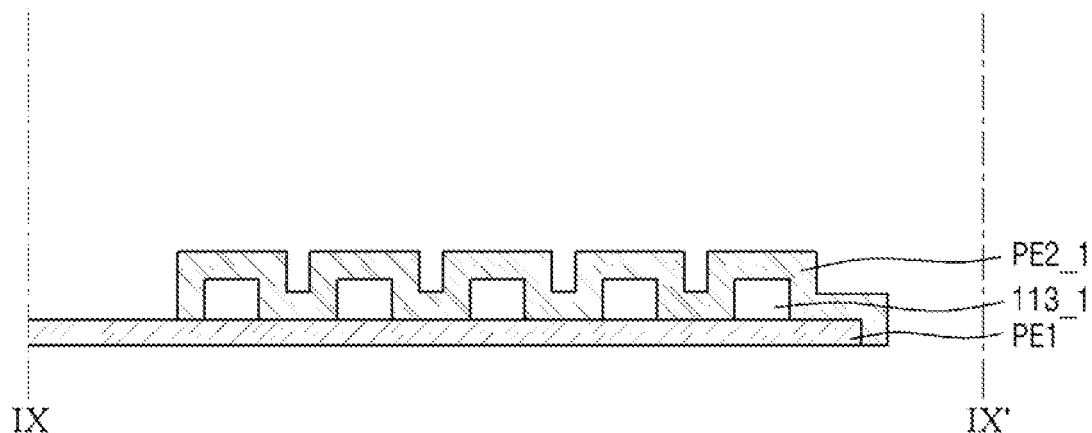
FIG. 20 is a cross-sectional view taken along line IX-IX' of FIG. 19 according to an embodiment of the present inventive concepts.

FIG. 19 is a plan view illustrating a pad electrode according to an embodiment. FIG. 20 is a cross-sectional view taken along line IX-IX' of FIG. 19.

Referring to the embodiments of FIGS. 19 and 20, a display device is different from the pad electrode PE_2 according to the embodiments of FIGS. 16 to 18 based on a first insulating pattern 113_1 including a plurality of first separation patterns disposed to be spaced apart from each other in the first direction DR1. For example, as shown in the embodiment of FIG. 19, each of the first separation patterns of the first insulating pattern 113_1 may have a substantially square shape in a plan view. However, embodiments of the present inventive concepts are not limited thereto.

As shown in the embodiment of FIG. 20, a second pad electrode PE2_1 of a pad electrode PE_3 may conformally reflect a surface step of the first insulating pattern 113_1 and may be in direct contact with an upper surface of a first pad electrode PE1 which is exposed between adjacent first separation patterns of the first insulating pattern 113_1.

Hereinafter, the embodiments of FIGS. 21 to 24 illustrate that the planar shape of the first insulating pattern of the display device of the embodiment of FIG. 16 may be variously modified. In the first insulating pattern 113_2, 113_3, 113_4 according to the embodiments of FIGS. 21 to 24, respectively, an area on a first side in the second direction DR2 and an area on the second side in the second direction DR2 that is opposite to the first side may be substantially the same and symmetrical based on an imaginary line extending in the first direction DR1. Consequently, even in a protruding surface of the second pad electrode PE2 protruding from a portion overlapping the first insulating pattern in the thickness direction, the area on one side in the second direction DR2 and the area on the other side in the second direction DR2 are substantially the same based on the imaginary line extending in the first direction DR1 so that it is possible to increase the bonding reliability with the bump BUMP. However, embodiments of the present inventive concepts are not limited thereto. For example, in an embodiment, in the first insulating pattern, the area on one side in the second direction DR2 may be different from the area on the other side in the second direction DR2 based on the imaginary line extending along the first direction DR1, and a shape of one side in the second direction DR2 may be different from a shape of the other side in the second direction DR2 based on the imaginary line.

In addition, the first insulating pattern may have a line shape in which a length L1 in the first direction DR1 is greater than a length L2 of the second direction DR2. As described above, since the direction of ultrasonic vibration is the first direction DR1, the length L1 of the first insulating pattern in the first direction DR1 may be designed to be longer than the length L2 thereof in the second direction DR2, thereby increasing an overall bonding area between the bump BUMP and a pad electrode PE_2.

Figure 21:
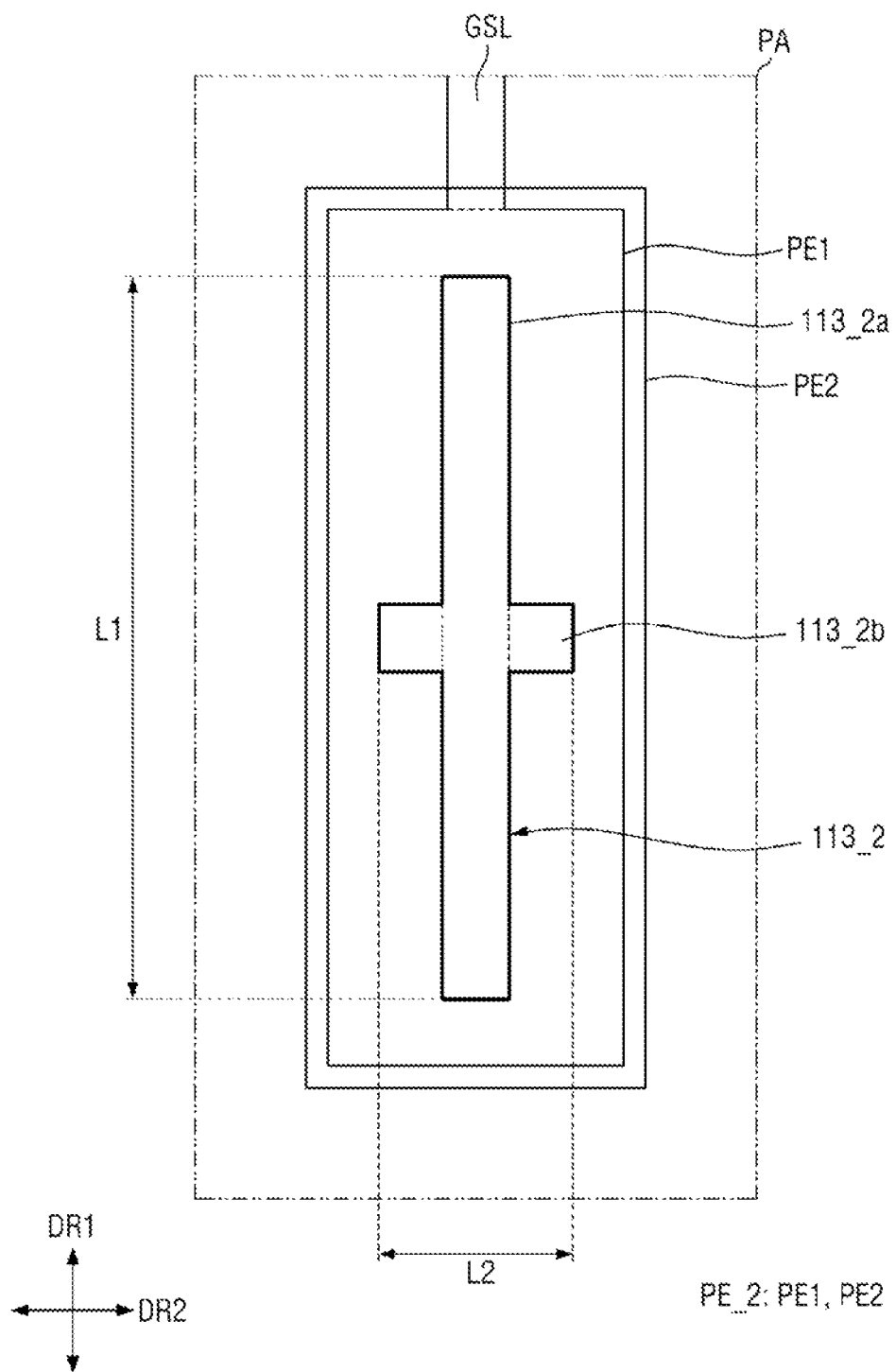
FIG. 21 is a plan view illustrating a pad electrode according to an embodiment of the present inventive concepts.
Figure 22:
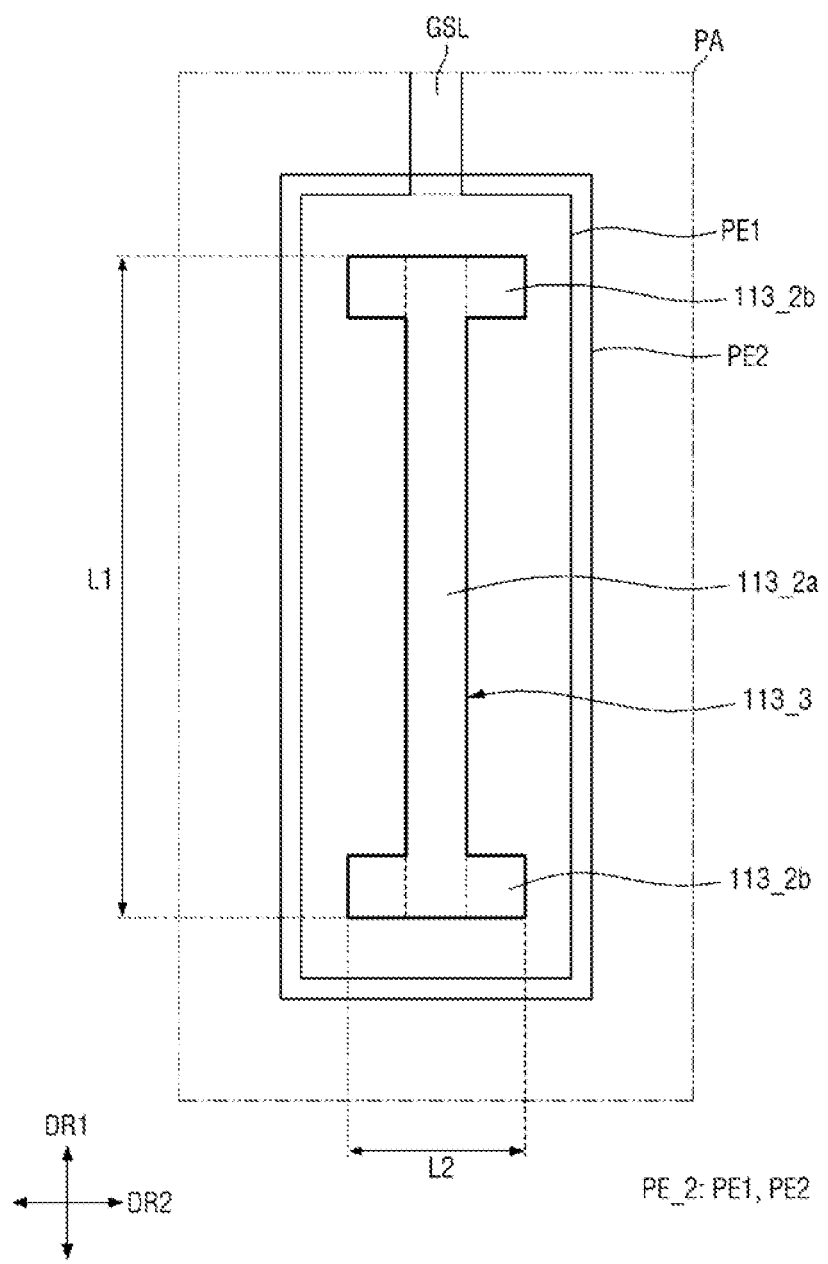
FIG. 22 is a plan view illustrating a pad electrode according to an embodiment of the present inventive concepts.
Figure 23:
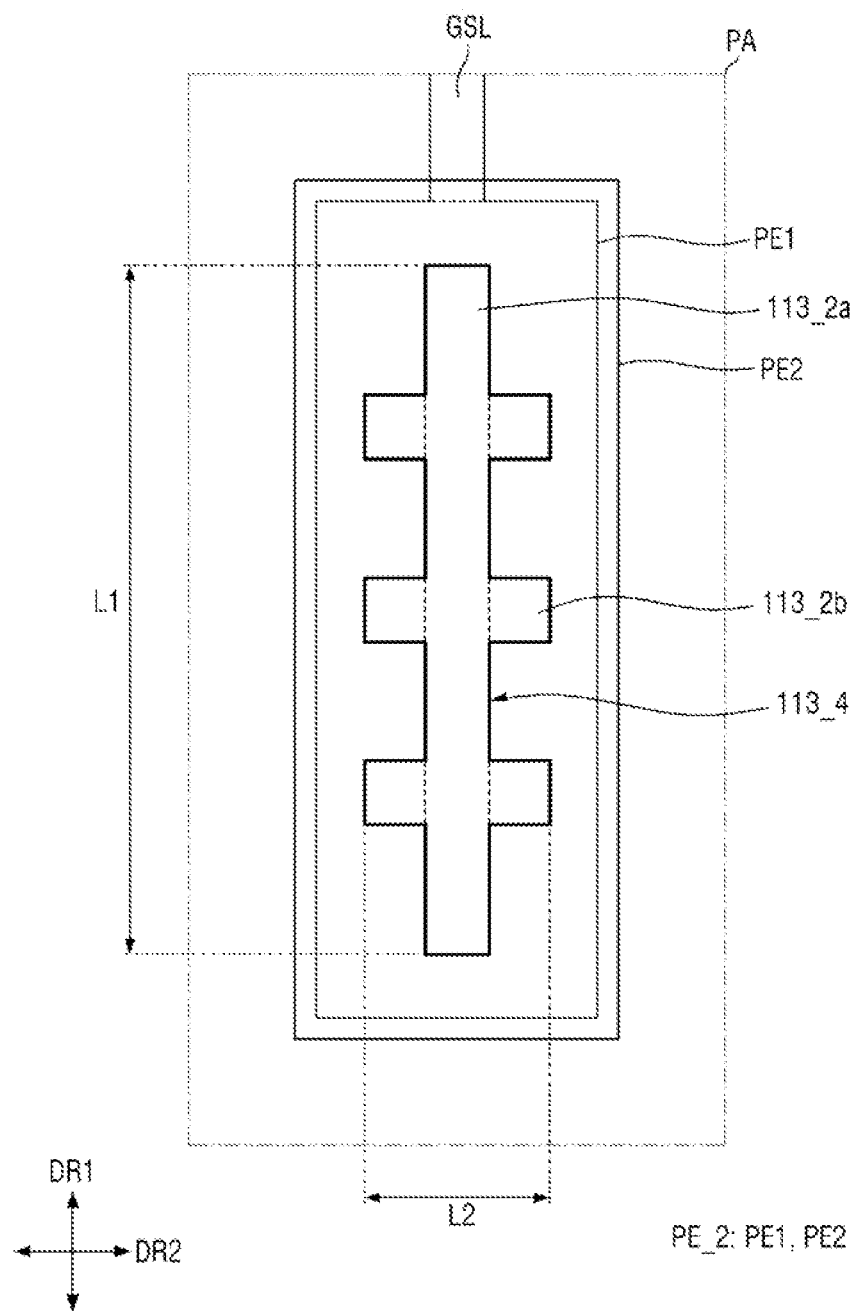
FIG. 23 is a plan view illustrating a pad electrode according to an embodiment of the present inventive concepts.
Figure 24:
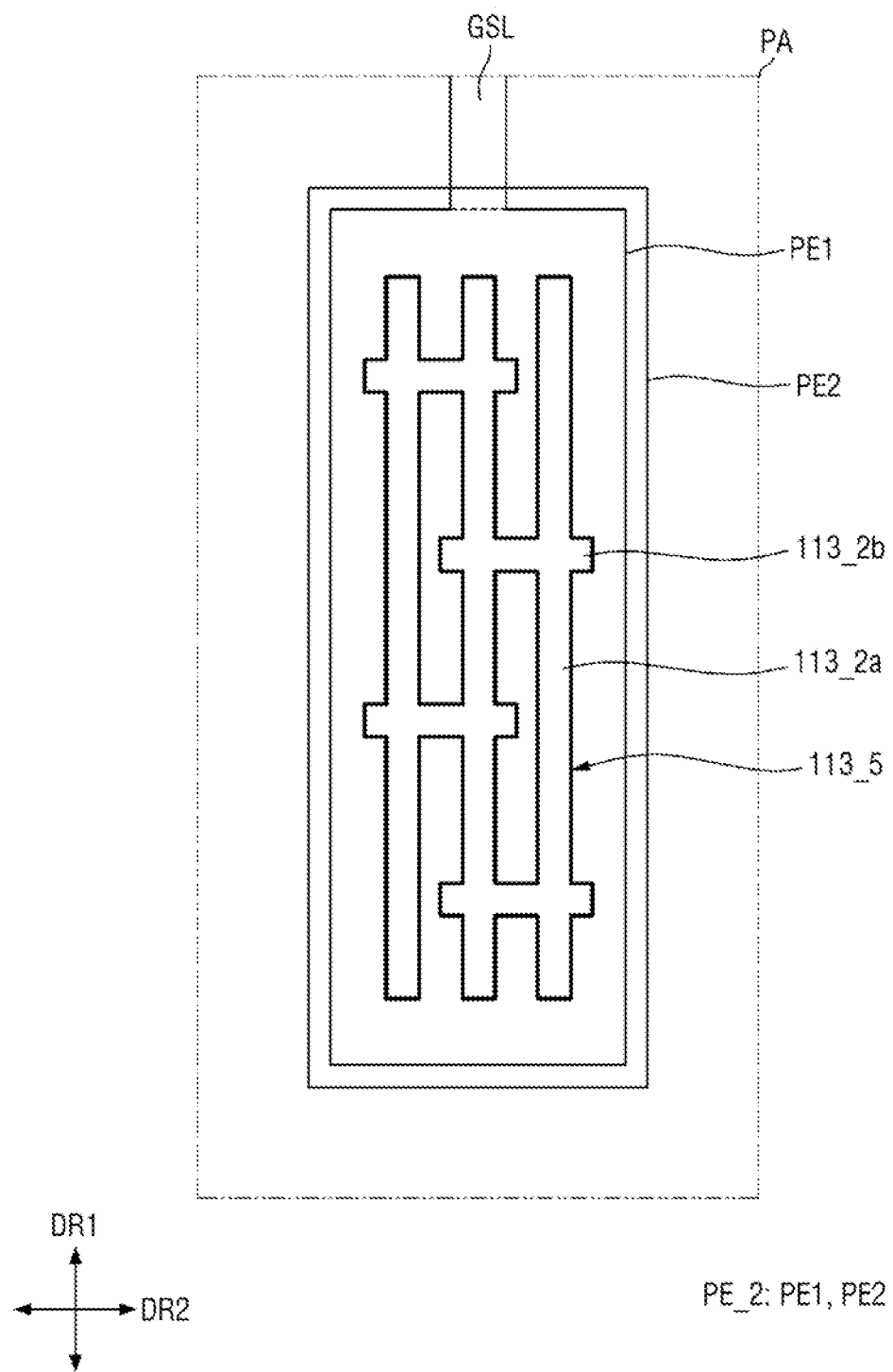
FIG. 24 is a plan view illustrating a pad electrode according to an embodiment of the present inventive concepts.

FIG. 21 is a plan view illustrating a pad electrode according to an embodiment. FIG. 22 is a plan view illustrating a pad electrode according to an embodiment. FIG. 23 is a plan view illustrating a pad electrode according to an embodiment. FIG. 24 is a plan view illustrating a pad electrode according to an embodiment.

As shown in the embodiments of FIGS. 21 to 24, each of first insulating patterns 113_2, 113_3, 113_4, and 113_5 includes a first sub-insulating pattern 113_2a extending longitudinally in the first direction DR1 and a second sub-insulating pattern 113_2b extending longitudinally in the second direction DR2, and the first sub-insulating pattern 113_2a and the second sub-insulating pattern 113_2b may intersect each other.

In the embodiment of FIG. 21, the first sub-insulating pattern 113_2a and the second sub-insulating pattern 113_2b may intersect at a central portion (e.g., a mid-point of the first sub-insulating pattern 113_2a in the first direction DR1) equally dividing a length of the first sub-insulating pattern 113_2a in the first direction DR1.

In the embodiment of FIG. 22, the first sub-insulating pattern 113_2a and a plurality of second sub-insulating patterns 113_2b may intersect at one end (e.g., an upper end) and the other end (e.g., a lower end) of the first sub-insulating pattern 113_2a in the first direction DR1.

FIG. 23 illustrates that the first sub-insulating pattern 113_2a and a plurality of second sub-insulating patterns 113_2b may intersect between one end (e.g., an upper end) and the other end (e.g., a lower end) of the first sub-insulating pattern 113_2a in the first direction DR1. For example, in the embodiment of FIG. 23, three second sub-insulating patterns 113_2b may be disposed between one end and the other end of the first sub-insulating pattern 113_2a in the first direction DR1. However, embodiments of the present inventive concepts are not limited thereto and the numbers of the second-sub-insulating patterns 113_2b may vary.

FIG. 24 illustrates that a plurality of the first sub-insulating patterns 113_2a and a plurality of second sub-insulating patterns 113_2b may intersect between one end and the other end of the first sub-insulating pattern 113_2a in the first direction DR1.

For example, as shown in the embodiment of FIG. 24, the pad electrode PE_2 may include three first sub-insulating patterns 113_2a and the outermost second sub-insulating pattern 113_2b in the first direction DR1 may intersect the first sub-insulating pattern 113_2a located on a first side (e.g., a left first sub-insulating pattern) in the second direction DR2 and the first sub-insulating pattern 113_2a adjacent to the first sub-insulating pattern 113_2a located on the first side in the second direction DR2 (e.g., a middle first sub-insulating pattern). The next outermost second sub-insulating pattern 113_2b based on the first direction DR1 may intersect the first sub-insulating pattern 113_2a located on the outermost second side based on the second direction DR2 (e.g., a right first sub-insulating pattern) and the first sub-insulating pattern 113_2a adjacent to the first sub-insulating pattern 113_2a located on the outermost one side based on the second direction DR2 (e.g., the middle first sub-insulating pattern). The arrangement manner of the second sub-insulating patterns 113_2b and the first sub-insulating patterns 113_2a may be repeatedly performed in the first direction DR1.

Although the embodiment of FIG. 24 includes three first sub-insulating patterns 113_2a and four second sub-insulating patterns 113_2b, the number of the first sub-insulating pattern 113_2a and the number of the second sub-insulating pattern 113_2b are not limited thereto.

Figure 25:
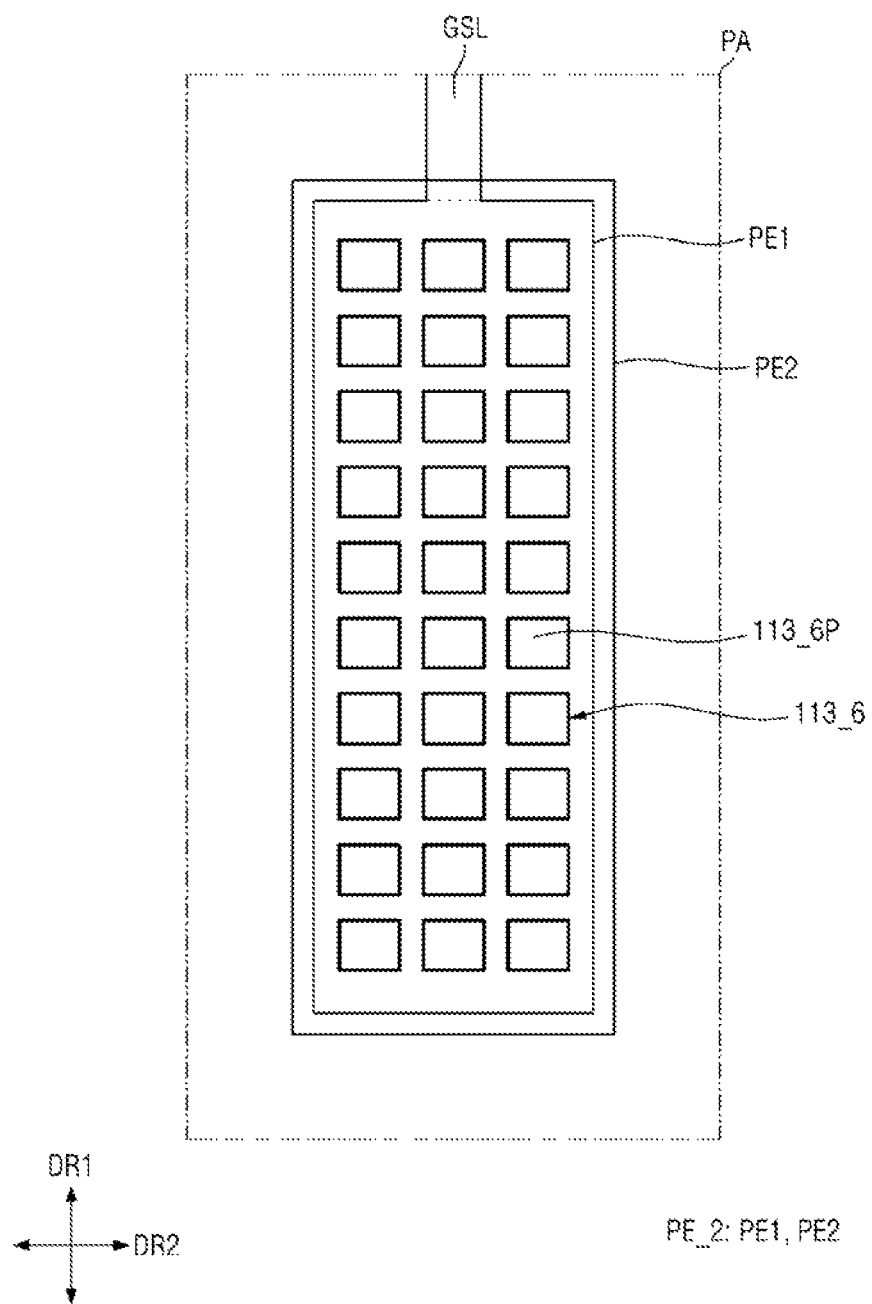
FIG. 25 is a plan view illustrating a pad electrode according to an embodiment of the present inventive concepts.
Figure 26:
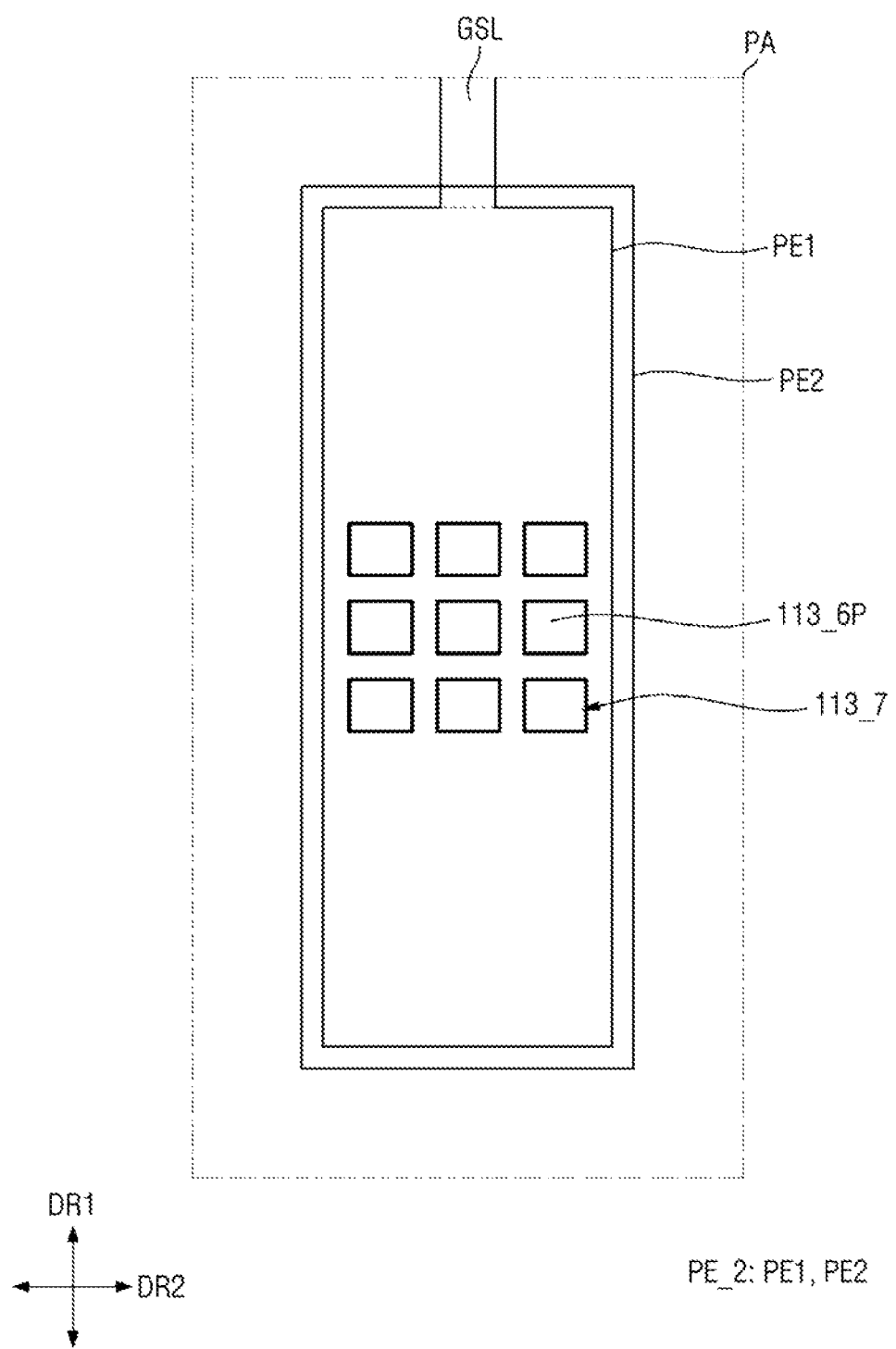
FIG. 26 is a plan view illustrating a pad electrode according to an embodiment of the present inventive concepts.

FIG. 25 is a plan view illustrating a pad electrode according to an embodiment. FIG. 26 is a plan view illustrating a pad electrode according to an embodiment.

Referring to FIGS. 25 and 26, a first insulating pattern 113_6 according to the present embodiment is different from the first insulating pattern 113 according to FIG. 11 in that the first insulating pattern 113_6 includes a plurality of first separation patterns 113_6P disposed in a matrix arrangement method in the first direction DR1 and the second direction DR2.

In the embodiment of FIG. 25, the plurality of first separation patterns 113_6P of the first insulating pattern 113_6 may be disposed at a uniform density in a region in which the first insulating pattern 113 of FIG. 11 is disposed. Consequently, bonding reliability between a bump BUMP and a pad electrode PE_2 may be increased.

Unlike the embodiment of FIG. 25, in the embodiment of FIG. 26 the plurality of first separation patterns 113_6P may be intensively disposed (e.g., concentrated) in a specific localized first region overlapping the first pad electrode PE1. For example, as shown in the embodiment of FIG. 26, the plurality of first separation patterns 113_6P may not be disposed outside of the localized first region. However, embodiments of the present inventive concepts are not limited thereto. Consequently, a second pad electrode PE2 overlapping the plurality of first separation patterns 113_6P may protrude to correspond thereto. Since the plurality of first separation patterns 113_6P are concentrated in the specific first region, a protruding surface area of the second pad electrode PE2 may be smaller than a protruding surface area of a second pad electrode PE2 of the embodiment of FIG. 25.

Figure 27:
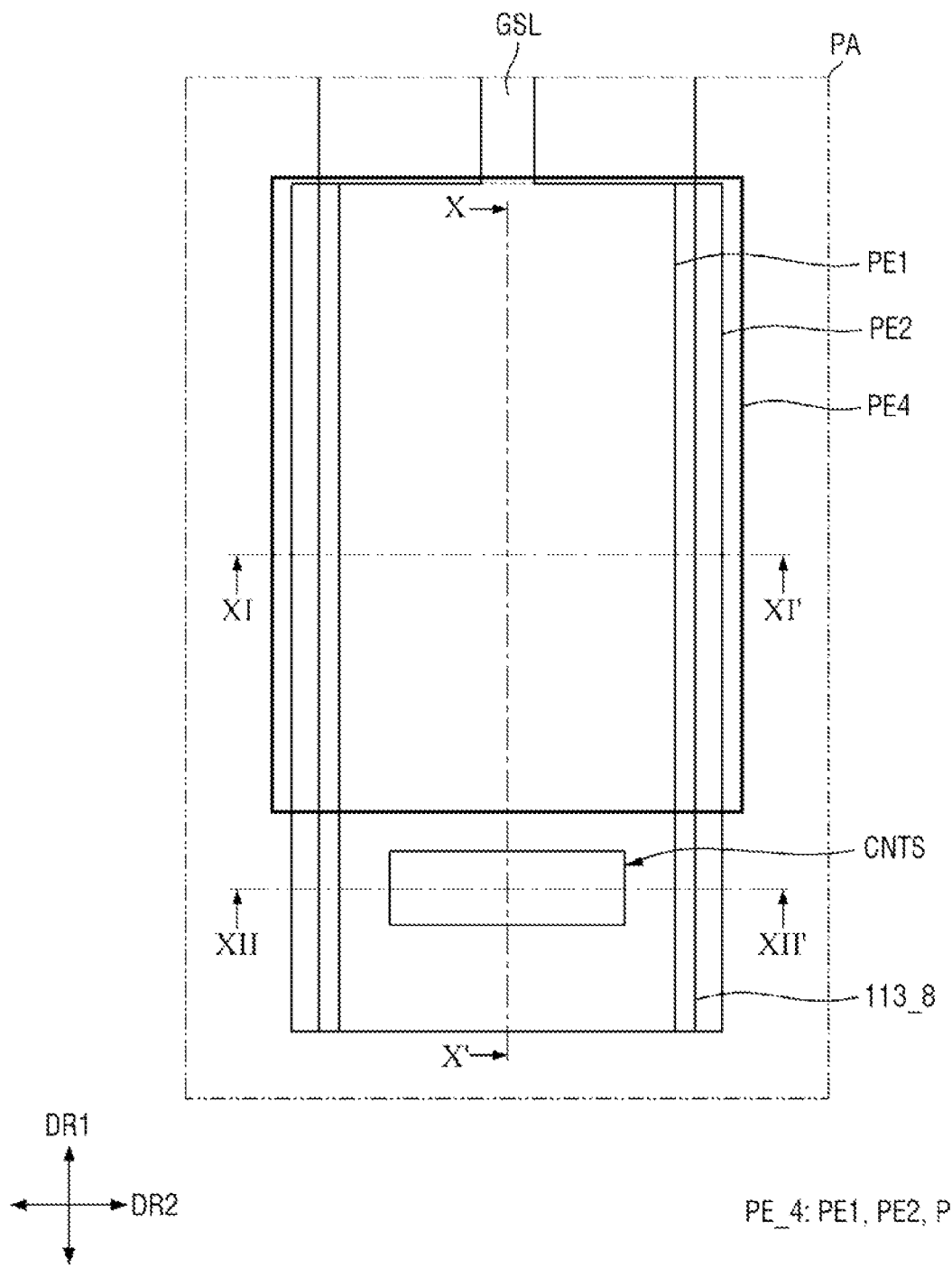
FIG. 27 is a plan view illustrating a pad electrode according to an embodiment of the present inventive concepts.
Figure 28:
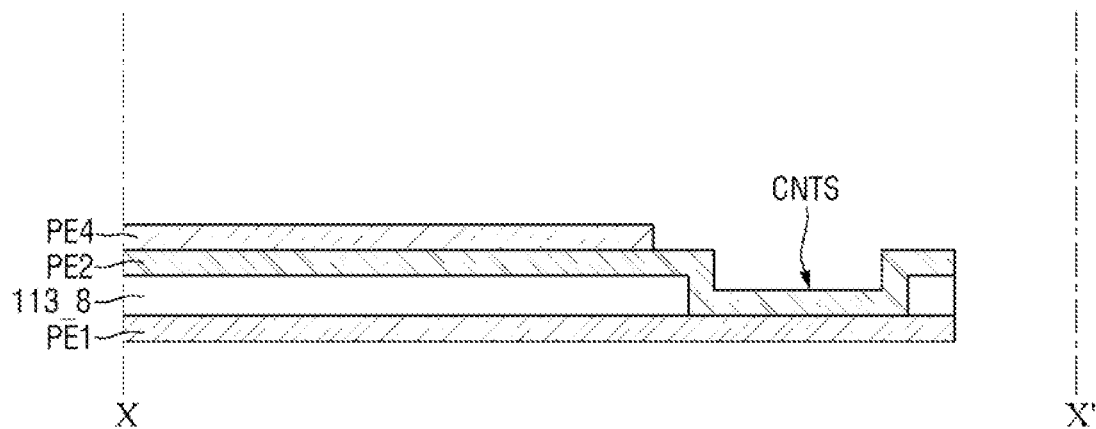
FIG. 28 is a cross-sectional view taken along line X-X' of FIG. 27 according to an embodiment of the present inventive concepts.
Figure 29:
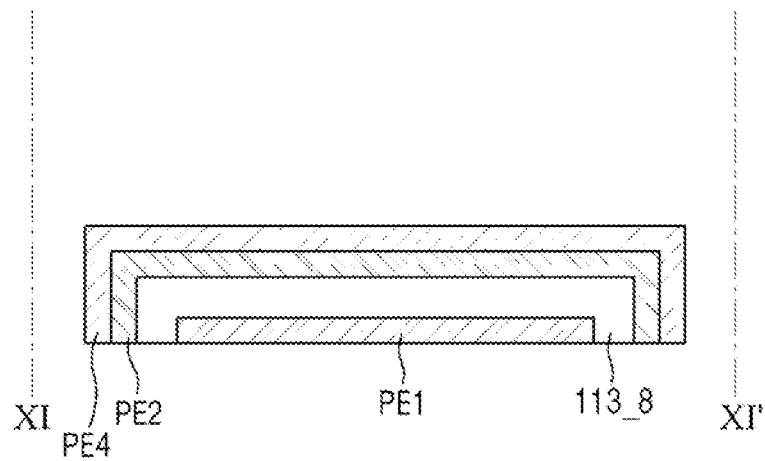
FIG. 29 is a cross-sectional view taken along line XI-XI' of FIG. 27 according to an embodiment of the present inventive concepts.
Figure 30:
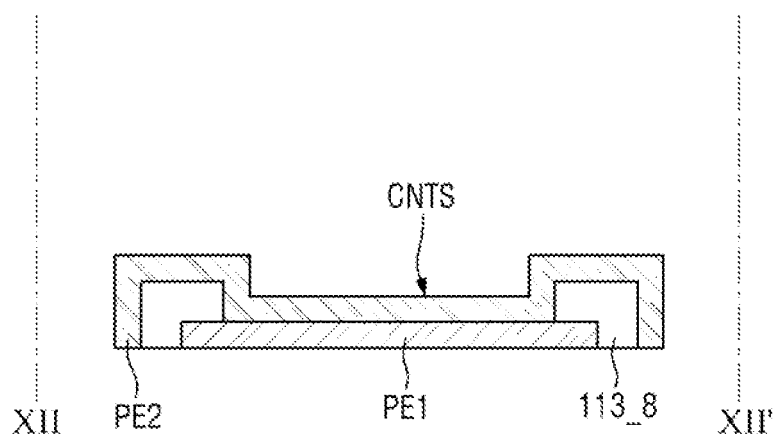
FIG. 30 is a cross-sectional view taken along line XII-XII' of FIG. 27 according to an embodiment of the present inventive concepts.

FIG. 27 is a plan view illustrating a pad electrode according to an embodiment. FIG. 28 is a cross-sectional view taken along line X-X' of FIG. 27. FIG. 29 is a cross-sectional view taken along line XI-XI' of FIG. 27. FIG. 30 is a cross-sectional view taken along line XII-XII' of FIG. 27.

Referring to the embodiments of FIGS. 27 to 30, a display device is different from the display device according to the embodiments of FIGS. 11 to 13 based on a first insulating pattern 113_8 of the display device including contact hole CNTS passing through the first insulating pattern 113_8 in the thickness direction.

According to an embodiment, a pad electrode PE_4 may further include a fourth pad electrode PE4 disposed on an upper surface of a second pad electrode PE2. The fourth pad electrode PE4 does not overlap the contact hole CNTS (e.g., in a thickness direction). When viewed in a plan view, the fourth pad electrode PE4 may be positioned on one side of the contact hole CNTS in the first direction DR1. For example, as shown in the embodiment of FIG. 27, the fourth pad electrode PE4 is positioned on an upper side of the contact hole CNTS in the first direction DR1. The second pad electrode PE2 may be electrically connected to a first pad electrode PE1 through the contact hole CNTS.

The first pad electrode PE1 may extend longitudinally in the first direction DR1. A width of the first insulating pattern 113_8 (e.g., length in the second direction DR2) may be greater than a width of the first pad electrode PE1 (e.g., length in the second direction DR2), and a width of the second pad electrode PE2 (e.g., length in the second direction DR2) may be greater than the width of the first pad electrode PE1 (e.g., length in the second direction DR2). The first insulating pattern 113_8 may cover side surfaces and an upper surface of the first pad electrode PE1, the second pad electrode PE2 may cover the side surfaces and the upper surfaces of the first insulating pattern 113_8, and the fourth pad electrode PE4 may be in direct contact with side surfaces and an upper surface of the second pad electrode PE2.

According to an embodiment, since the fourth pad electrode PE4 does not overlap the contact hole CNTS in the thickness direction, as shown in the embodiments of FIGS. 28 and 29, when compared to a surface of a region in which the contact hole CNTS is disposed, a surface of the fourth pad electrode PE4 is flat and protrudes in the thickness direction. Consequently, bonding reliability between a bump BUMP and the pad electrode PE_4 may be increased.

Figure 31:
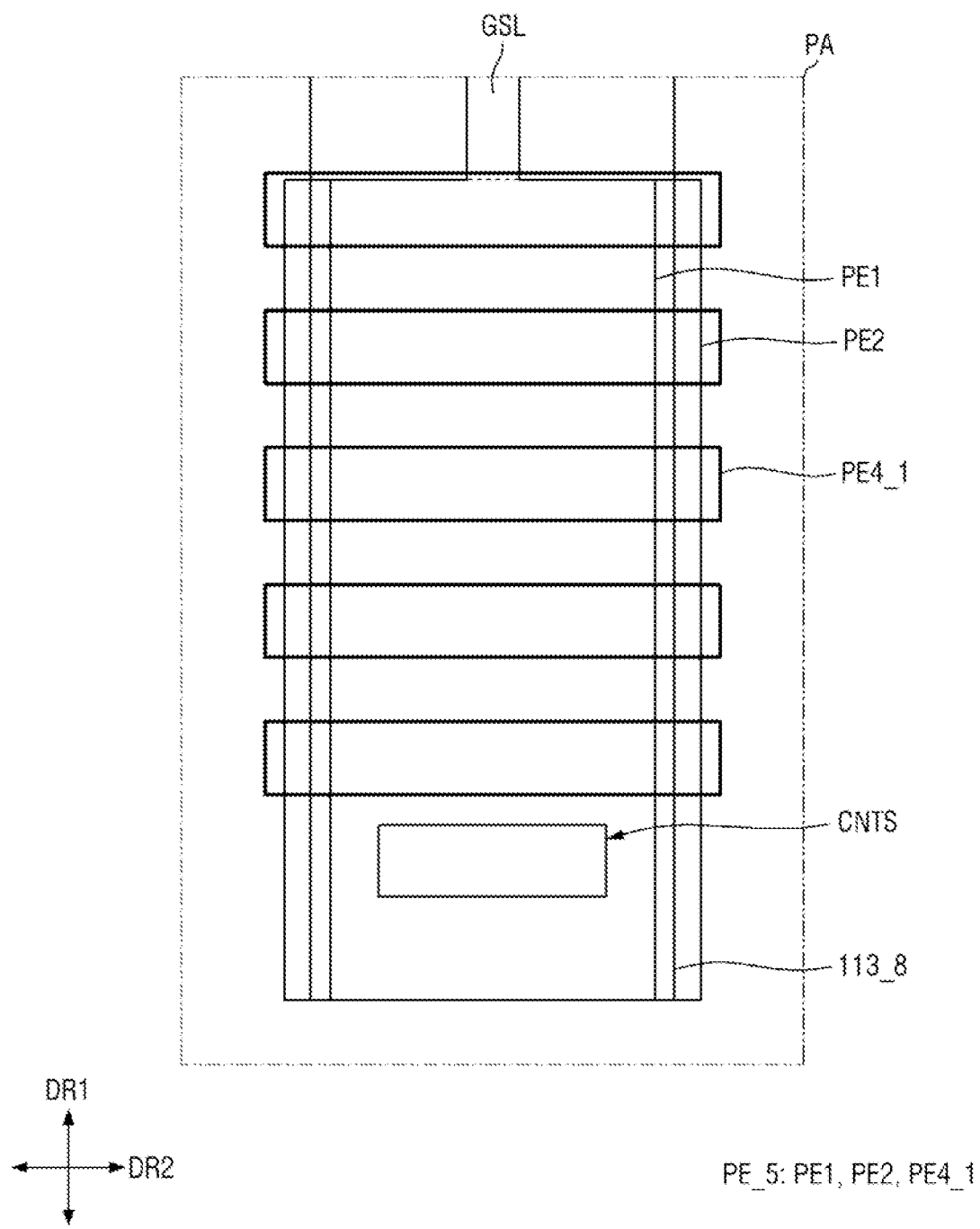
FIG. 31 is a plan view illustrating a pad electrode according to an embodiment of the present inventive concepts.
Figure 32:
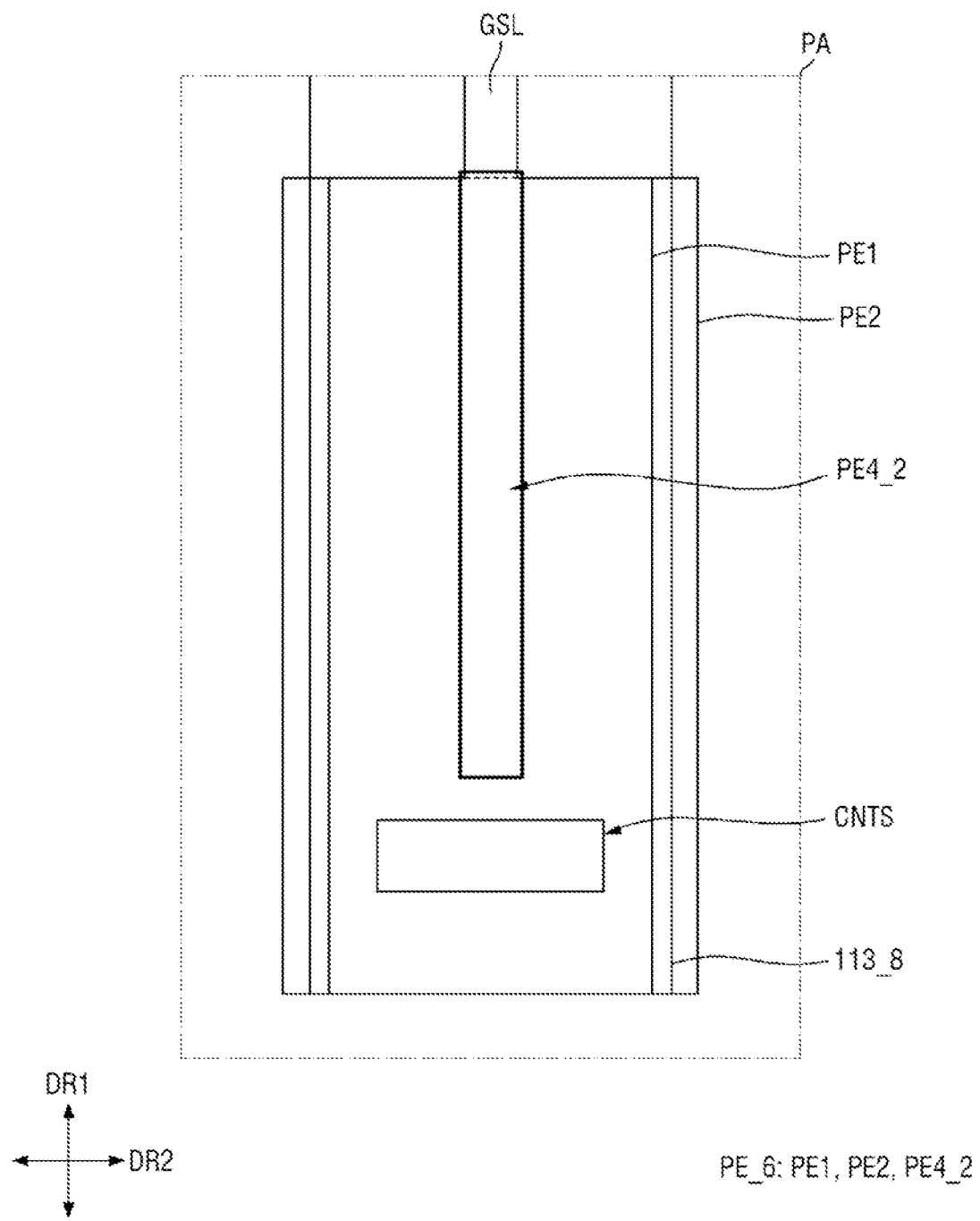
FIG. 32 is a plan view illustrating a pad electrode according to an embodiment of the present inventive concepts.
Figure 33:
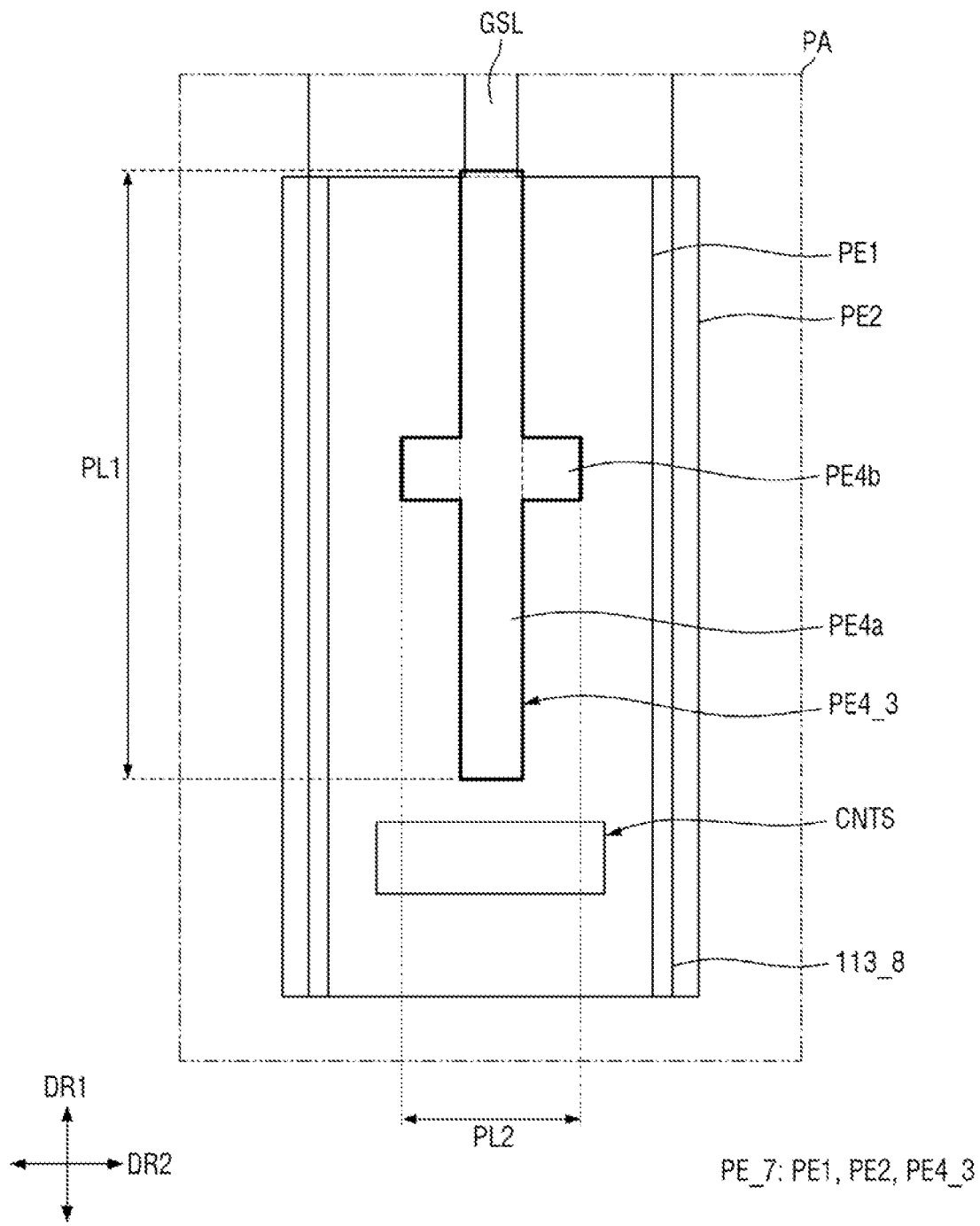
FIG. 33 is a plan view illustrating a pad electrode according to an embodiment of the present inventive concepts.
Figure 34:
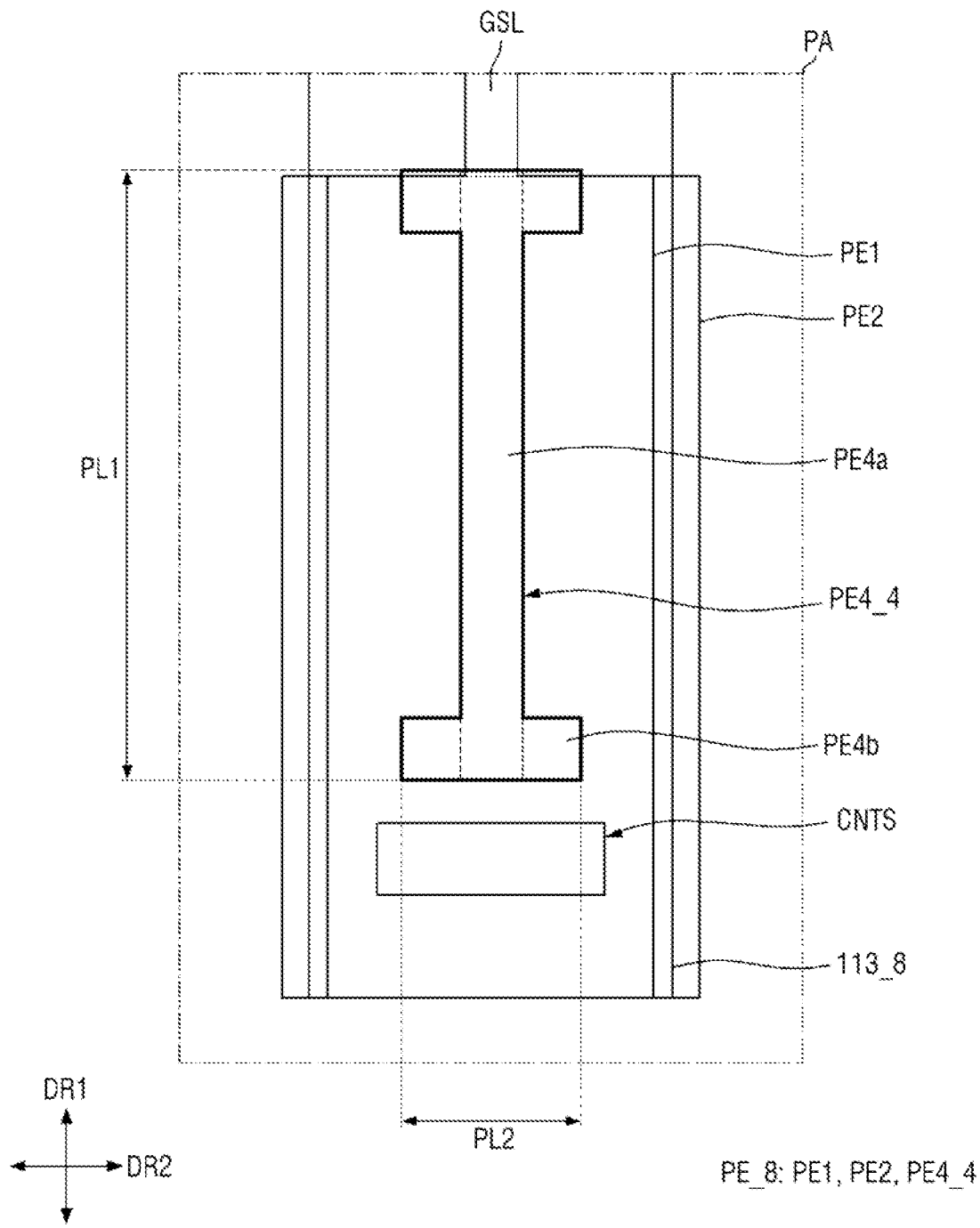
FIG. 34 is a plan view illustrating a pad electrode according to an embodiment of the present inventive concepts.
Figure 35:
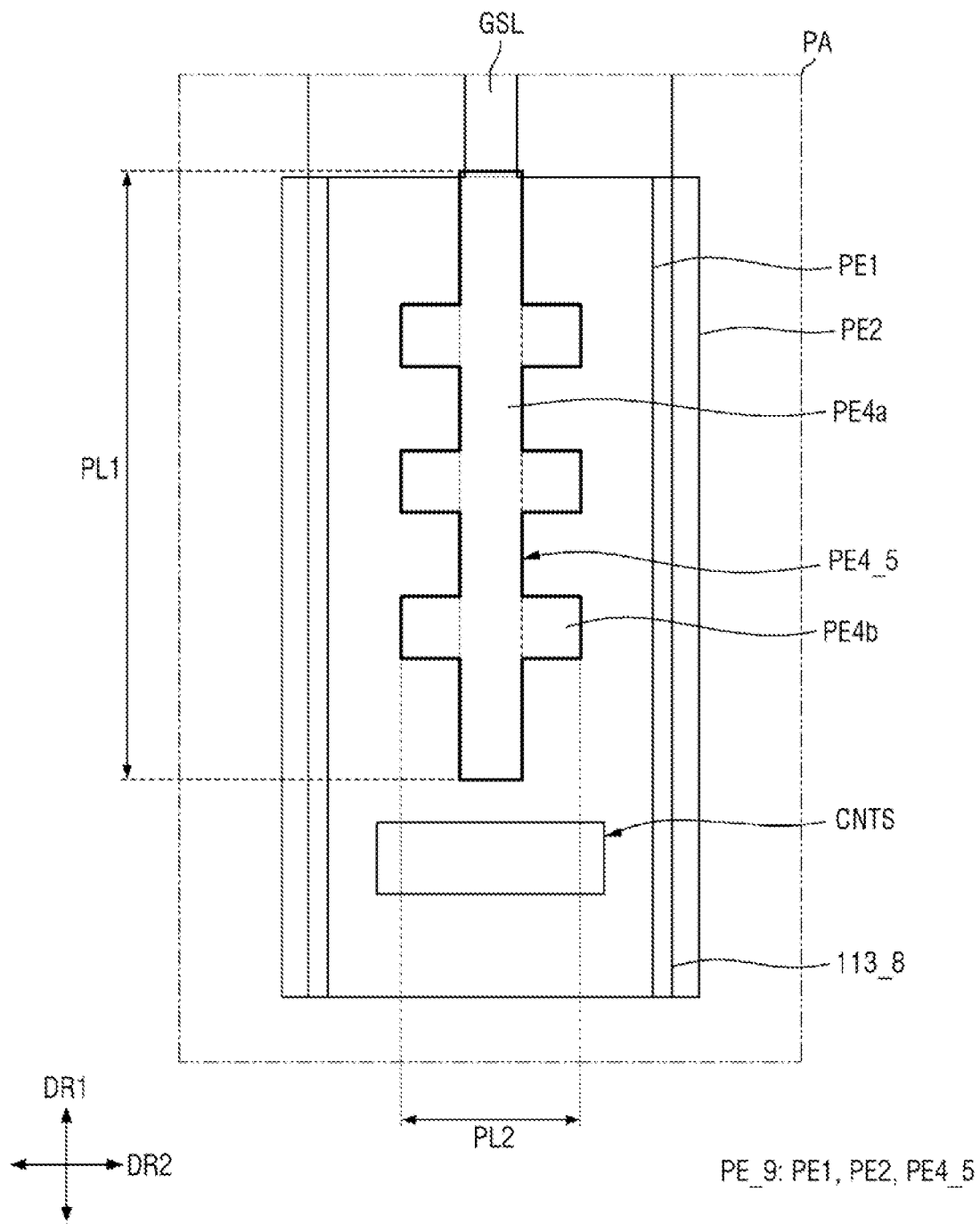
FIG. 35 is a plan view illustrating a pad electrode according to an embodiment of the present inventive concepts.
Figure 36:
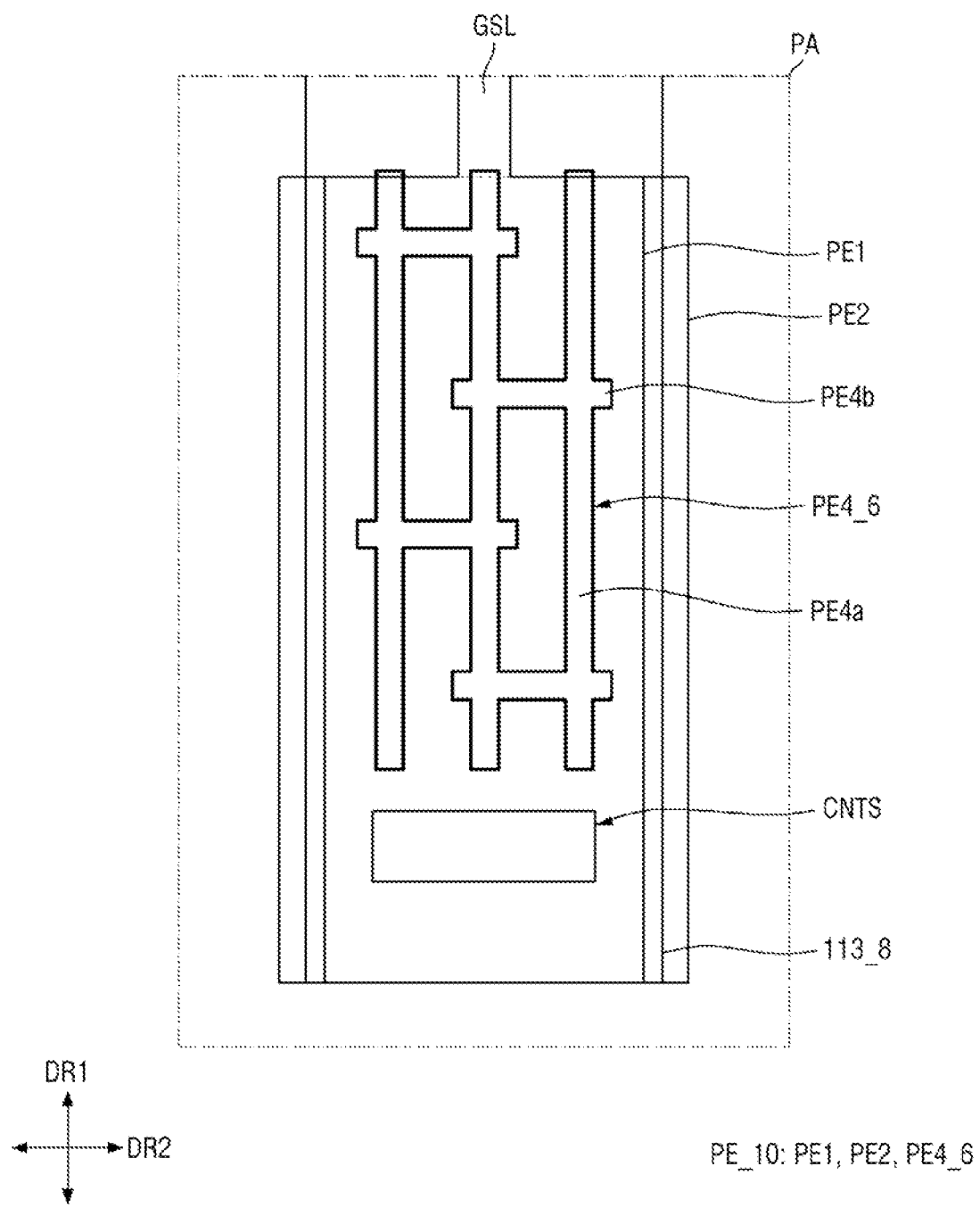
FIG. 36 is a plan view illustrating a pad electrode according to an embodiment of the present inventive concepts.

FIG. 31 is a plan view illustrating a pad electrode according to an embodiment. FIG. 32 is a plan view illustrating a pad electrode according to an embodiment. FIG. 33 is a plan view illustrating a pad electrode according to an embodiment. FIG. 34 is a plan view illustrating a pad electrode according to an embodiment. FIG. 35 is a plan view illustrating a pad electrode according to an embodiment. FIG. 36 is a plan view illustrating a pad electrode according to an embodiment.

FIGS. 31 to 36 illustrate that the planar shape of the fourth pad electrode PE4 described in FIG. 27 may be variously modified.

As shown in the embodiment of FIG. 31, a fourth pad electrode PE4_1 is different from the fourth pad electrode PE4 according to the embodiment of FIG. 27 based on the fourth pad electrode PE4_1 including a plurality of line patterns which are spaced apart from each other in the first direction DR1 and extend longitudinally in the second direction DR2.

In the fourth pad electrode PE4_1 of the embodiment of FIG. 31, since a surface step may be generated between a region in which the fourth pad electrode PE4_1 is disposed and a region in which the fourth pad electrode PE4_1 is not disposed, there is an advantage of decreasing an area of a protruding surface of a pad electrode PE_5 to reduce a load required for ultrasonic bonding.

As shown in the embodiment of FIG. 32, a fourth pad electrode PE4_2 is different from the fourth pad electrode PE4 according to the embodiment of FIG. 27 in that the fourth pad electrode PE4_2 is formed of one line pattern longitudinally extending in the first direction DR1 and positioned at a central portion of the first pad electrode PE1 (e.g., in the second direction DR2).

As shown in the fourth pad electrode PE4_2 of the embodiment of FIG. 32, since a surface step may be generated between a region in which the fourth pad electrode PE4_2 is disposed and a region in which the fourth pad electrode PE4_1 is not disposed, the area of a protruding surface of a pad electrode PE_6 may be decreased to reduce the load for ultrasonic bonding.

Each of fourth pad electrodes PE4_3, PE4_4, PE4_5, and PE4_6 of pad electrodes PE_7, PE_8, PE_9, and PE_10 according to the embodiments of FIGS. 33 to 36 may include a first sub-conductive pattern PE4a extending in the first direction DR1 and a second sub-conductive pattern PE4b extending in the direction DR2, and the first sub-conductive pattern PE4a and the second sub-conductive pattern PE4b may intersect each other.

In the embodiment of FIG. 33, the first sub-conductive pattern PE4a and the second sub-conductive pattern PE4b may intersect at a central portion (e.g., a mid-point of the first sub-conductive pattern PE4a in the first direction DR1) equally dividing a length of the first sub-conductive pattern PE4a in the first direction DR1.

In the embodiment of FIG. 34, the first sub-conductive pattern PE4a and a plurality of second sub-conductive patterns PE4b may intersect at one end portion (e.g., an upper end) and the other end portion (e.g., a lower end) of the first sub-conductive pattern PE4a in the first direction DR1.

In the embodiment of FIG. 35, the first sub-conductive pattern PE4a and a plurality of second sub-conductive patterns PE4b may intersect between one end (e.g., an upper end) and the other end (e.g., a lower end) of the first sub-conductive pattern PE4a in the first direction DR1. For example, in the embodiment of FIG. 35, three second sub-conductive patterns PE4b may be disposed between one end (e.g., an upper end) and the other end (e.g., the lower end) of the first sub-conductive pattern PE4a in the first direction DR1. However, embodiments of the present inventive concepts are not limited thereto and the numbers of the second sub-conductive patterns PE4b may vary.

FIG. 36 illustrates that a plurality of the first sub-conductive patterns PE4a and a plurality of second sub-conductive patterns PE4b may intersect between one end portion (e.g., an upper end) and the other end portion (e.g., a lower end) of the first sub-conductive pattern PE4a in the first direction DR1.

For example, as shown in the embodiment of FIG. 36, the pad electrode PE_10 may include three first sub-conductive patterns PE4a and the outermost second sub-conductive pattern PE4b in the first direction DR1 may intersect the first sub-conductive pattern PE4a located on a first side in the second direction DR2 (e.g., a left first sub-conductive pattern) and the first sub-conductive pattern PE4a adjacent to the first sub-conductive pattern PE4a located on the first side in the second direction DR2 (e.g., a middle first sub-conductive pattern). The next outermost second sub-conductive pattern PE4b based on the first direction DR1 may intersect the first sub-conductive pattern PE4a located on the outermost second side based on the second direction DR2 (e.g., a right first sub-conductive pattern) and the first sub-conductive pattern PE4a adjacent to the first sub-conductive pattern PE4a located on the outermost one side based on the second direction DR2 (e.g., the middle first sub-conductive pattern). The arrangement manner of the second sub-conductive patterns PE4b and the first sub-conductive patterns PE4a may be repeatedly performed in the first direction DR1.

In the present embodiment, although three first sub-conductive patterns PE4a and four second sub-conductive patterns PE4b have been illustrated, the number of the first sub-conductive pattern PE4a and the number of the second sub-conductive pattern PE4b are not limited thereto.

Figure 37:
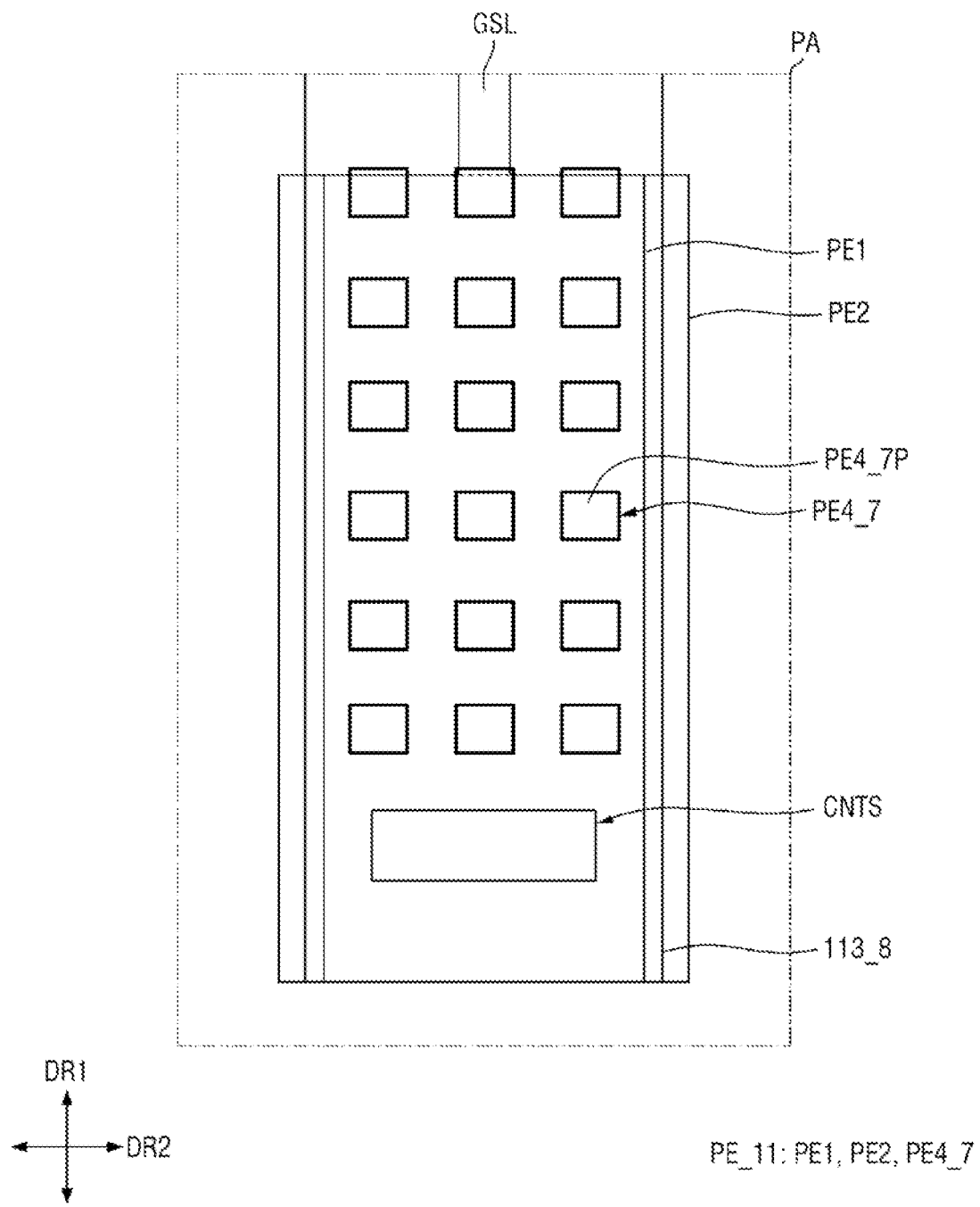
FIG. 37 is a plan view illustrating a pad electrode according to an embodiment of the present inventive concepts.

FIG. 37 is a plan view illustrating a pad electrode according to yet another embodiment.

Referring to the embodiment of FIG. 37, a fourth pad electrode PE_11 of a pad electrode PE_11 is different from the fourth pad electrode PE4 according to the embodiment of FIG. 27 based on the fourth pad electrode PE_11 including a plurality of first separation patterns PE4_7 disposed in a matrix arrangement method in the first direction DR1 and the second direction DR2.

As shown in the embodiment of FIG. 37, the plurality of first separation patterns PE4_7 of the fourth pad electrode PE_11 may be disposed at a uniform density in a region in which the fourth pad electrode PE4 of FIG. 27 is disposed. Consequently, bonding reliability between a bump BUMP and the pad electrode PE_11 may be increased.

Figure 38:
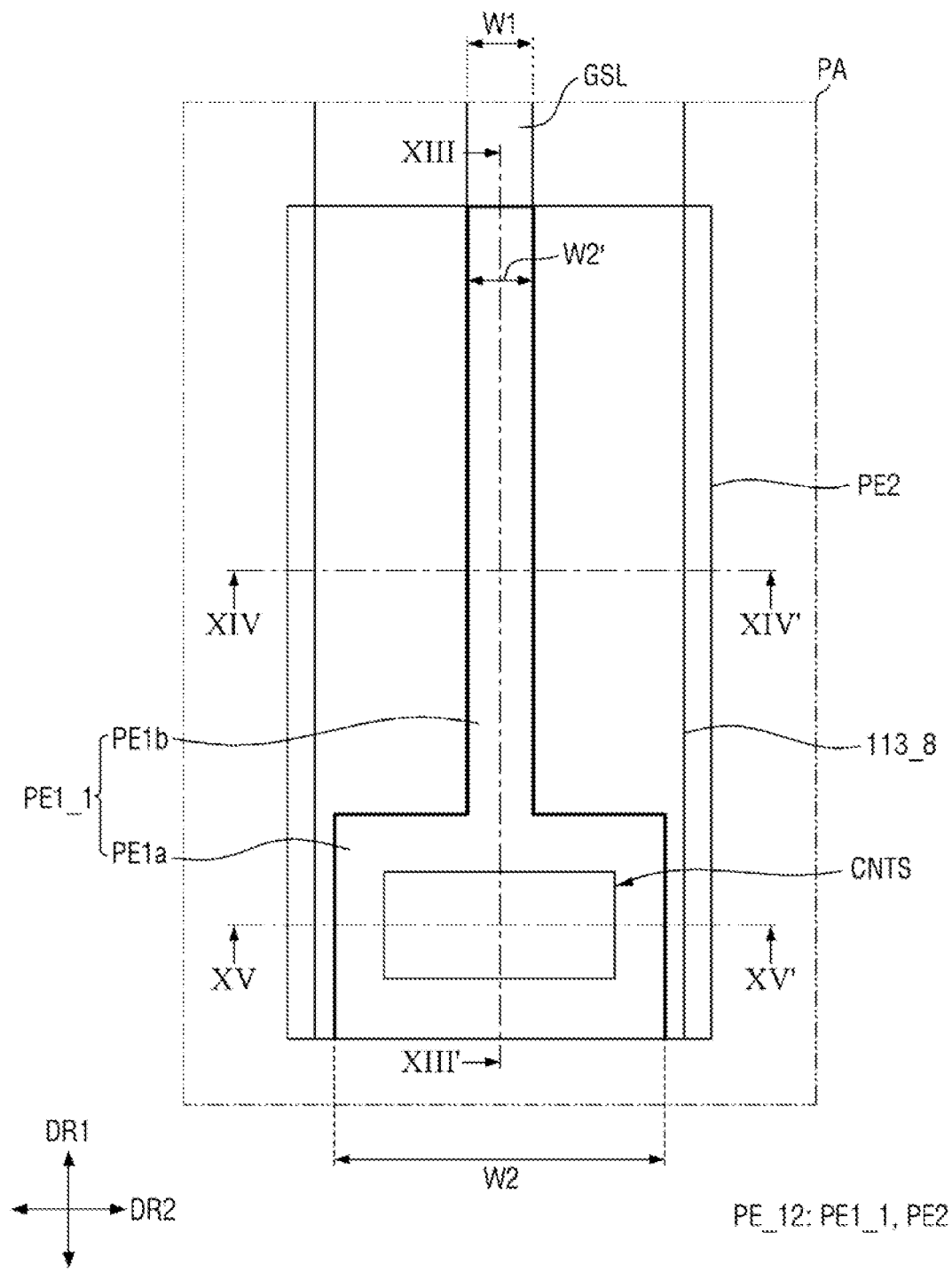
FIG. 38 is a plan view illustrating a pad electrode according to an embodiment of the present inventive concepts.
Figure 39:
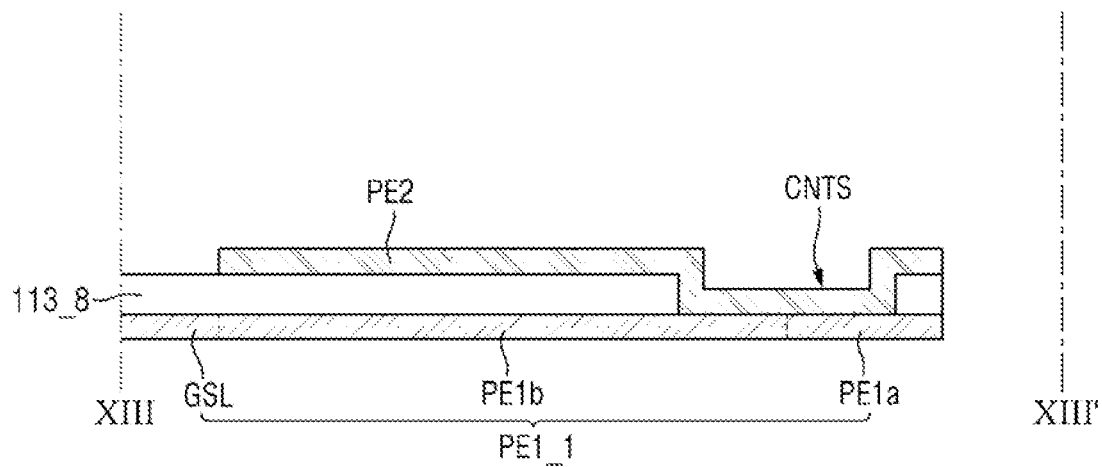
FIG. 39 is a cross-sectional view taken along line XIII-XIII' of FIG. 38 according to an embodiment of the present inventive concepts.
Figure 40:
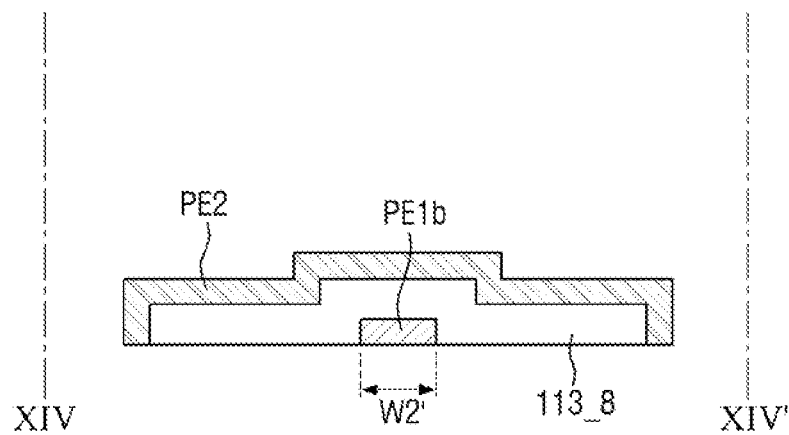
FIG. 40 is a cross-sectional view taken along line XIV-XIV' of FIG. 38 according to an embodiment of the present inventive concepts.
Figure 41:
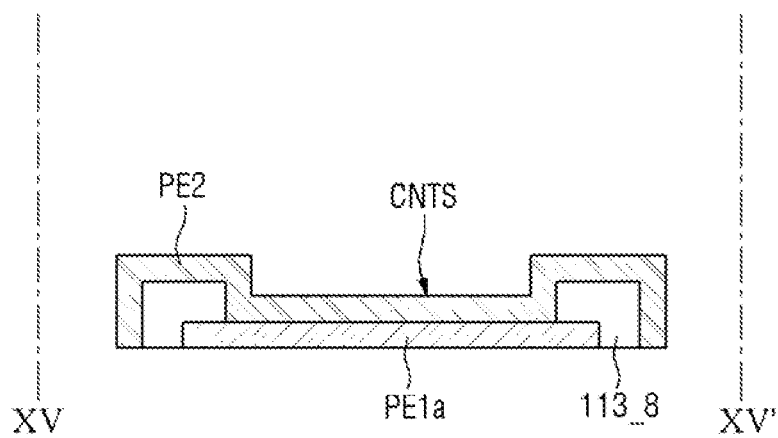
FIG. 41 is a cross-sectional view taken along line XV-XV' of FIG. 38 according to an embodiment of the present inventive concepts.

FIG. 38 is a plan view illustrating a pad electrode according to an embodiment. FIG. 39 is a cross-sectional view taken along line XIII-XIII' of FIG. 38. FIG. 40 is a cross-sectional view taken along line XIV-XIV' of FIG. 38. FIG. 41 is a cross-sectional view taken along line XV-XV' of FIG. 38.

Referring to the embodiments of FIGS. 38 to 41, a display device is different from the display device according to the embodiments of FIGS. 27 to 30 based on a first pad electrode PE1_1 includes a first sub-pad electrode PE1a overlapping a contact hole CNTS and a second sub-pad electrode PE1b disposed on one side of the first sub-pad electrode PE1a (e.g., an upper side) in the first direction DR1, and a pad electrode PE_12 does not include the fourth pad electrode PE4.

A width W2 of the first sub-pad electrode PE1a (e.g., length in the second direction) DR2 may be greater than a width W2' of the second sub-pad electrode PE1b (e.g., length in the second direction DR2). A portion of a second pad electrode PE2 overlapping the first pad electrode PE1_1 may protrude further from the substrate 101 in the thickness direction than a portion of the second pad electrode PE2 not overlapping the first pad electrode PE1_1. For example, a width of the protruding portion of the second pad electrode PE2 in the second direction DR2 may be greater than the width of the second sub-pad electrode PE1b disposed on one side of the first sub-pad electrode PE1a in the first direction DR1.

Even in the present embodiment, the width of the protruding portion of the second pad electrode PE2 (e.g., length in the second direction DR2) is configured to be greater than the width W2' of the second sub-pad electrode PE1b in the first sub-pad electrode PE1a so that a load for ultrasonic bonding may be reduced.

Figure 42:
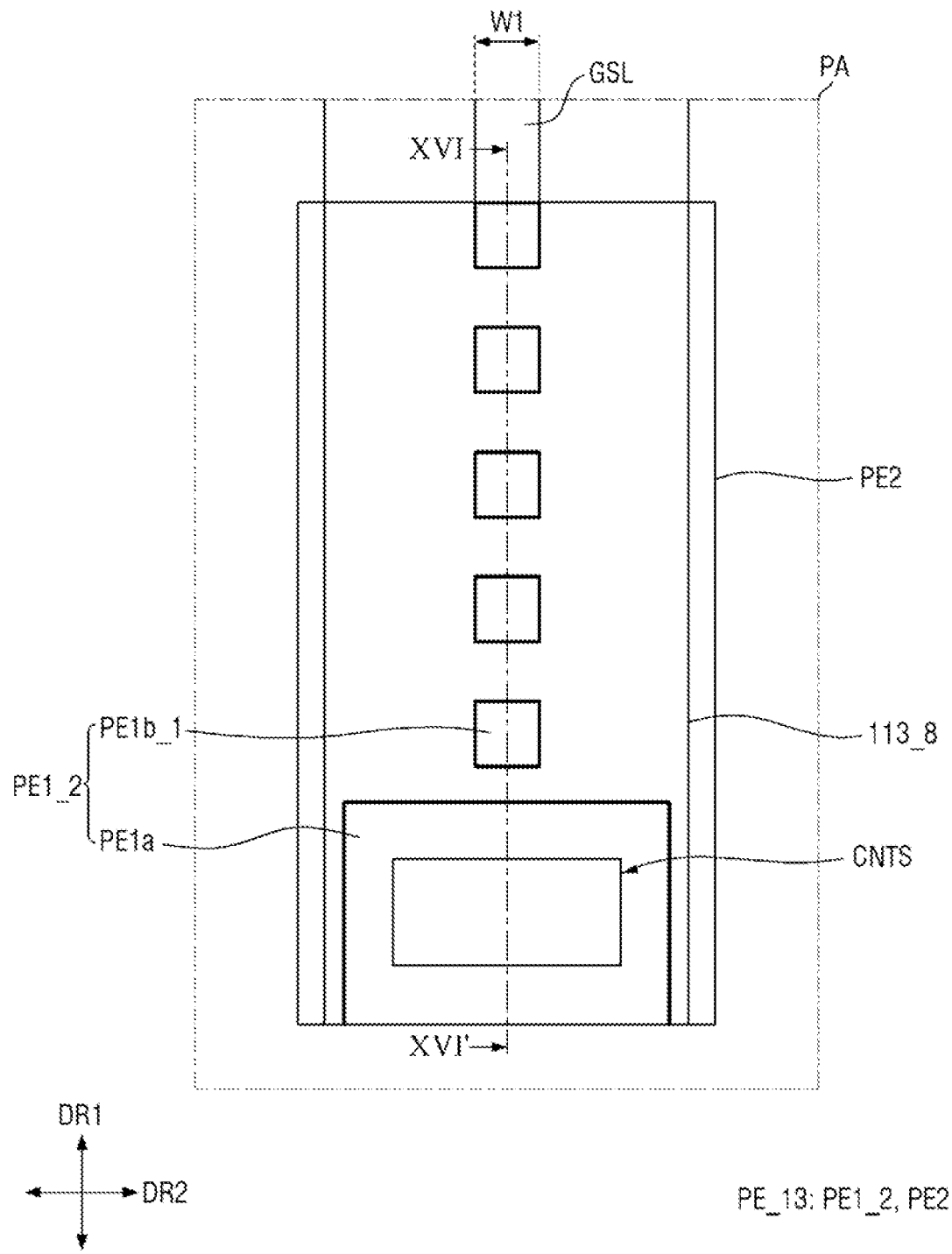
FIG. 42 is a plan view illustrating a pad electrode according to an embodiment of the present inventive concepts.
Figure 43:
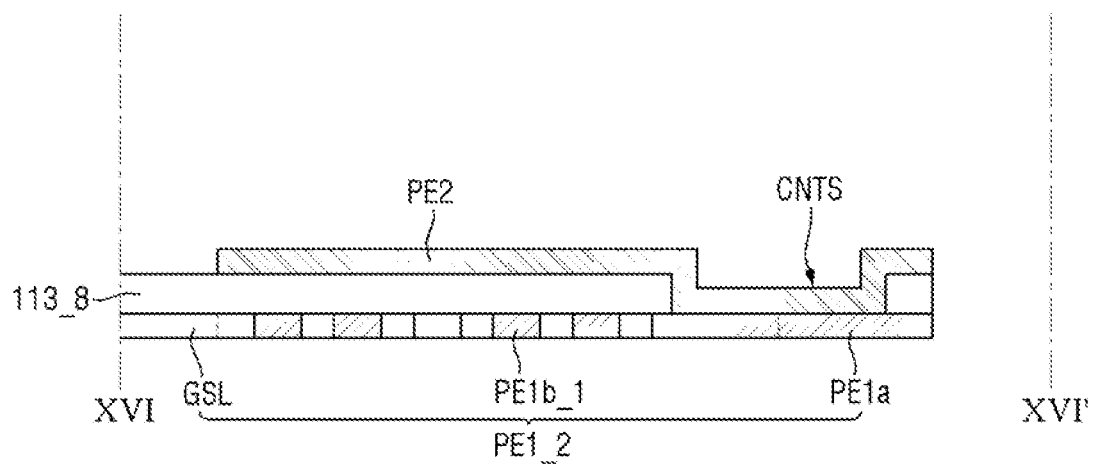
FIG. 43 is a cross-sectional view taken along line XVI-XVI' of FIG. 42 according to an embodiment of the present inventive concepts.

FIG. 42 is a plan view illustrating a pad electrode according to an embodiment. FIG. 43 is a cross-sectional view taken along line XVI-XVI' of FIG. 42.

Referring to the embodiments of FIGS. 42 and 43, a first pad electrode PE1_2 of a pad electrode PE_13 is different from the pad electrode PE_12 according to the embodiment of FIG. 38 based on the first pad electrode PE1_2 including a pad pattern in which a plurality of second sub-pad electrodes PE1b_1 are disposed to be spaced apart from each other in the first direction DR1. For example, as shown in the embodiment of FIG. 42, each of the second sub-pad electrodes PE1B_1 may have a substantially square shape in a plan view. However, embodiments of the present inventive concepts are not limited thereto.

Figure 44:
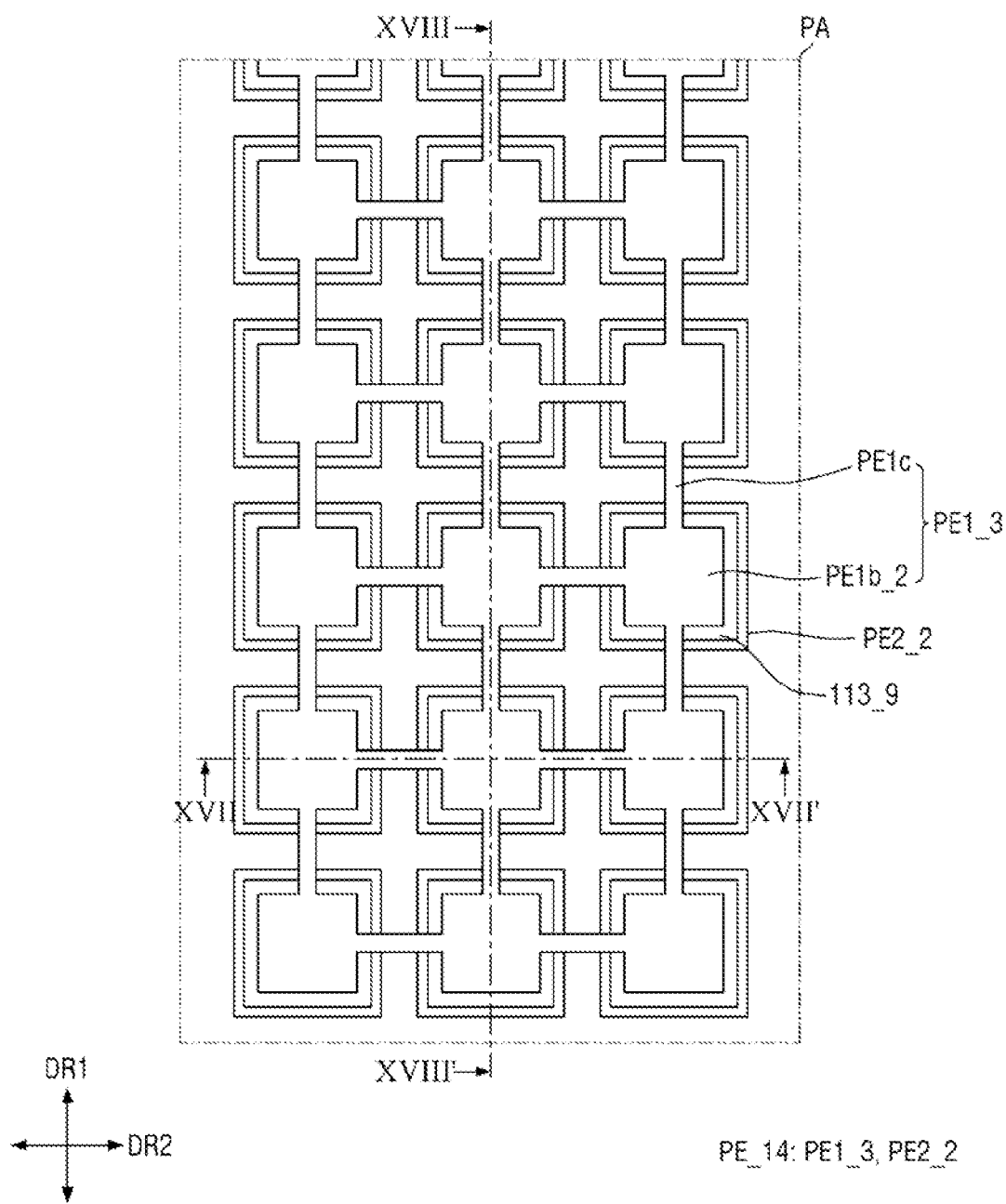
FIG. 44 is a plan view illustrating a pad electrode according to an embodiment of the present inventive concepts.
Figure 45:
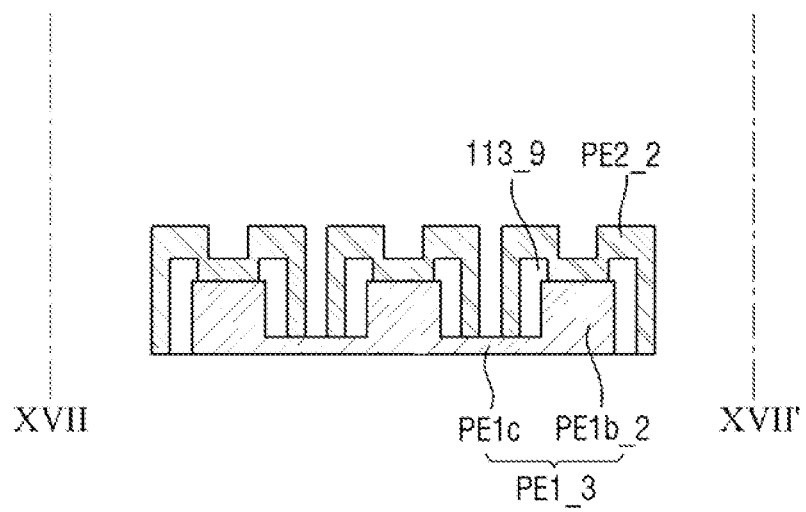
FIG. 45 is a cross-sectional view taken along line XVII-XVII' of FIG. 44 according to an embodiment of the present inventive concepts.
Figure 46:
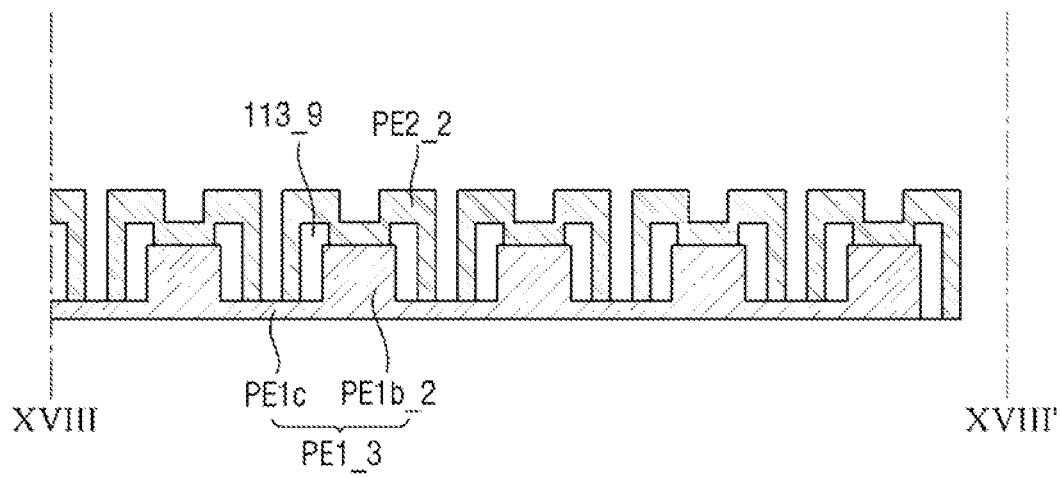
FIG. 46 is a cross-sectional view taken along line XVIII-XVIII' of FIG. 44 according to an embodiment of the present inventive concepts.

FIG. 44 is a plan view illustrating a pad electrode according to an embodiment. FIG. 45 is a cross-sectional view taken along line XVII-XVII' of FIG. 44. FIG. 46 is a cross-sectional view taken along line XVIII-XVIII' of FIG. 44.

Referring to the embodiments of FIGS. 44 to 46, a display device is different from the display device according to the embodiments of FIGS. 38 to 41 based on a first pad electrode PE1_3 of a pad electrode PE_14 including a plurality of first sub-pad electrodes PE1b_2 spaced apart from each other (e.g., in the first and/or second directions DR1, DR2) and a connection pad electrode PE1c which connects adjacent first sub-pad electrodes PE1b_2. A second pad electrode PE2_2 is disposed to overlap each of the plurality of first sub-pad electrode PE1b_2 in a thickness direction, and second sub-pad electrodes disposed to be spaced apart from each other are included.

A first insulating pattern 113_9 may include a plurality of sub-insulating patterns which overlap the first sub-pad electrode PE1b_2 and the second sub-pad electrode and are spaced apart from each other. In an embodiment, each of the plurality of sub insulating patterns may include a contact hole passing through the sub-insulating pattern in the thickness direction. Each of the second sub-pad electrodes may be electrically connected to the first sub-pad electrode PE1b2 through the contact hole.

According to the present embodiment, a thickness of the first sub-pad electrode PE1b_2 may be greater than a thickness of the connection pad electrode PE1c. Consequently, as shown in the embodiments of FIGS. 45 and 46, surfaces of the second sub-pad electrodes of the second pad electrode PE2_2 may protrude (e.g., in a thickness direction).

Figure 47:
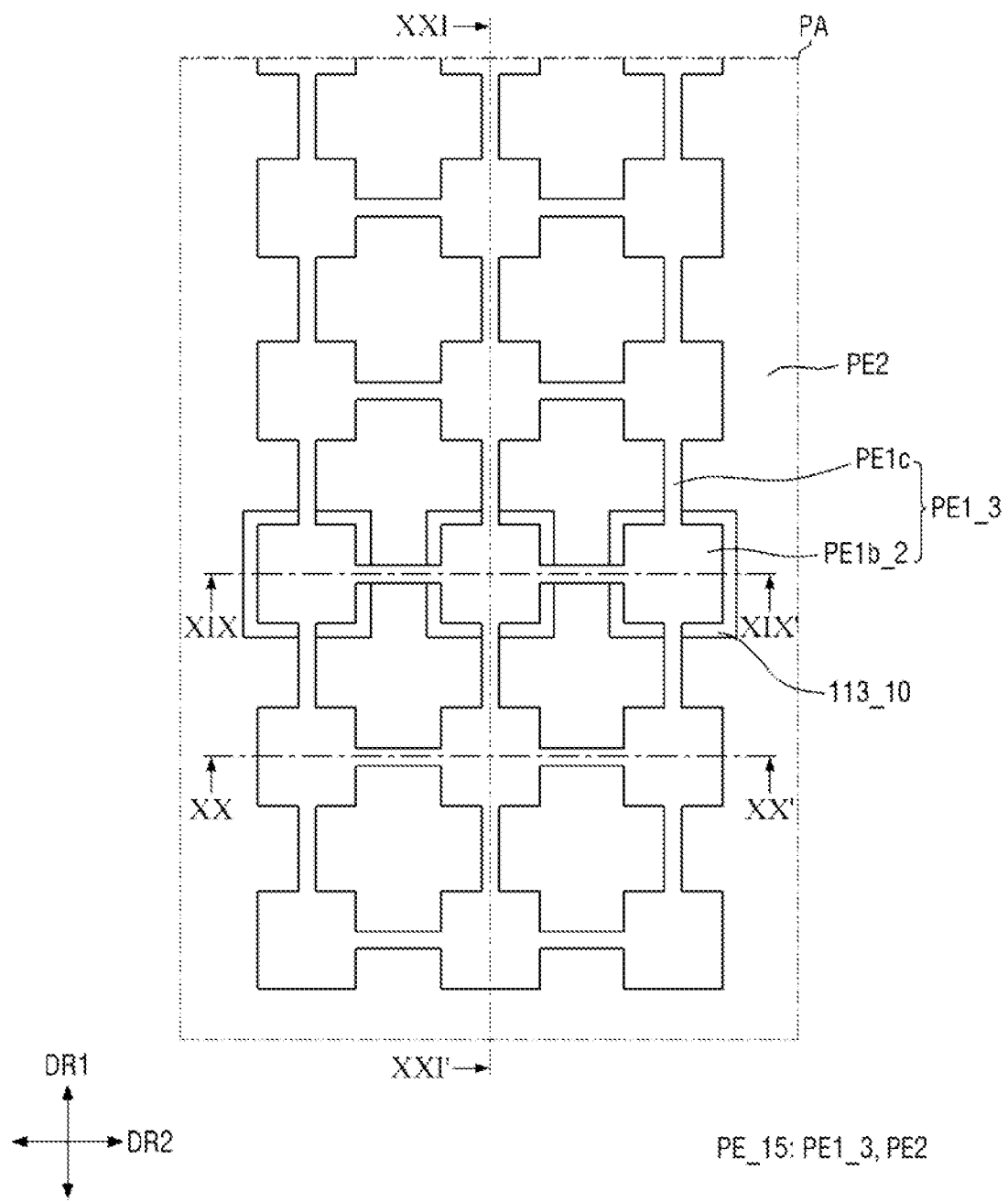
FIG. 47 is a plan view illustrating a pad electrode according to an embodiment of the present inventive concepts.
Figure 48:
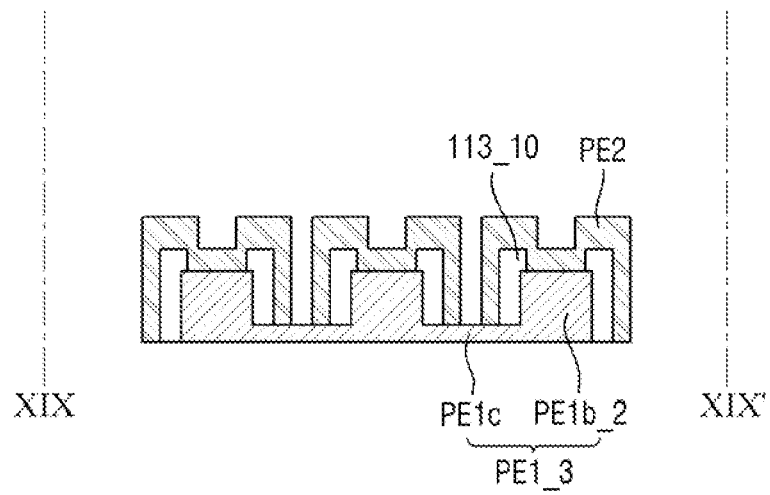
FIG. 48 is a cross-sectional view taken along line XIX-XIX' of FIG. 47 according to an embodiment of the present inventive concepts.
Figure 49:
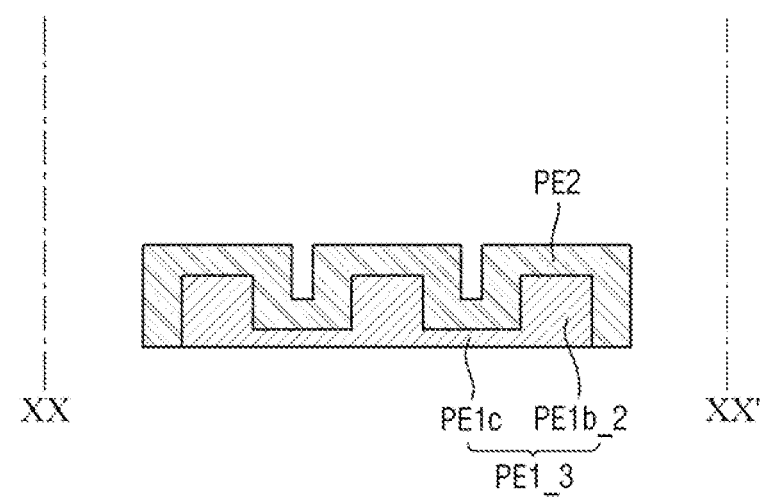
FIG. 49 is a cross-sectional view taken along line XX-XX' of FIG. 47 according to an embodiment of the present inventive concepts.
Figure 50:
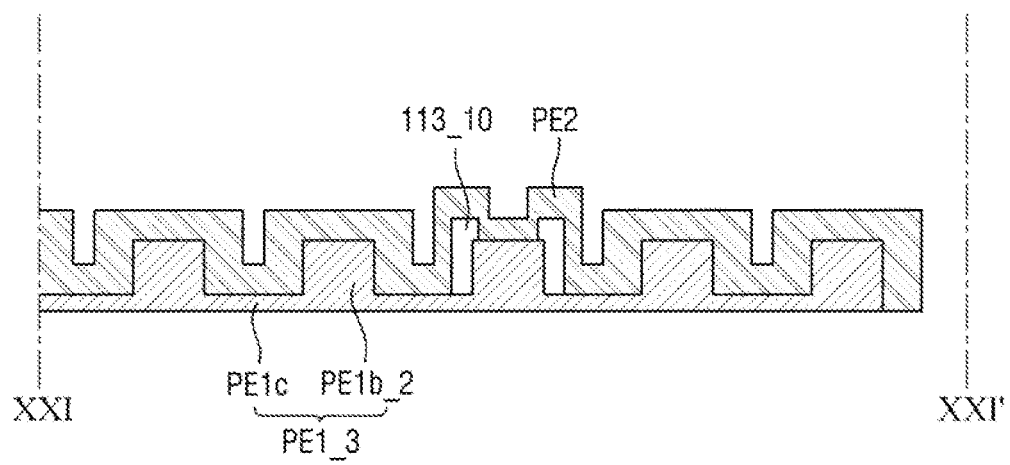
FIG. 50 is a cross-sectional view taken along line XXI-XXI' of FIG. 47 according to an embodiment of the present inventive concepts.

FIG. 47 is a plan view illustrating a pad electrode according to an embodiment. FIG. 48 is a cross-sectional view taken along line XIX-XIX' of FIG. 47. FIG. 49 is a cross-sectional view taken along line XX-XX' of FIG. 47. FIG. 50 is a cross-sectional view taken along line XXI-XXI' of FIG. 47.

Referring to the embodiments of FIGS. 47 to 50, a display device is different from the display device according to the embodiments of FIGS. 44 to 46 based on a second pad electrode PE2 of a pad electrode PE_15 of the display device may be formed on an entire surface of a first pad electrode PE1_3, and a first insulating pattern 113_10 may be selectively disposed on a first sub-pad electrode PE1b_2.

Other descriptions have been described with reference to the embodiments of FIGS. 44 to 46, and thus a duplicate description thereof will be omitted below for convenience of explanation.

In accordance with a display device according to the present inventive concepts, a pad electrode is directly bonded to a bump of an external device through an ultrasonic bonding method and, simultaneously, an area of a protruding portion of the pad electrode is reduced so that ultrasonic bonding energy can be reduced to minimize physical damage which may occur during ultrasonic bonding between an external device and a display panel.

The effects according to embodiments of the present inventive concepts are not limited by the contents exemplified above, and more various effects are included in the present specification.

What is claimed is:

1. A display device comprising:
   a substrate including an active area having a plurality of pixels and a non-active area disposed on a periphery of the active area and including a pad region;
   a pad electrode disposed in the pad region and including a first pad electrode and a second pad electrode disposed on the first pad electrode; and
   a first insulating pattern interposed between an upper surface of the first pad electrode and the second pad electrode,
   wherein, when viewed in a plan view, an entirety of the first insulating pattern is positioned inside the first pad electrode, and a portion of the second pad electrode overlapping the first insulating pattern protrudes further from the substrate in a thickness direction than a portion of the second pad electrode not overlapping the first insulating pattern protrudes from the substrate in the thickness direction, the second pad electrode directly contacts a portion of the upper surface of the first pad electrode that the first insulating pattern is not disposed on, and when viewed in a plan view, an area of the second pad electrode is greater than an area of the first pad electrode.

2. The display device of claim 1, wherein the pad electrode has a relatively longer side extending in a first direction and a relatively shorter side extending in a second direction intersecting the first direction.

3. The display device of claim 2, wherein the first insulating pattern extends longitudinally in the first direction, and a width of the first pad electrode in the second direction is greater than a width of the first insulating pattern in the second direction.

4. The display device of claim 3, wherein a width of the first insulating pattern in the first direction is greater than the width of the first insulating pattern in the second direction.

5. The display device of claim 4, wherein an area on a first side of the first insulating pattern in the second direction is substantially the same as an area on a second side of the first insulating pattern in the second direction that is opposite to the first side based on an imaginary line extending in the first direction.

6. The display device of claim 5, wherein:
the first insulating pattern includes a first sub-insulating pattern extending in the first direction and a second sub-insulating pattern extending in the second direction; and
the first sub-insulating pattern intersects the second sub-insulating pattern.

7. The display device of claim 3, wherein a width of the second pad electrode in the second direction is greater than a width of the first pad electrode in the second direction.

8. The display device of claim 7, wherein the second pad electrode directly contacts a side surface of the first pad electrode.

9. The display device of claim 8, wherein:
the pad electrode further includes a third pad electrode disposed on the second pad electrode;
the display device further includes a second insulating pattern disposed on an upper surface of the second pad electrode, the second insulating pattern exposing a portion of the upper surface of the second pad electrode; and
when viewed in a plan view, the second insulating pattern is positioned inside the first insulating pattern, and the third pad electrode directly contacts the portion of the upper surface of the second pad electrode exposed by the second insulating pattern.

10. The display device of claim 9, further comprising:
a circuit layer including a transistor disposed on the substrate;
a light emitting layer including a light emitting element disposed on the circuit layer; and
a touch member including at least one touch conductive layer disposed on the substrate.

11. The display device of claim 10, wherein:
the first pad electrode is disposed in a same layer as a gate electrode of a transistor of a pixel;
the second pad electrode is disposed in a same layer as a source electrode and a drain electrode of the transistor of the pixel; and the third pad electrode is disposed in a same layer as the at east one touch conductive layer.

12. The display device of claim 2, wherein the first insulating pattern includes a plurality of first separation patterns that are spaced apart from each other in the first direction.

13. The display device of claim 12, wherein the plurality of first separation patterns are concentrated in a first region overlapping the first pad electrode.

14. The display device of claim 9, wherein:
when viewed in a plan view, an area of the third pad electrode is less than the areas of each of the first pad electrode and the second pad electrode; and
a width of the third pad electrode in the second direction is less than the width of the first pad electrode in the second direction and the width of the second pad electrode in the second direction.

15. The display device of claim 9, wherein the third pad electrode directly contacts an upper surface and a side surface of the second insulating pattern.

16. The display device of claim 9, wherein:
the second insulating pattern extends longitudinally in the first direction; and
the second insulating pattern includes a plurality of second separation patterns that are spaced apart from each other in the first direction.

17. The display device of claim 1, further comprising a driving member mounted on the pad region,
wherein the driving member includes a bump that is directly connected to the pad electrode.

18. A display device comprising:
a substrate including an active area having a plurality of pixels and a non-active area disposed on a periphery of the active area and including a pad region;
a pad electrode disposed in the pad region and including a first pad electrode, a second pad electrode disposed on the first pad electrode, and a third pad electrode disposed on the second pad electrode; and
a first insulating pattern interposed between an upper surface of the first pad electrode and the second pad electrode,
wherein the first insulating pattern includes a contact hole passing through the first insulating pattern in a thickness direction,
when viewed in a plan view, the third pad electrode does not overlap the contact hole and is positioned on one side of the contact hole in a first direction, and
the second pad electrode is electrically connected to the first pad electrode through the contact hole.

19. The display device of claim 18, wherein:
the first pad electrode extends longitudinally in the first direction;
a width of the first insulating pattern in a second direction is greater than a width of the first pad electrode in the second direction; and
a width of the second pad electrode in the second direction is greater than the width of the first pad electrode in the second direction.

20. The display device of claim 19, wherein:
the first insulating pattern covers a side surface of the first pad electrode;
the second pad electrode covers the side surface of the first pad electrode; and
the third pad electrode directly contacts a side surface of the second pad electrode.

21. The display device of claim 20, further comprising a driving member mounted on the pad region, wherein the driving member includes a bump that is directly connected to the third pad electrode, and
the third pad electrode is ultrasonically bonded to the bump.

22. A display device comprising:
a substrate including an active area having a plurality of pixels and a non-active area disposed on a periphery of the active area and including a pad region;
a pad electrode disposed in the pad region and including a first pad electrode and a second pad electrode disposed on the first pad electrode; and
a first insulating pattern interposed between an upper surface of the first pad electrode and the second pad electrode,
wherein the first insulating pattern includes a contact hole passing through the first insulating pattern in a thickness direction,
the second pad electrode is electrically connected to the first pad electrode through the contact hole,
the first pad electrode includes a first sub-pad electrode overlapping; the contact hole and a second sub-pad electrode positioned on one side of the first sub-pad electrode in a first direction, and
a width of the first sub-pad electrode in a second direction intersecting the first direction is greater than a width of the second sub-pad electrode in the second direction.

23. The display device of claim 22, wherein:
a portion of the second pad electrode overlapping the first pad electrode protrudes further from the substrate in a thickness direction than a portion of the second pad electrode not overlapping the first pad electrode protrudes from the substrate in the thickness direction; and
a width of the protruding portion of the second pad electrode in the second direction is greater than a width of the second sub-pad electrode.

24. The display device of claim 23, further comprising a driving member mounted on the pad region,
wherein the driving member includes a bump that is directly connected to the second pad electrode, and
the second pad electrode is ultrasonically bonded to the bump.

25. A display device comprising:
a substrate including an active area having a plurality of pixels and a non-active area disposed on a periphery of the active area and including a pad region;
a pad electrode including a first pad electrode having a plurality of first sub-pad electrodes disposed on the substrate and spaced apart from each other in the pad region, and a connection pad electrode connecting adjacent first sub-pad electrodes of the plurality of first sub-pad electrodes, and a second pad electrode having second sub-pad electrodes disposed to overlap the first sub-pad electrodes and spaced apart from each other; and
a first insulating pattern including sub-insulating patterns which are disposed between and overlap the first sub-pad electrodes and the second sub-pad electrodes and are spaced apart from each other,
wherein each of the sub-insulating patterns includes a contact hole passing through the first insulating pattern in a thickness direction,
the second sub-pad electrode is electrically connected to the first sub-pad electrode through the contact hole, and
a thickness of the first sub-pad electrode is greater than a thickness of the connection pad electrode.

26. The display device of claim 25, wherein the first insulating pattern is selectively disposed on each of the plurality of first sub-pad electrodes.

27. The display device of claim 25, further comprising a driving member mounted on the pad region,
wherein the driving member includes a bump that is directly connected to the second pad electrode, and
the second pad electrode is ultrasonically bonded to the bump.

* * * * *